(12) United States Patent
Wang

(10) Patent No.: US 11,699,566 B2
(45) Date of Patent: *Jul. 11, 2023

(54) ELECTROSTATIC DEVICES TO INFLUENCE BEAMS OF CHARGED PARTICLES

(71) Applicant: ViaMEMS Technologies, Inc., Fremont, CA (US)

(72) Inventor: David Xuan-Qi Wang, Fremont, CA (US)

(73) Assignee: ViaMEMS Technologies, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/987,781

(22) Filed: Nov. 15, 2022

(65) Prior Publication Data

US 2023/0071331 A1 Mar. 9, 2023

Related U.S. Application Data

(63) Continuation of application No. 17/856,899, filed on Jul. 1, 2022.

(Continued)

(51) Int. Cl.
*H01J 37/12* (2006.01)
*C09K 13/00* (2006.01)
(Continued)

(52) U.S. Cl.
CPC .............. *H01J 37/12* (2013.01); *C09K 13/00* (2013.01); *C23C 16/402* (2013.01);
(Continued)

(58) Field of Classification Search
CPC .... H01J 37/12; H01J 37/28; H01J 2237/1205; C09K 13/00; C23C 16/402; C23C 16/403
See application file for complete search history.

(56) References Cited

U.S. PATENT DOCUMENTS

2003/0006668 A1   1/2003   Lal et al.
2005/0077475 A1   4/2005   Nagae et al.
(Continued)

FOREIGN PATENT DOCUMENTS

WO   WO 2014/008110   1/2014

*Primary Examiner* — Nicole M Ippolito
(74) *Attorney, Agent, or Firm* — Trellis IP Law Group, PC

(57) ABSTRACT

An electrostatic device includes a top and a bottom silicon layer, around an insulating buried layer. A beam opening allows a beam of charged particles to travel through. The device is encapsulated in an insulating layer. One or more electrodes and ground planes are deposited on the insulating layer. These also cover the inside of the beam opening. Electrodes and ground planes are physically and electrically separated by micro-trenches and micro-undercuts that provide shadow areas when the conductive areas are deposited. Electrodes may be shaped as elongated islands and may include portions overhanging the top silicon layer, supported by electrode-anchors.

Manufacturing starts from a single wafer including the top, buried, and bottom layers, or it starts from two separate silicon wafers. Manufacturing includes steps to form the top and bottom beam openings and microstructures, to encapsulate the device in an insulating layer, and to deposit electrodes and ground areas.

24 Claims, 44 Drawing Sheets

Related U.S. Application Data

(60) Provisional application No. 63/230,810, filed on Aug. 8, 2021.

(51) Int. Cl.
    *C23C 16/40*     (2006.01)
    *H01J 37/28*     (2006.01)

(52) U.S. Cl.
    CPC ............. *C23C 16/403* (2013.01); *H01J 37/28* (2013.01); *H01J 2237/1205* (2013.01)

(56) References Cited

U.S. PATENT DOCUMENTS

| | | |
|---|---|---|
| 2008/0203317 A1 | 8/2008 | Platzgummer et al. |
| 2011/0216299 A1 | 9/2011 | Steenbrink et al. |
| 2012/0319001 A1 | 12/2012 | Tsunoda |
| 2013/0301101 A1 | 11/2013 | Conrad et al. |
| 2015/0132928 A1 | 5/2015 | Jacobson et al. |
| 2019/0240844 A1 | 8/2019 | Giusti et al. |
| 2020/0098697 A1 | 3/2020 | De Langen et al. |
| 2023/0041174 A1* | 2/2023 | Wang ..................... H01J 37/04 |

\* cited by examiner

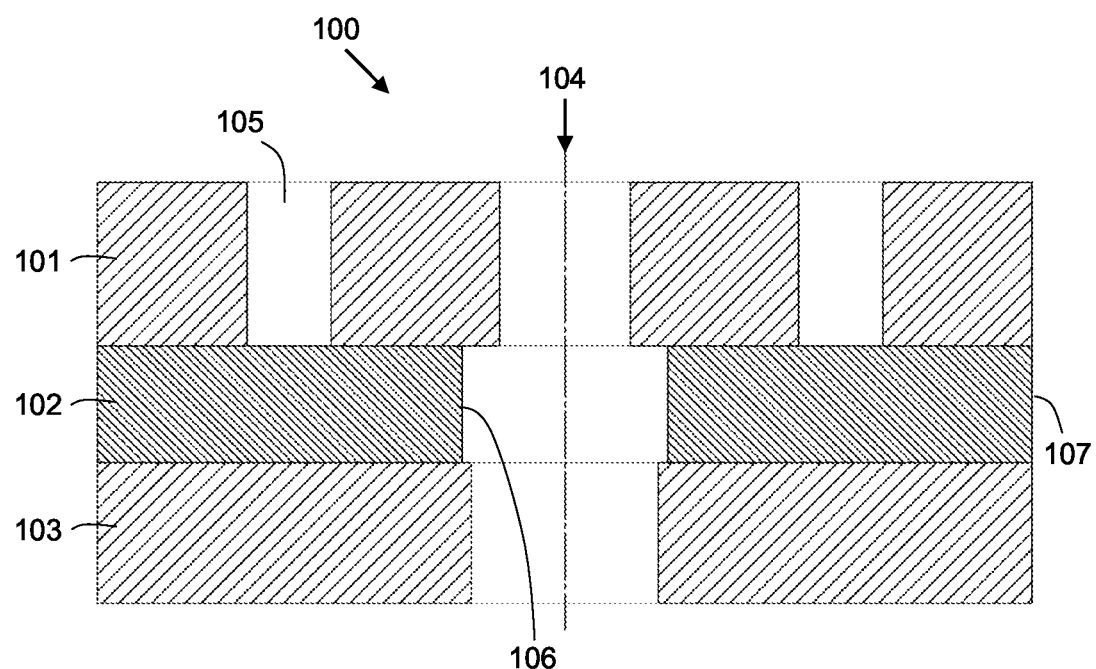
FIG. 1 – Prior Art

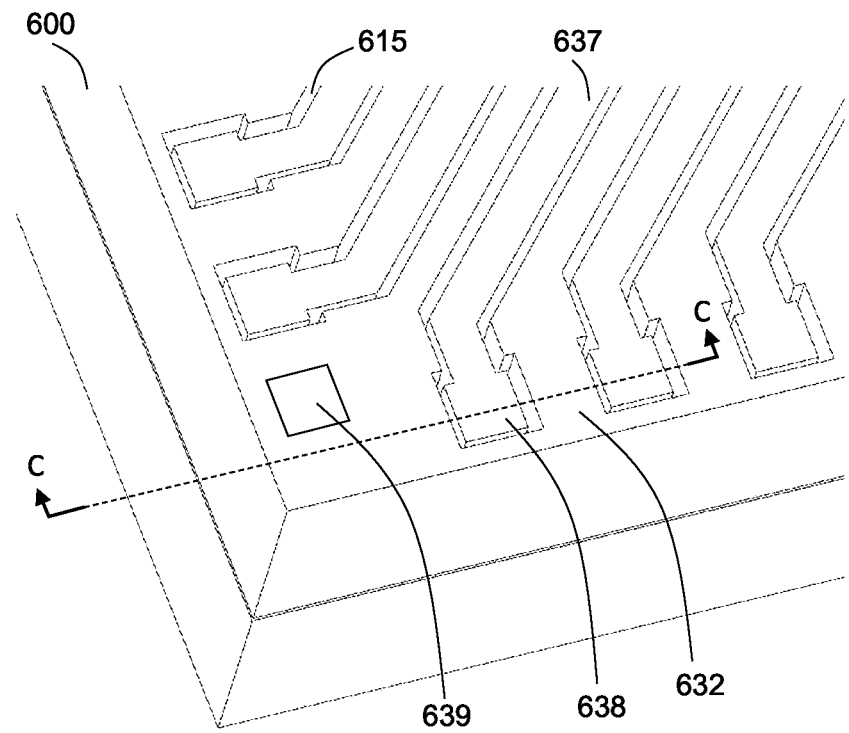
FIG.6A
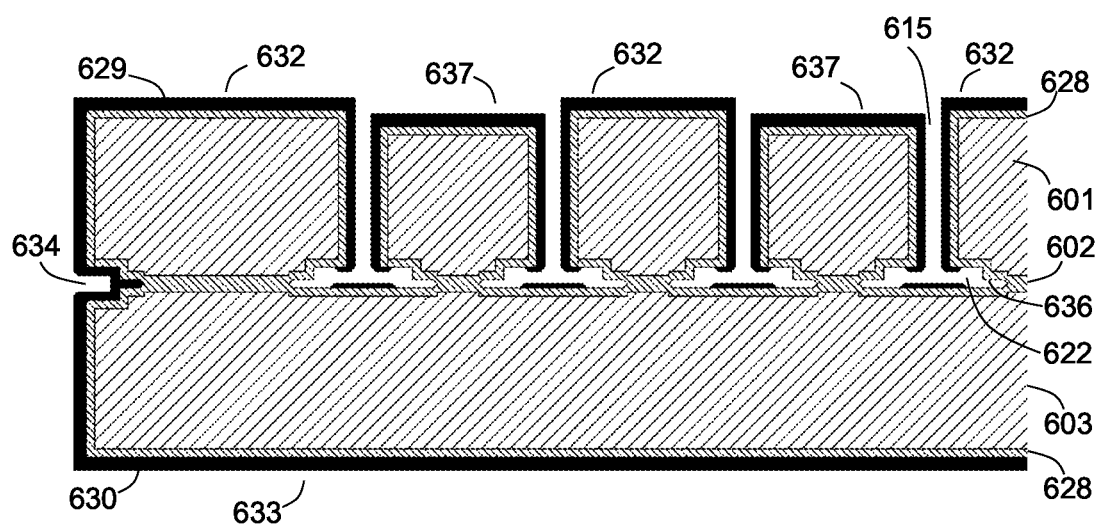
FIG.6B  C - C

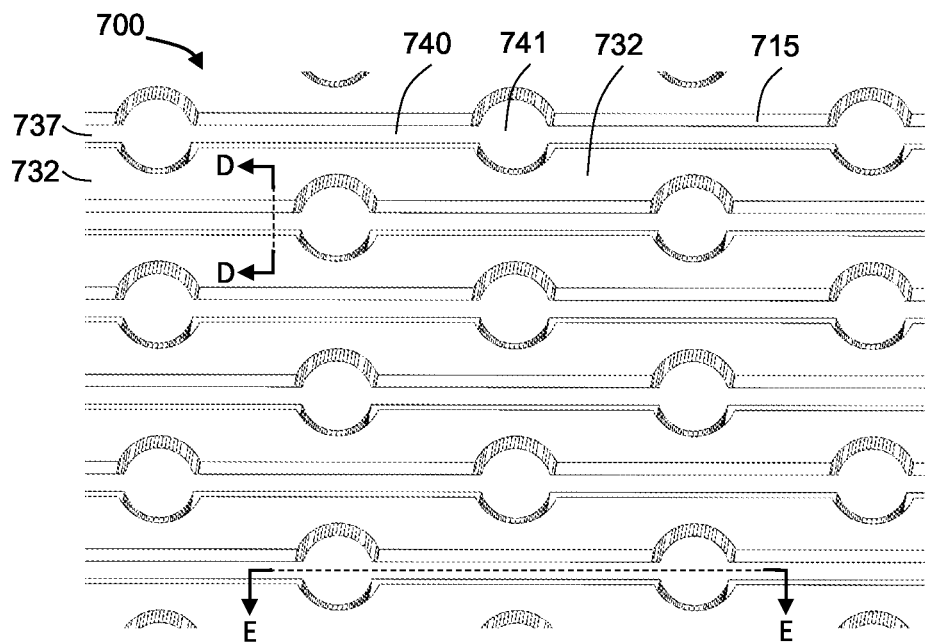
FIG.7A
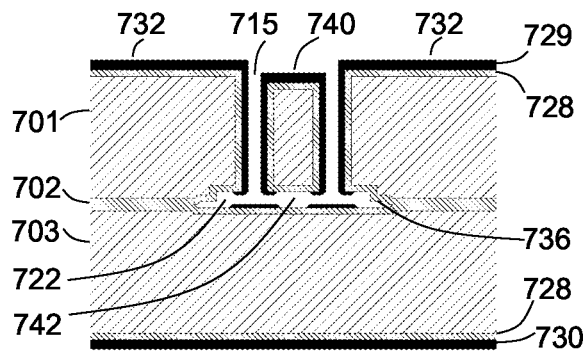
FIG.7B D - D
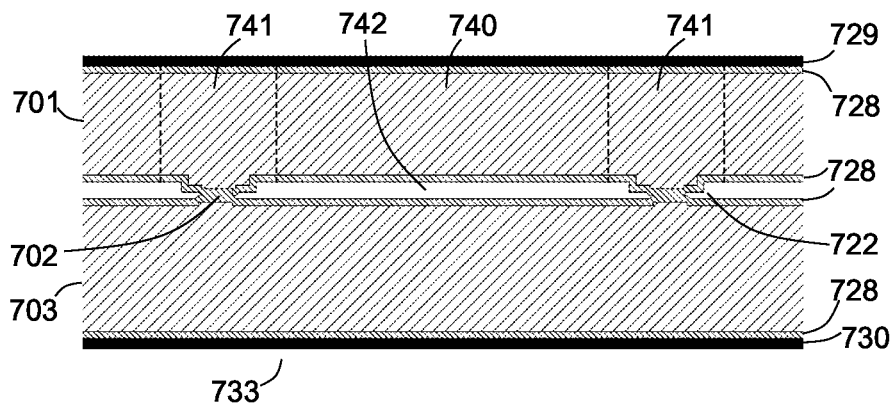
FIG.7C E - E

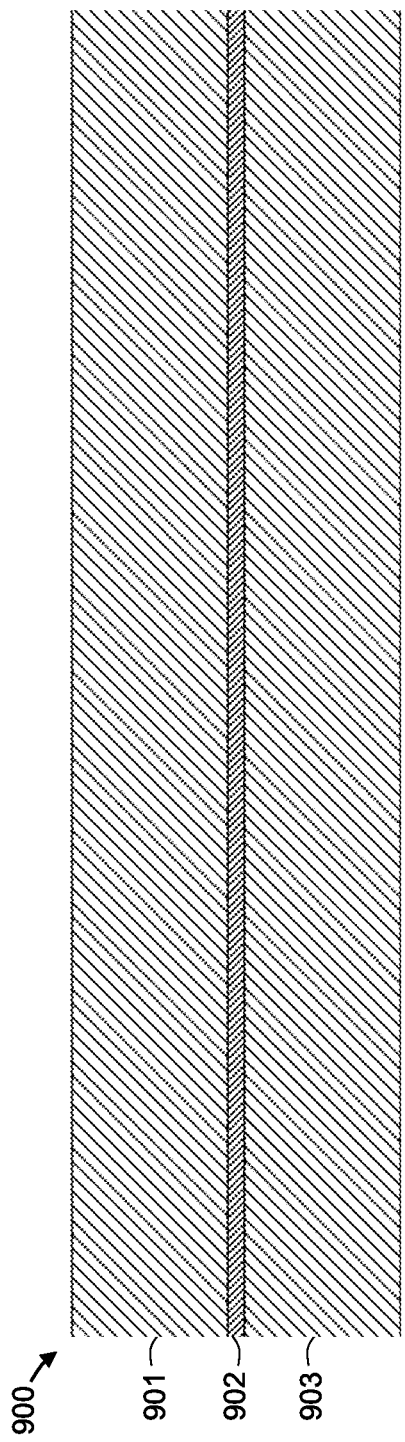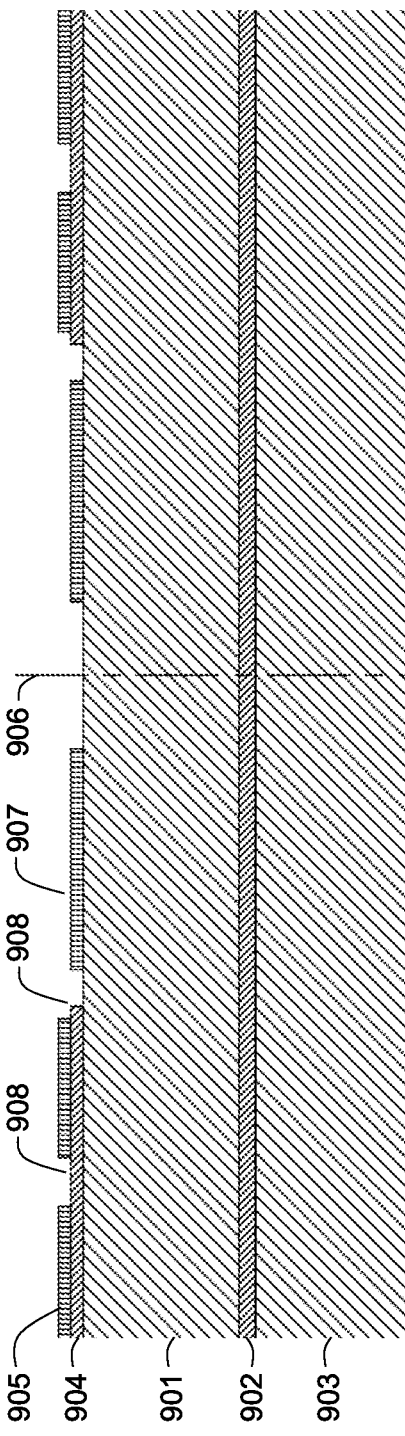

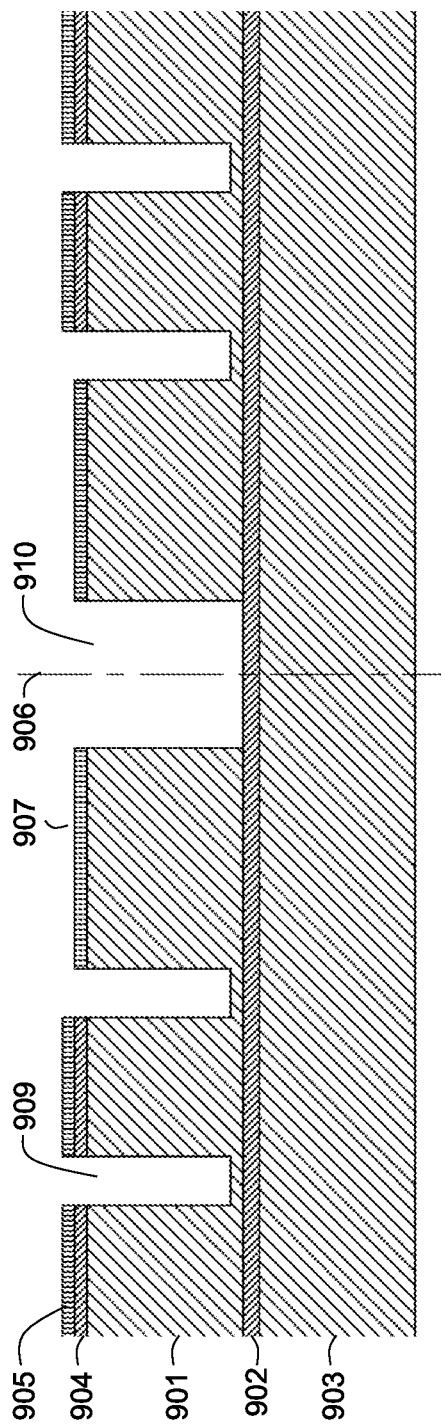
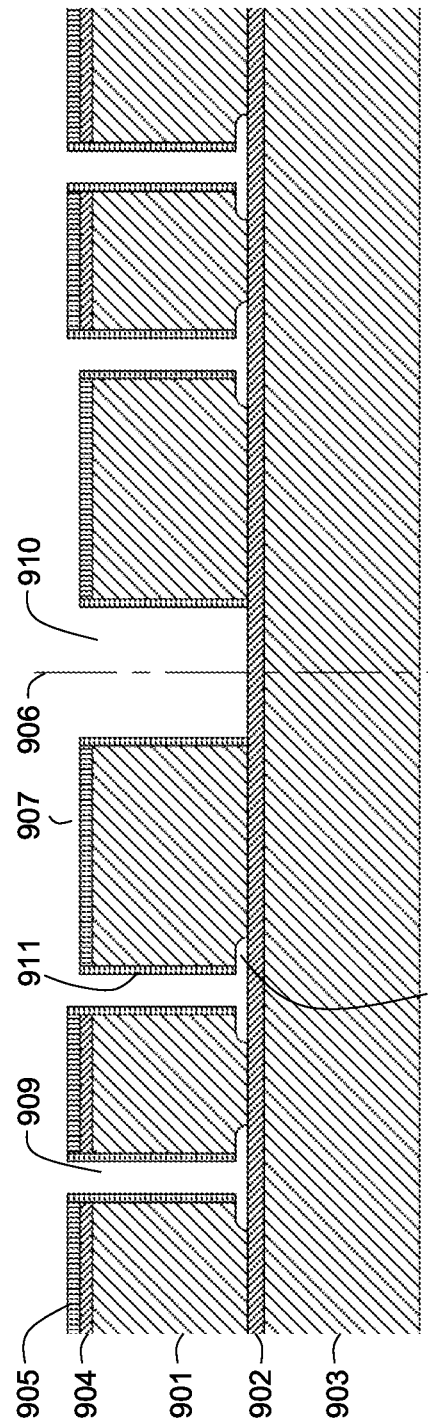

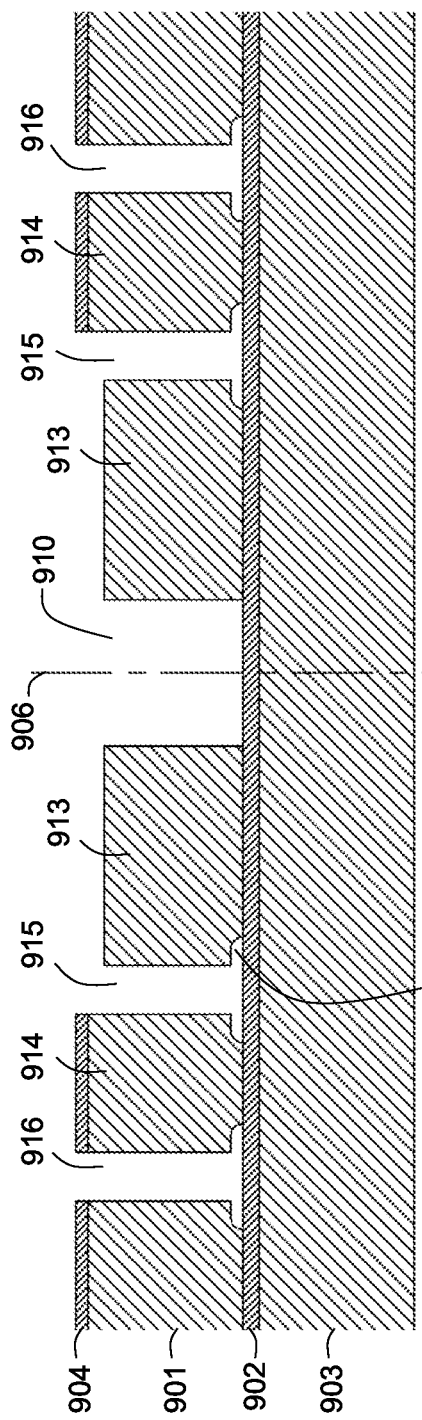
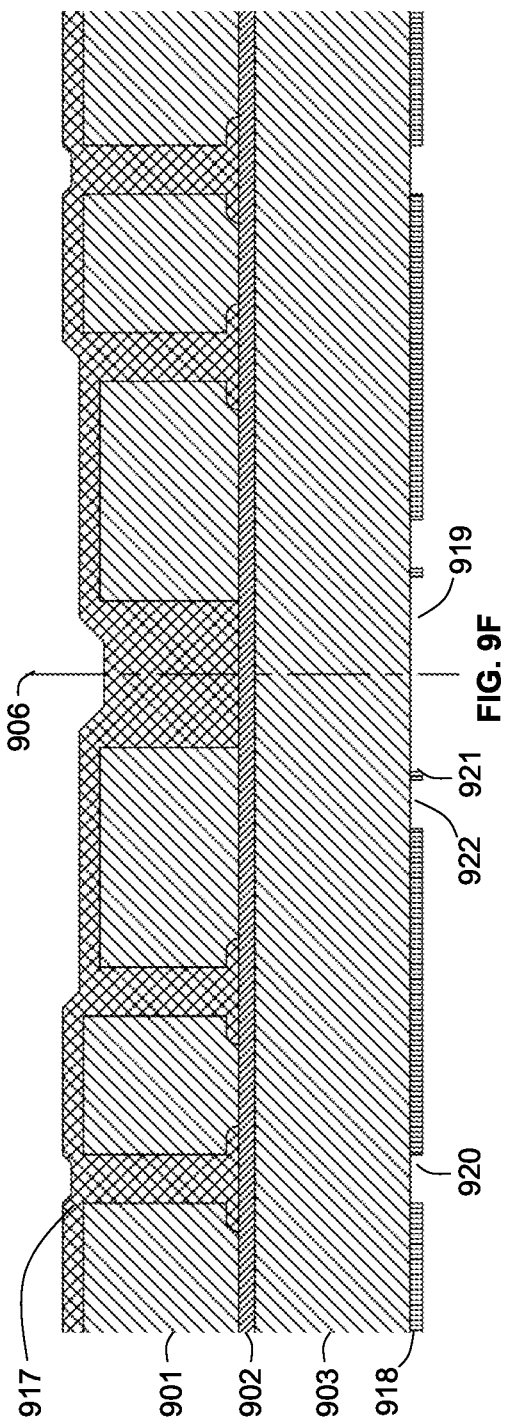
FIG. 9E
FIG. 9F

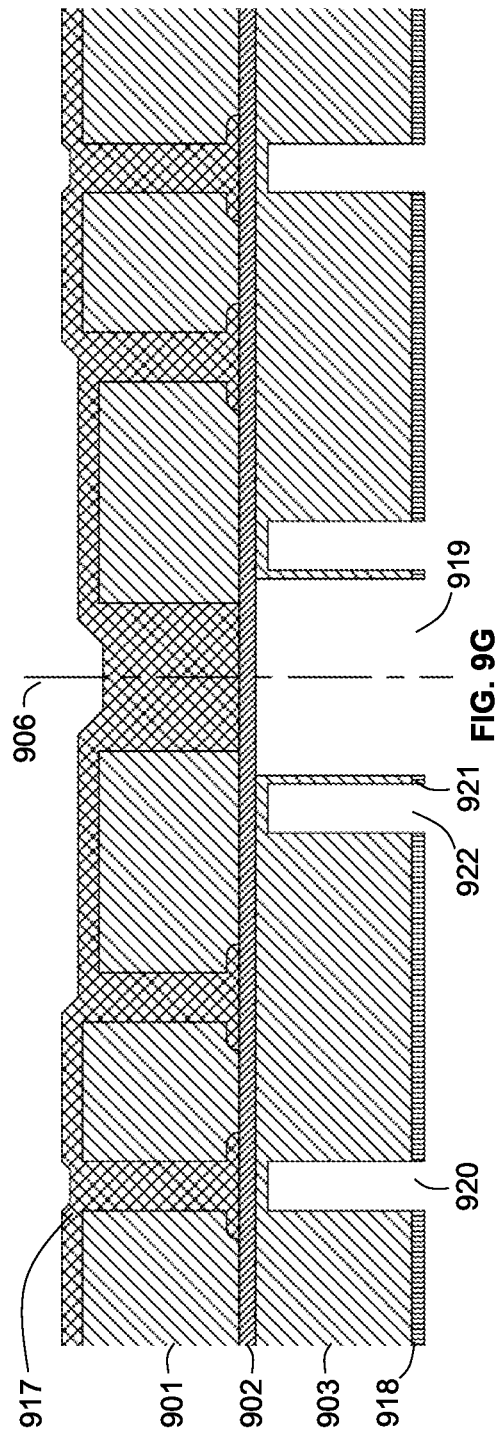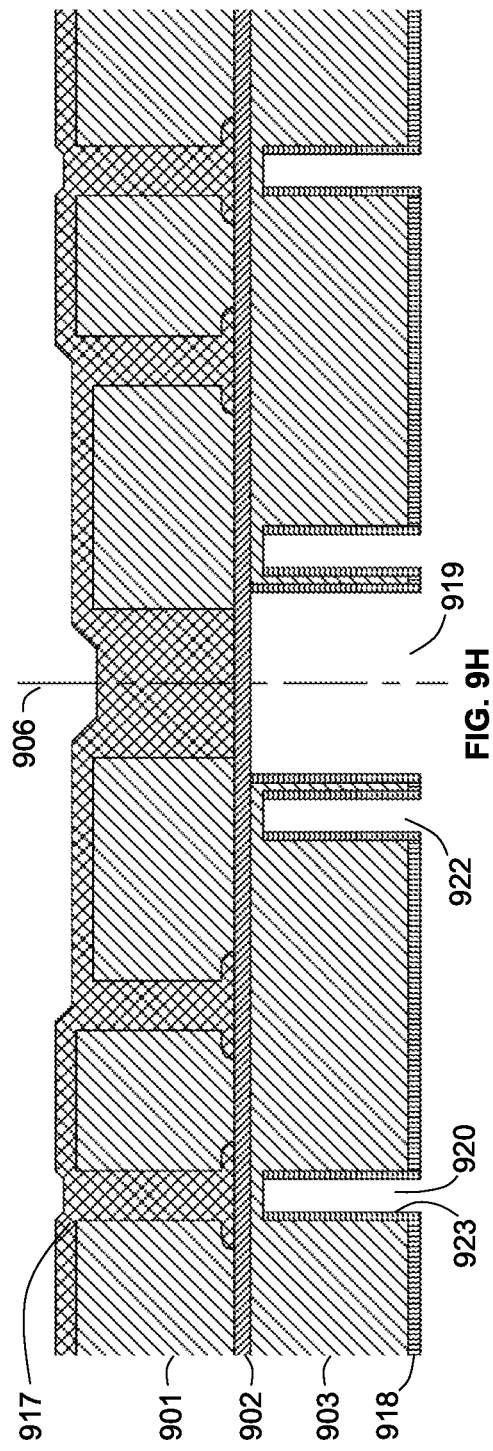

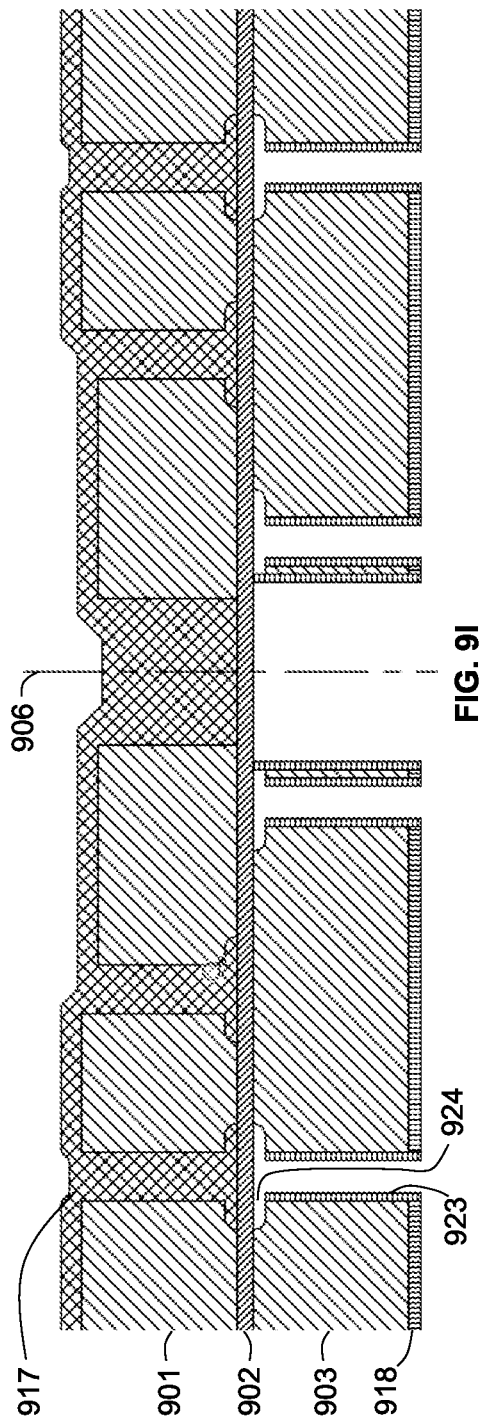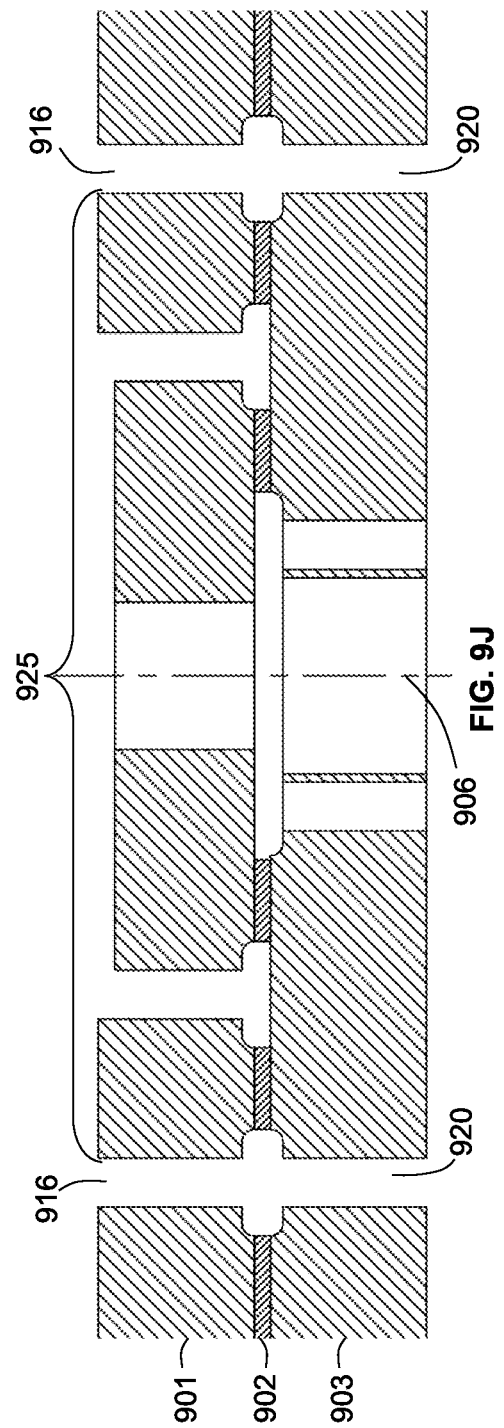

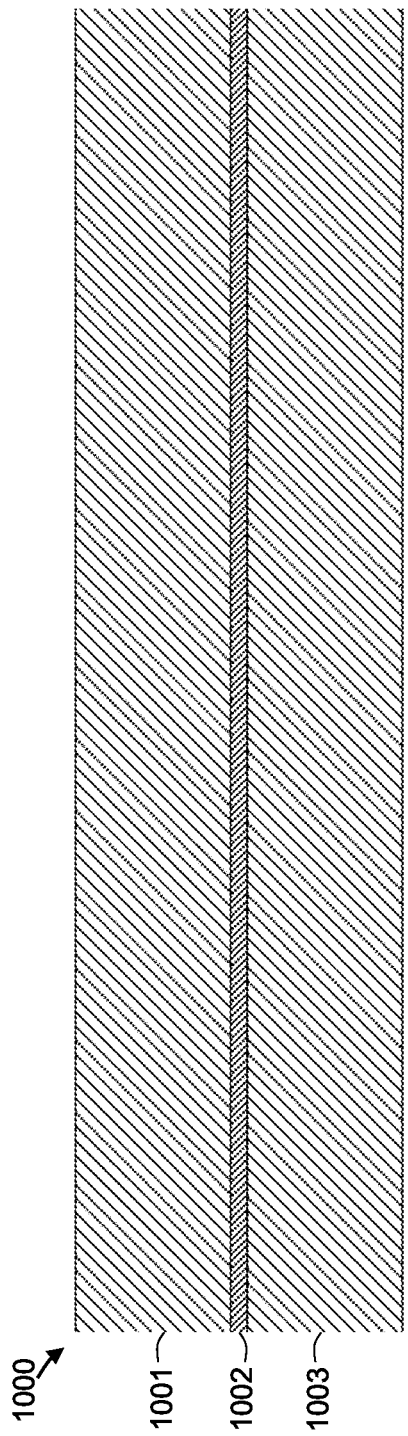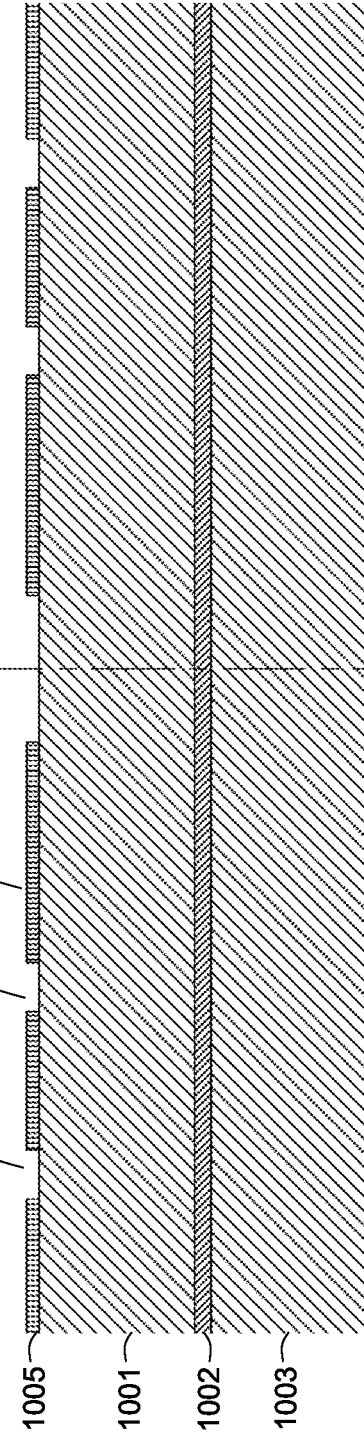
FIG. 10A
FIG. 10B

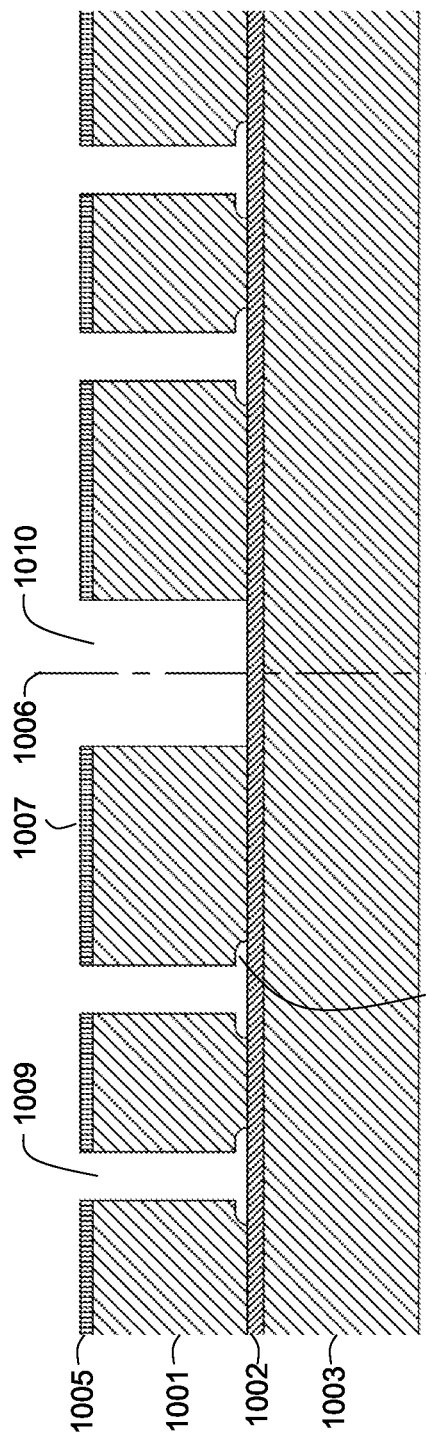
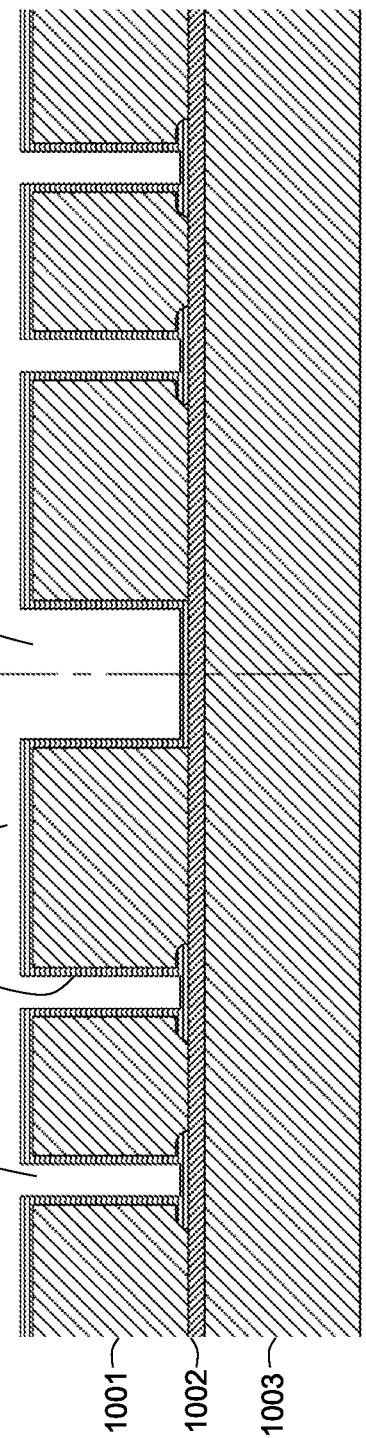
FIG. 10C
FIG. 10D

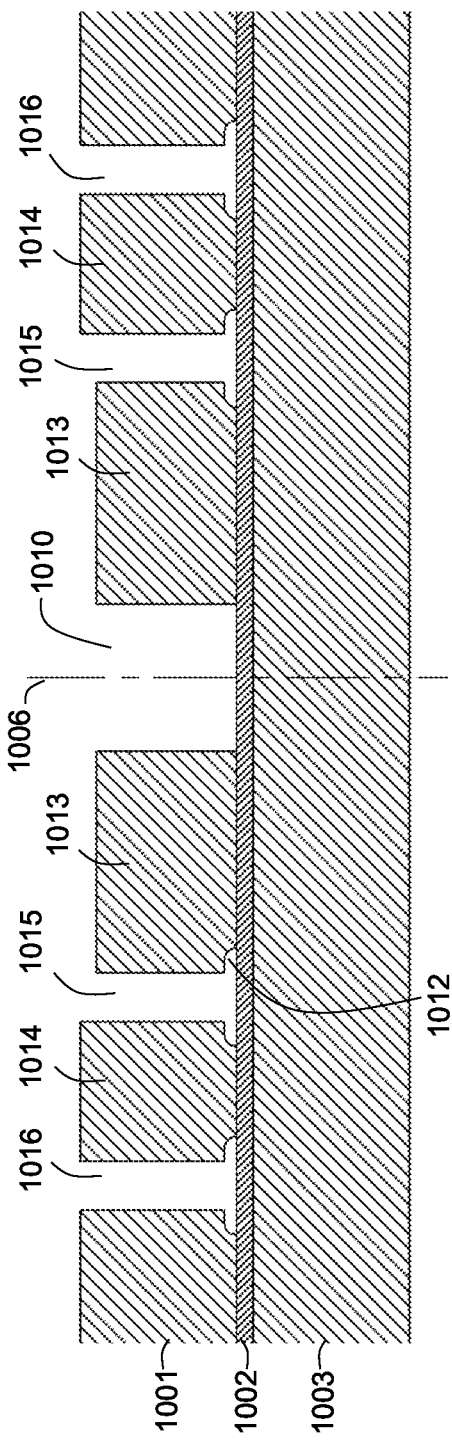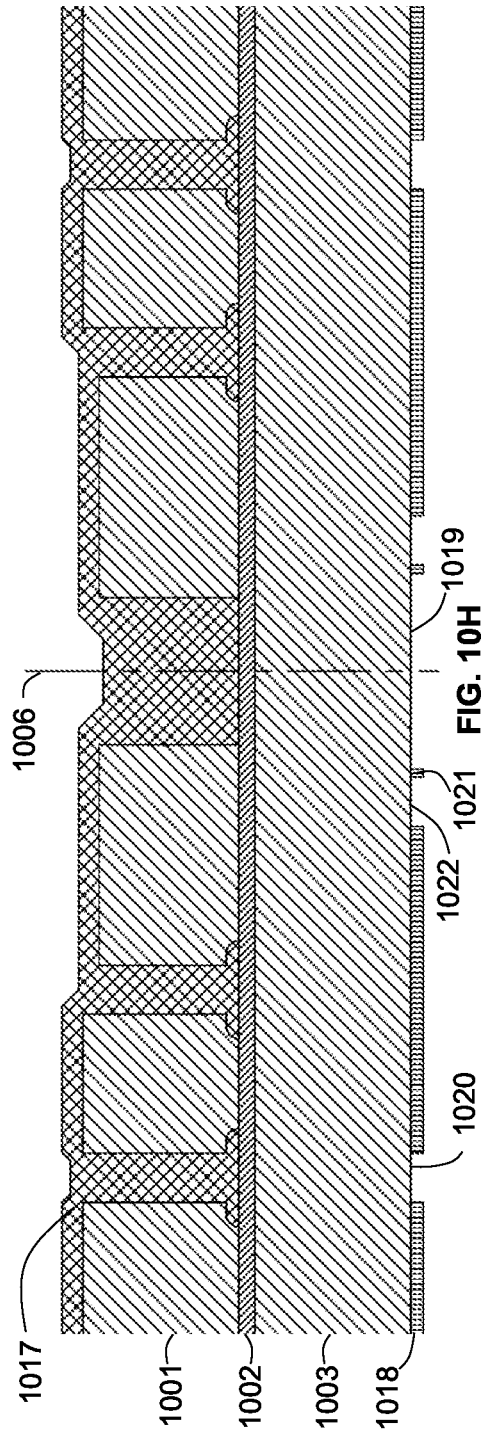

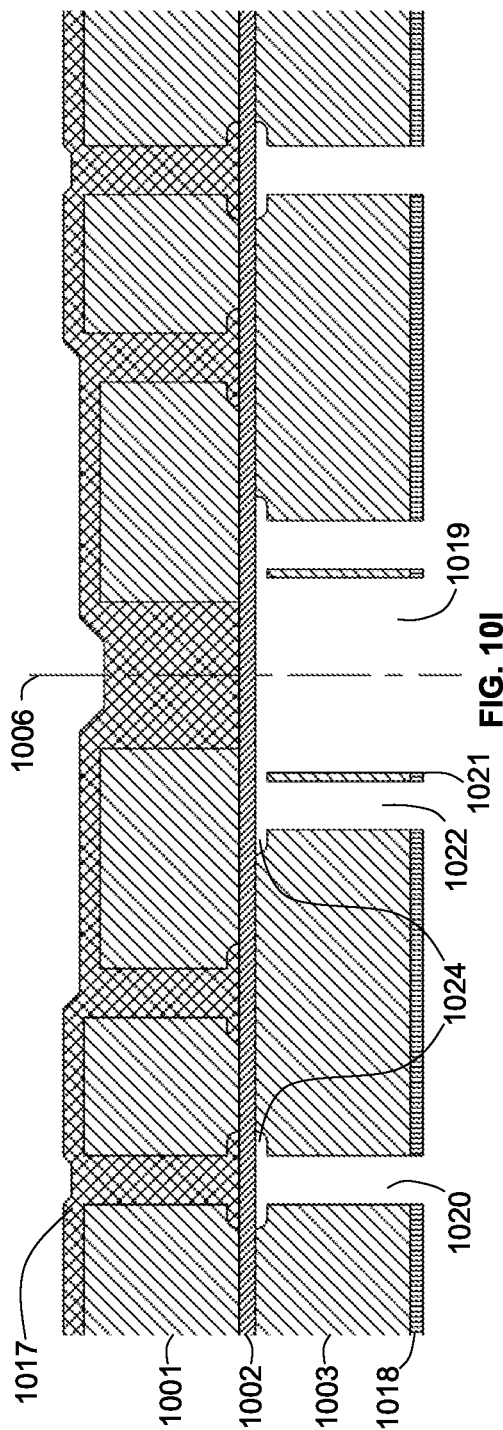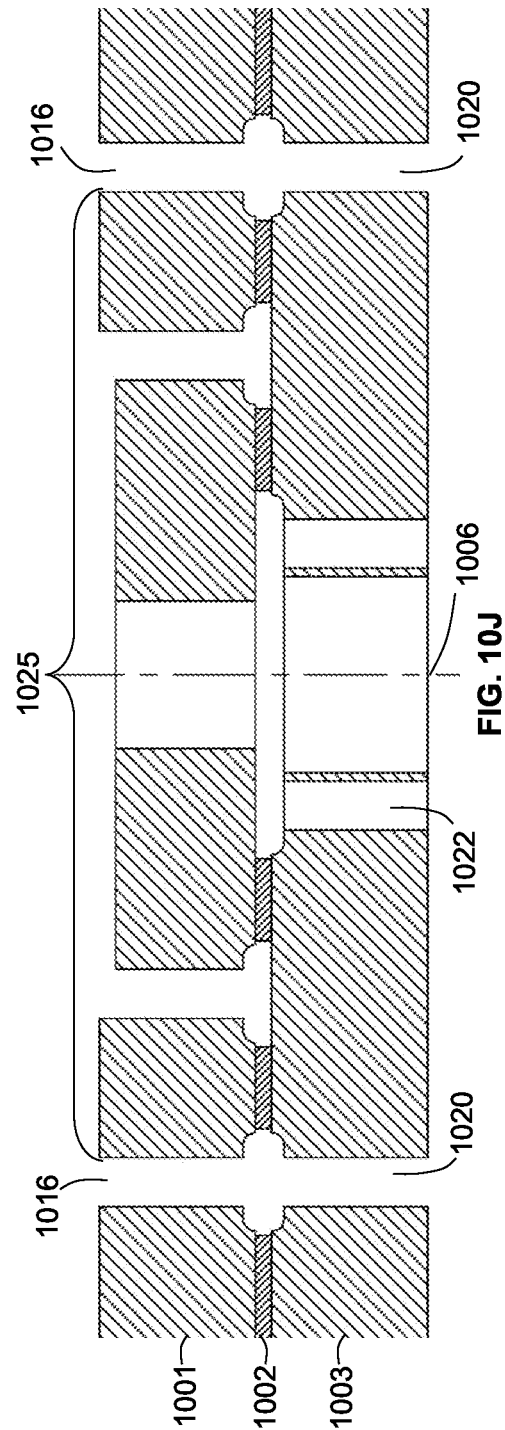

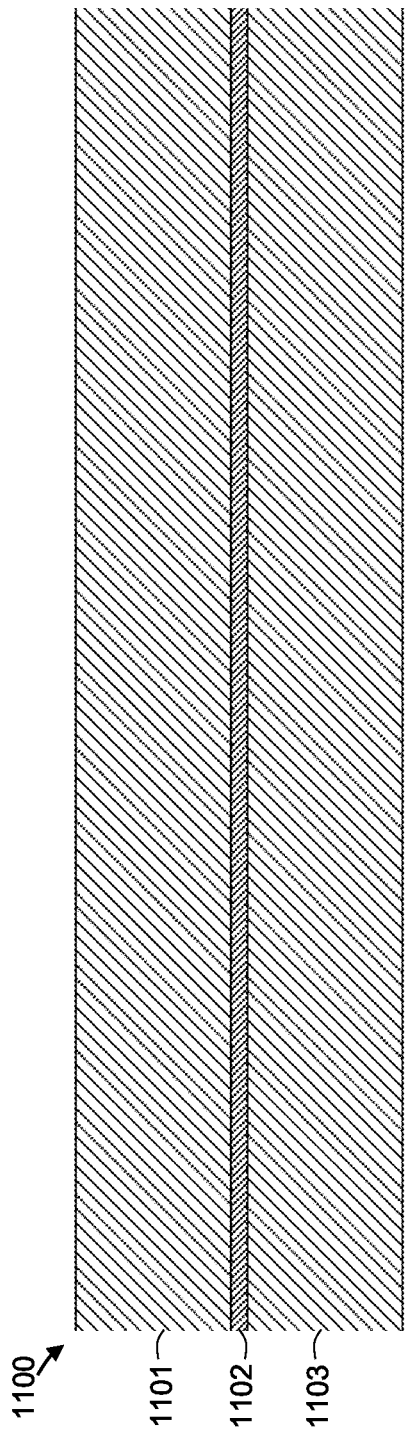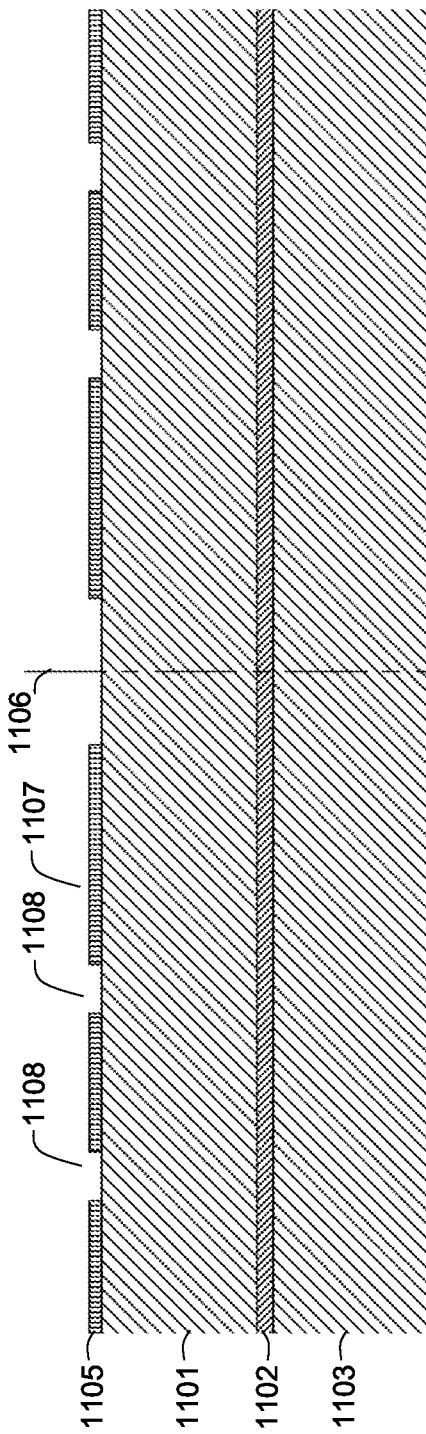

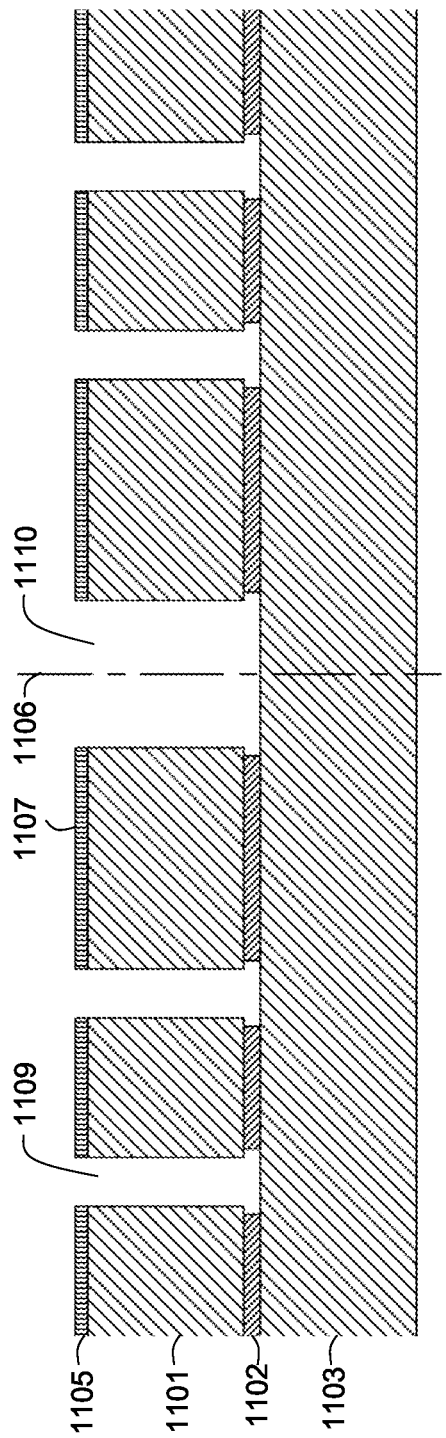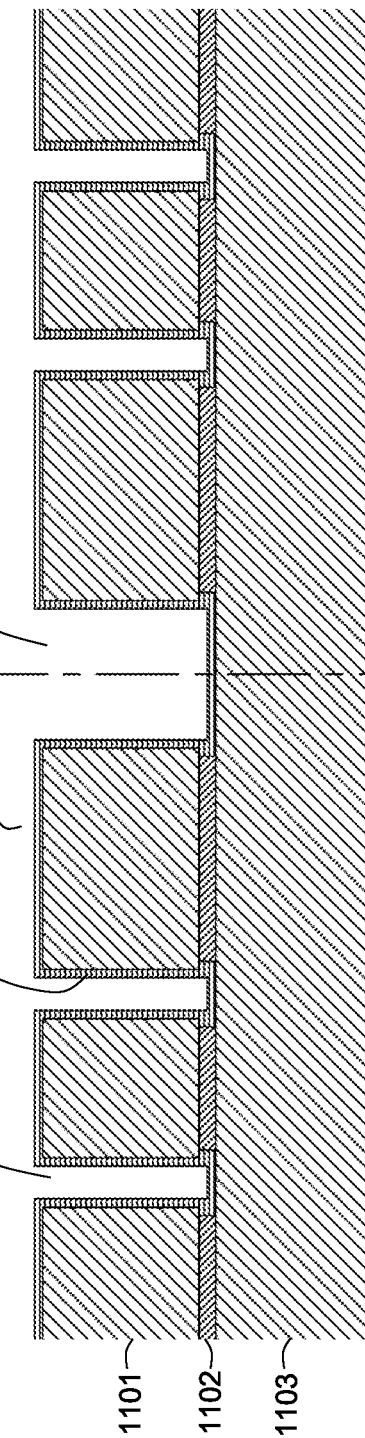

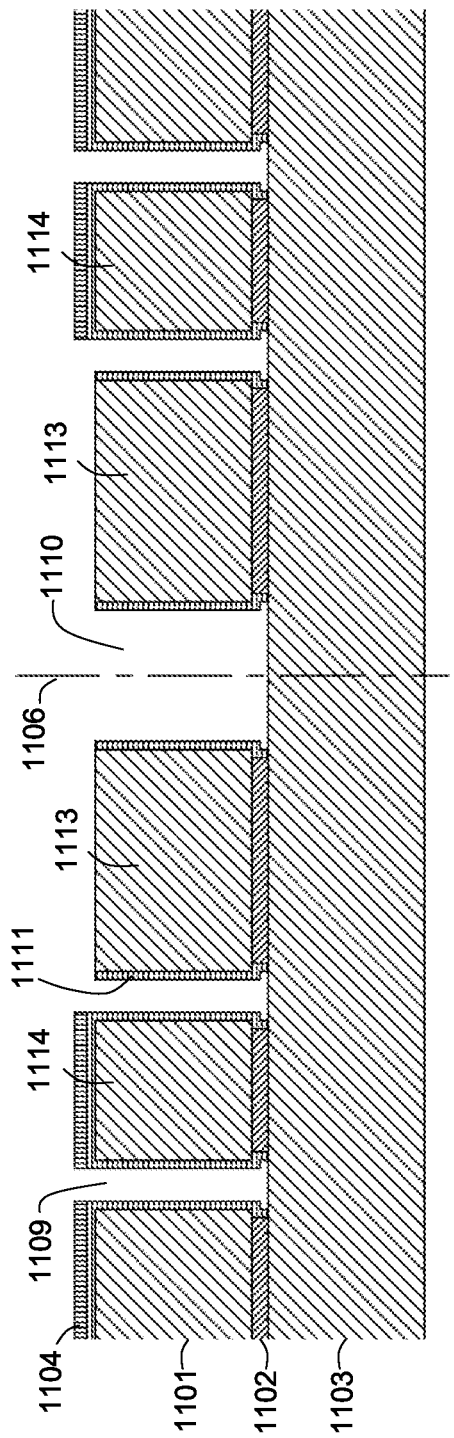
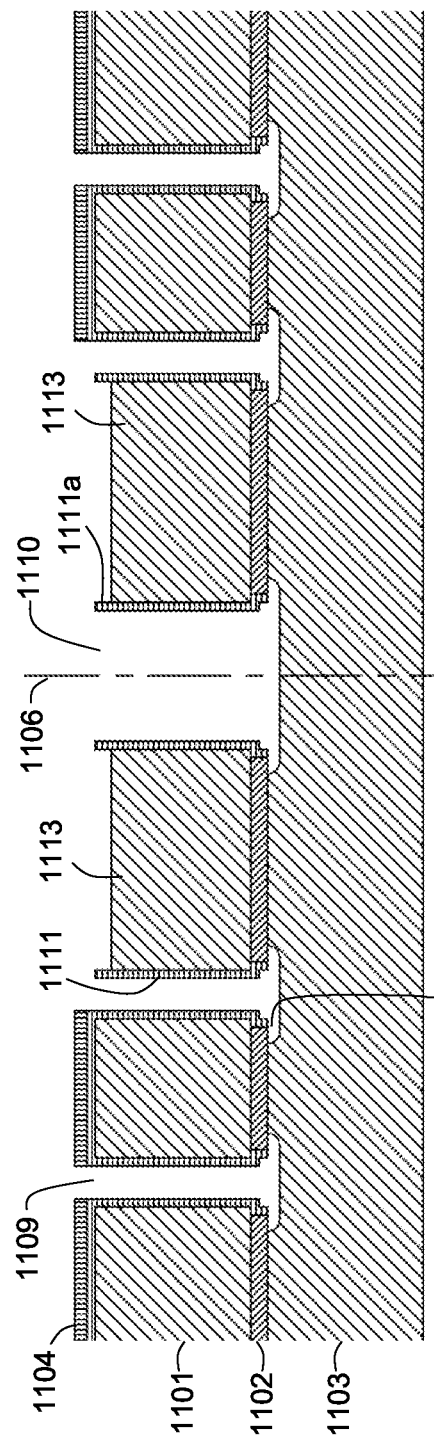
FIG. 11E
FIG. 11F

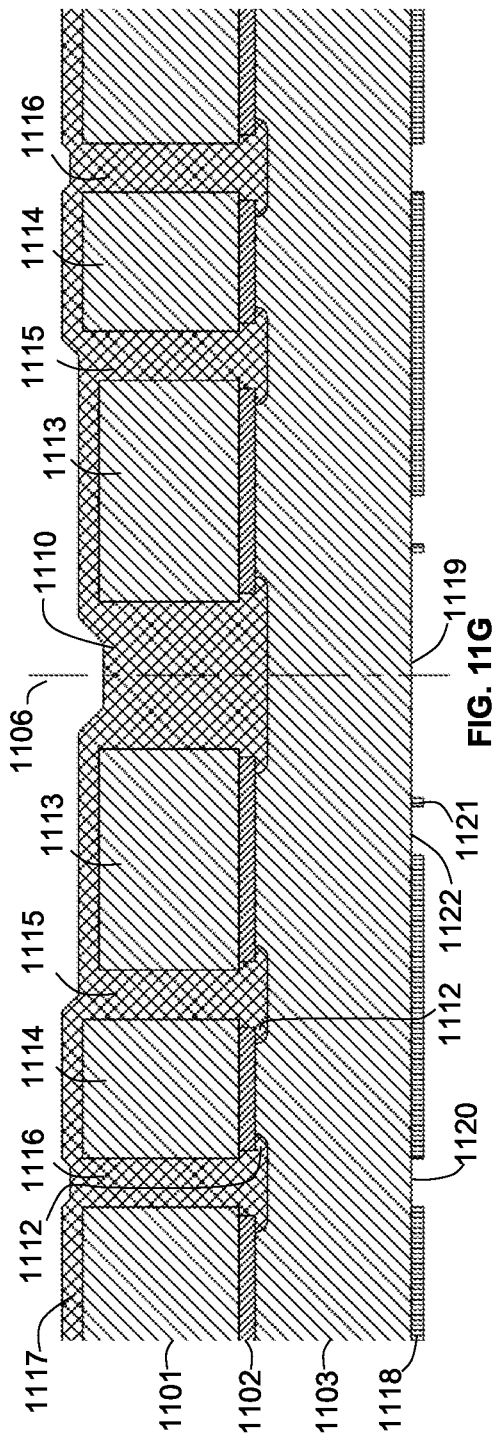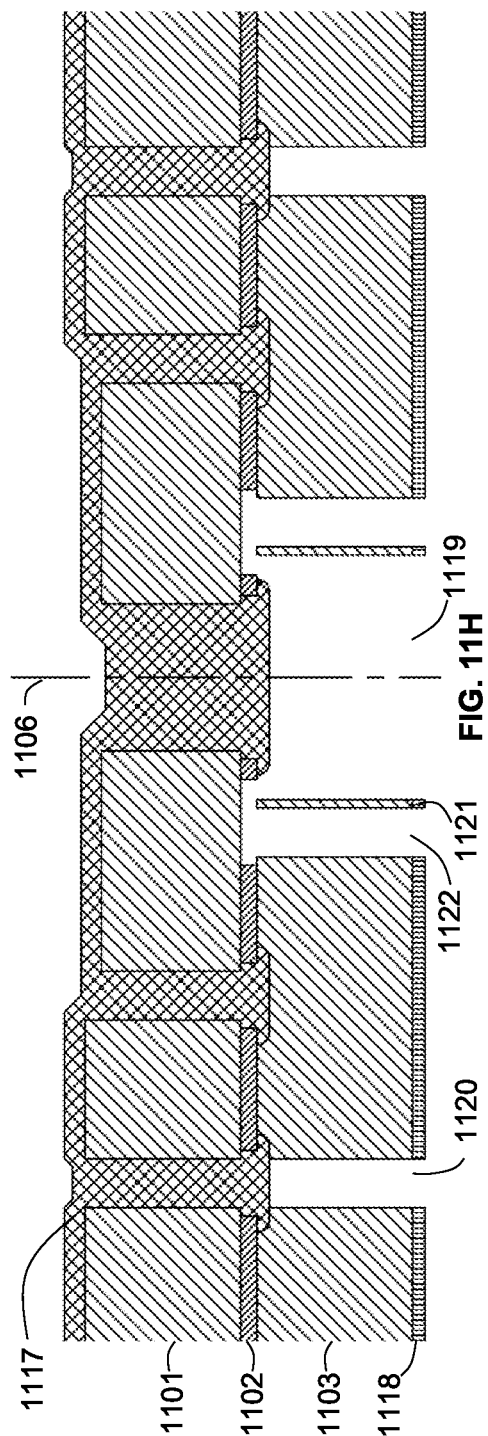

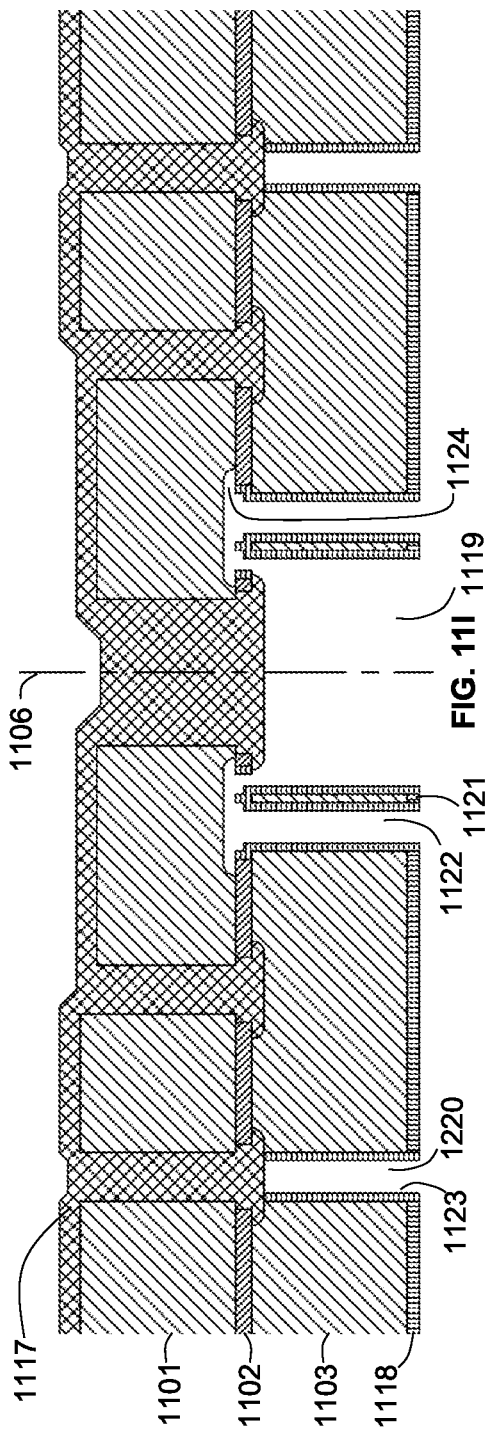
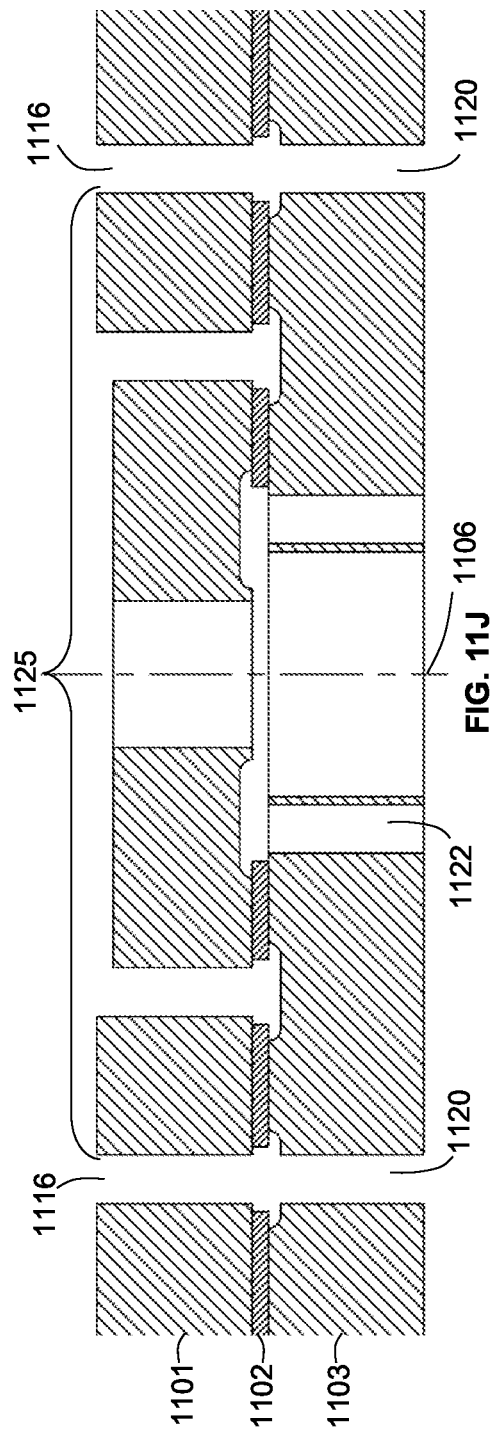

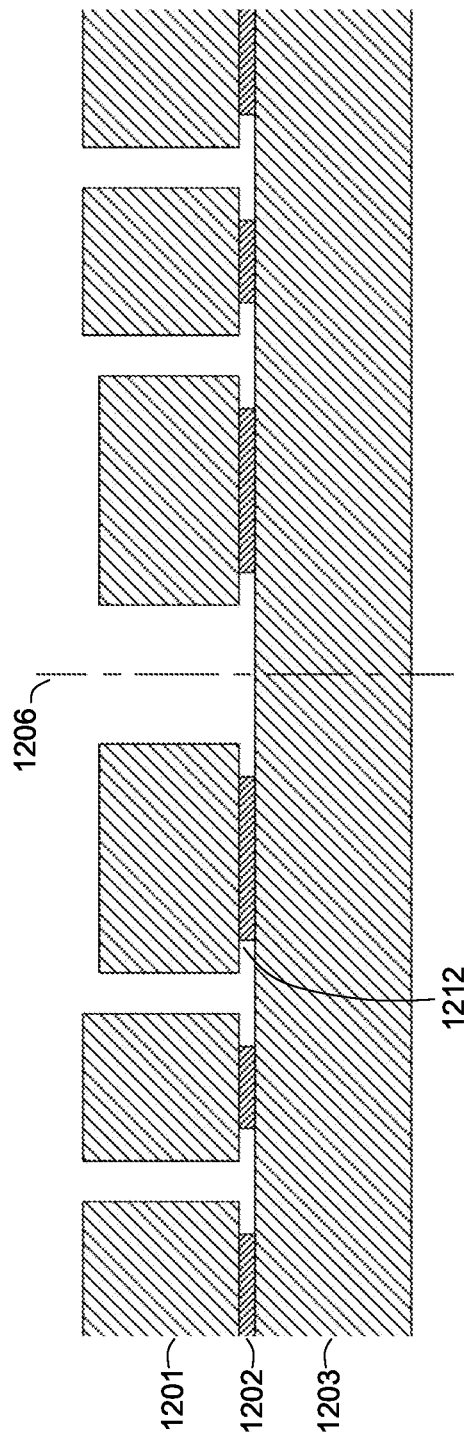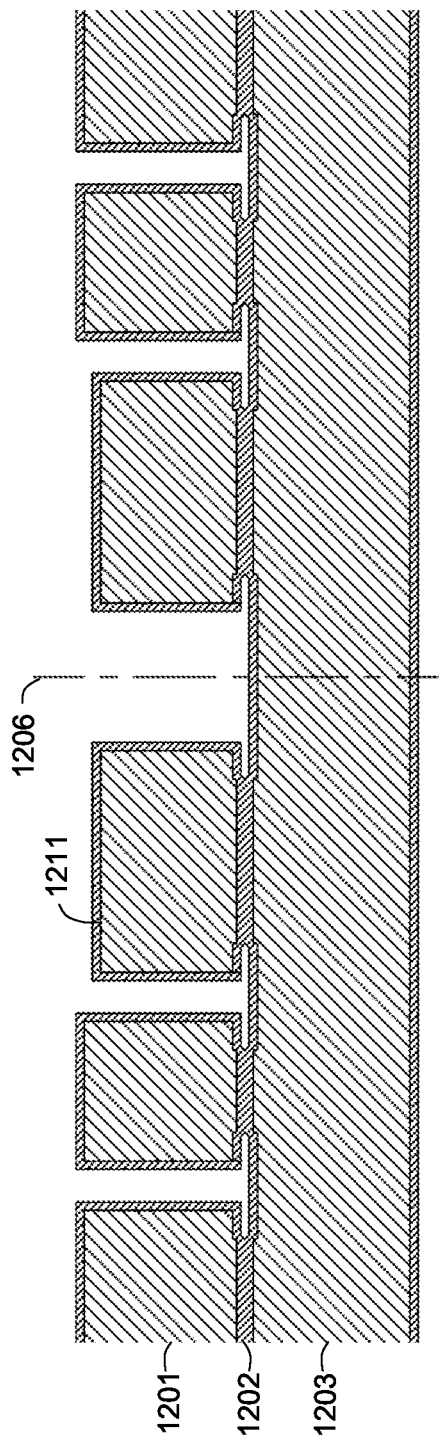

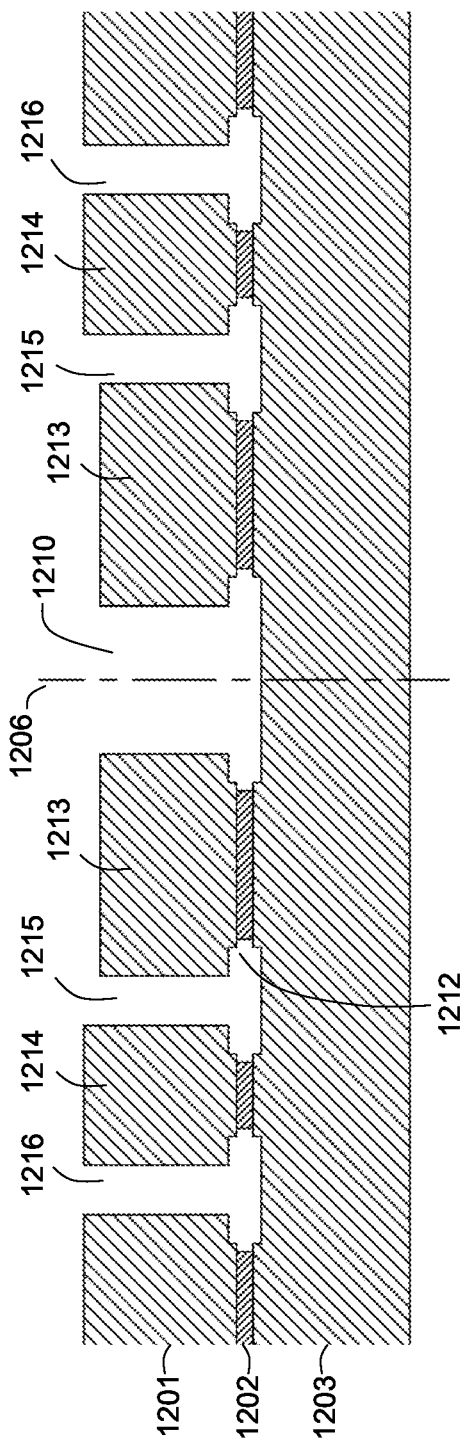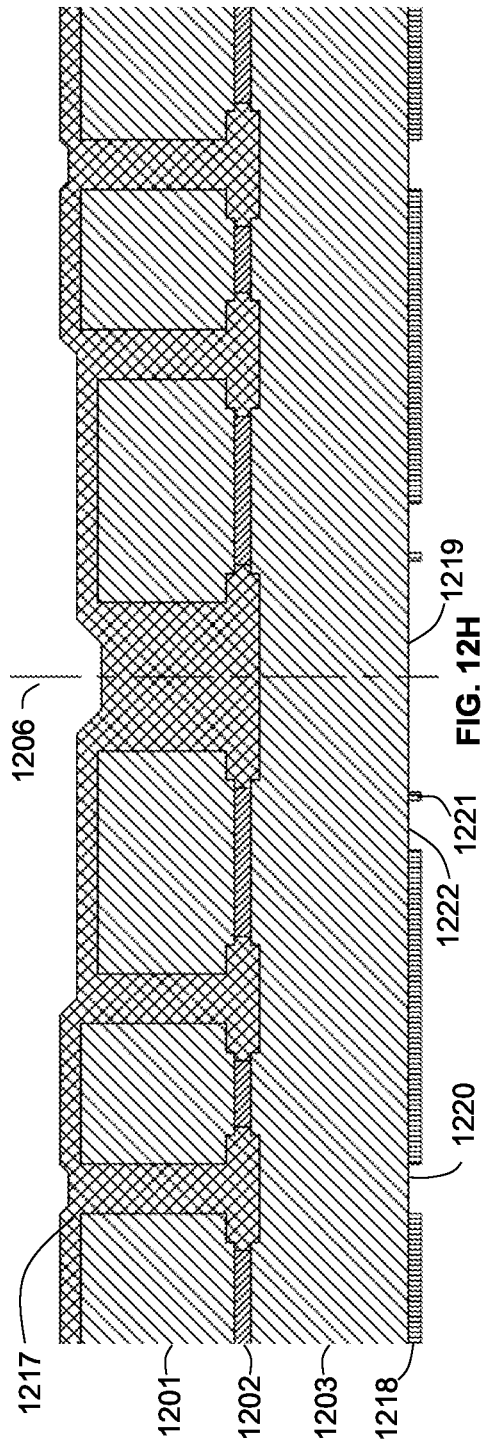

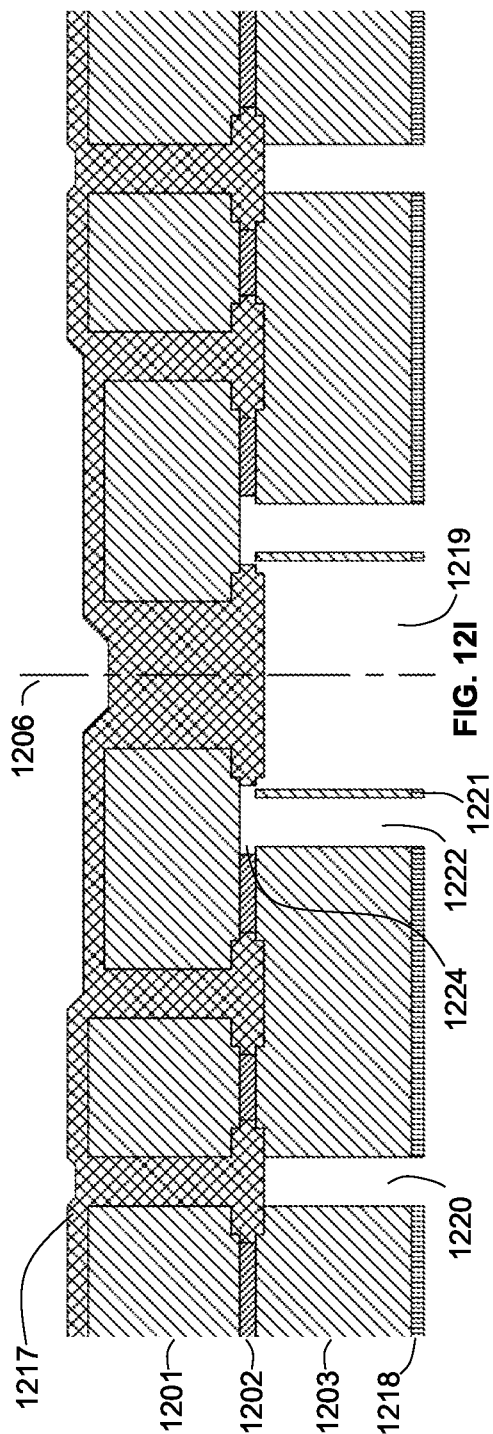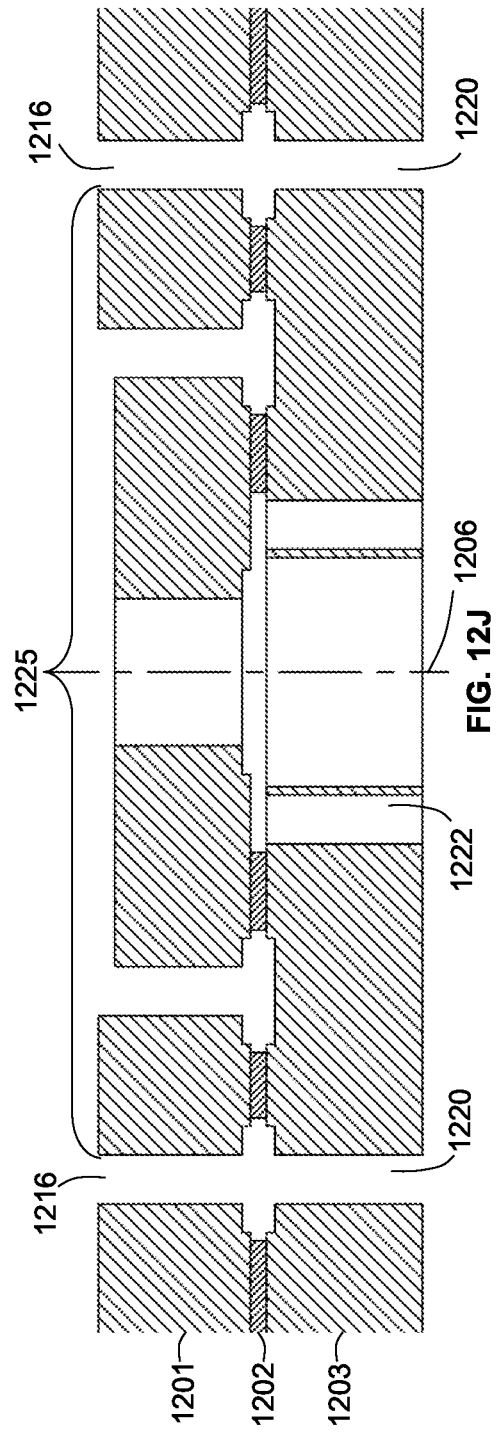

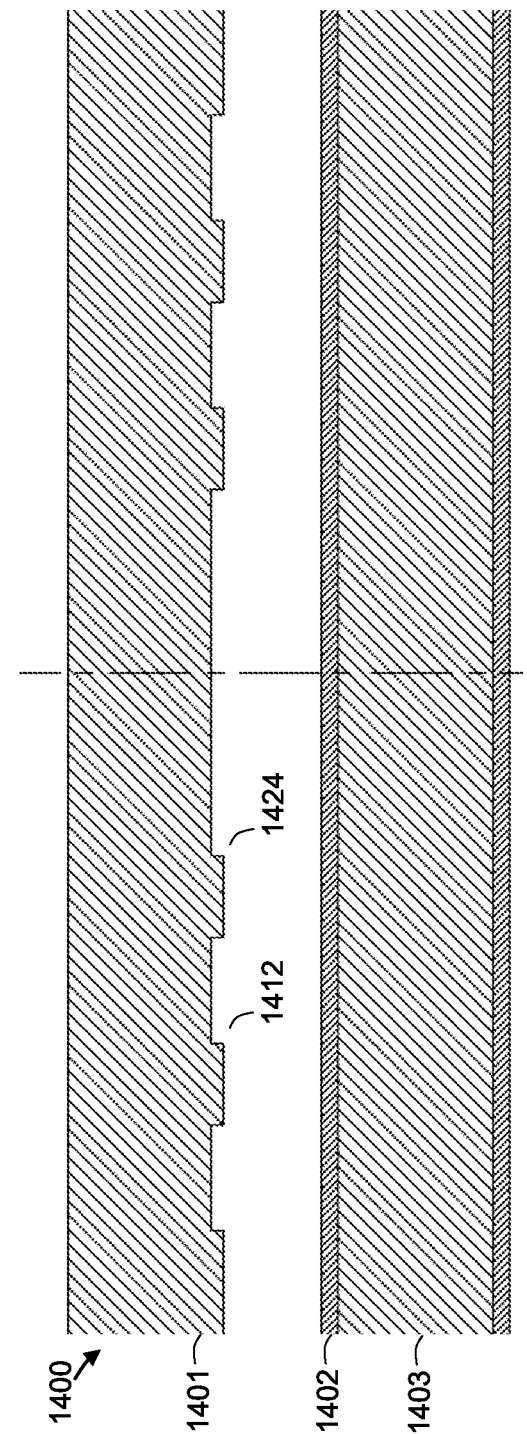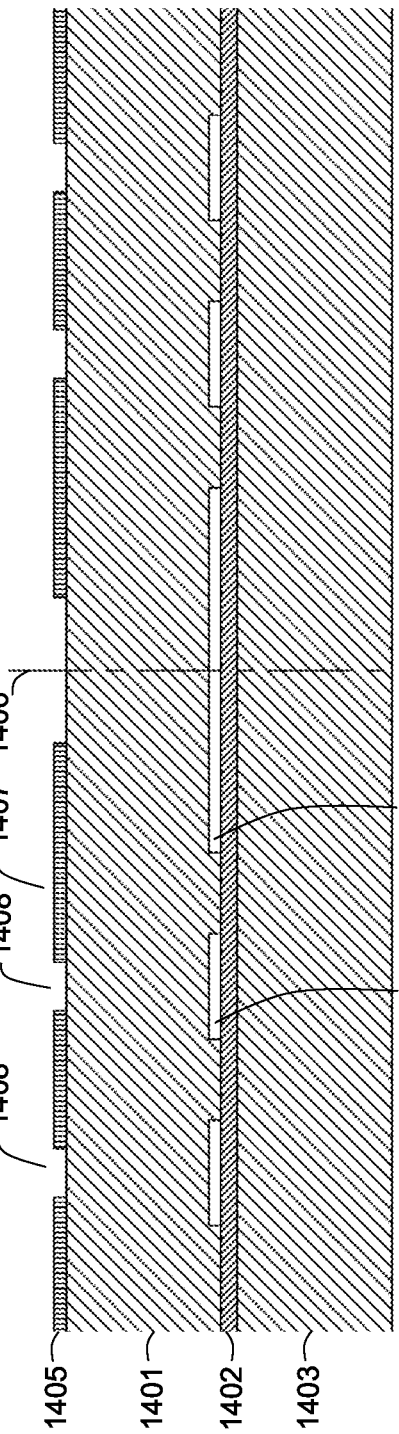

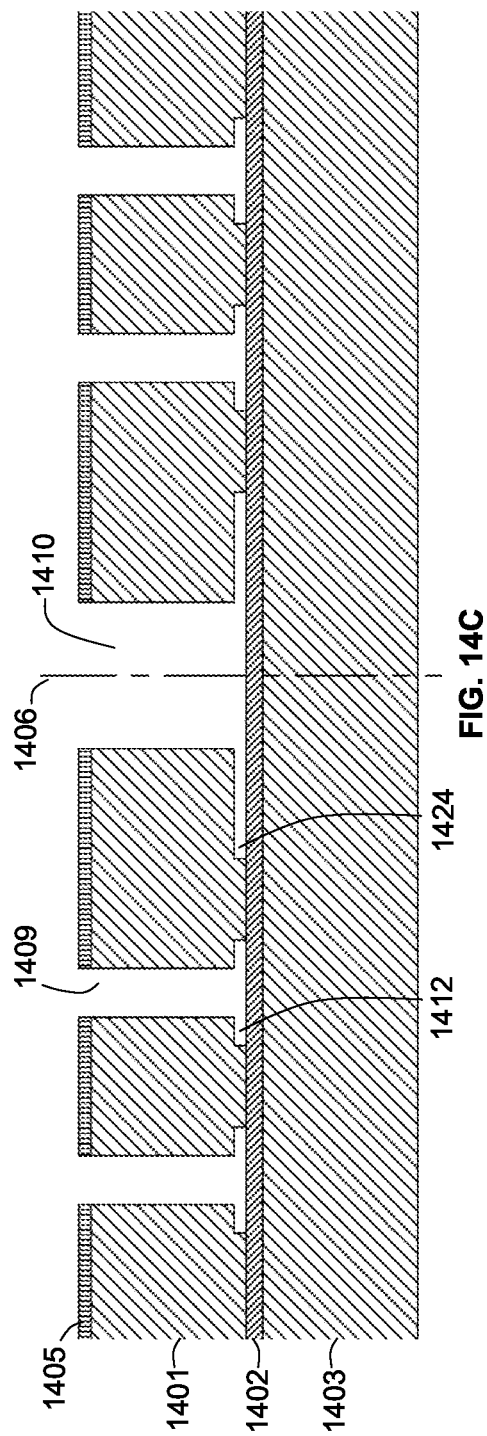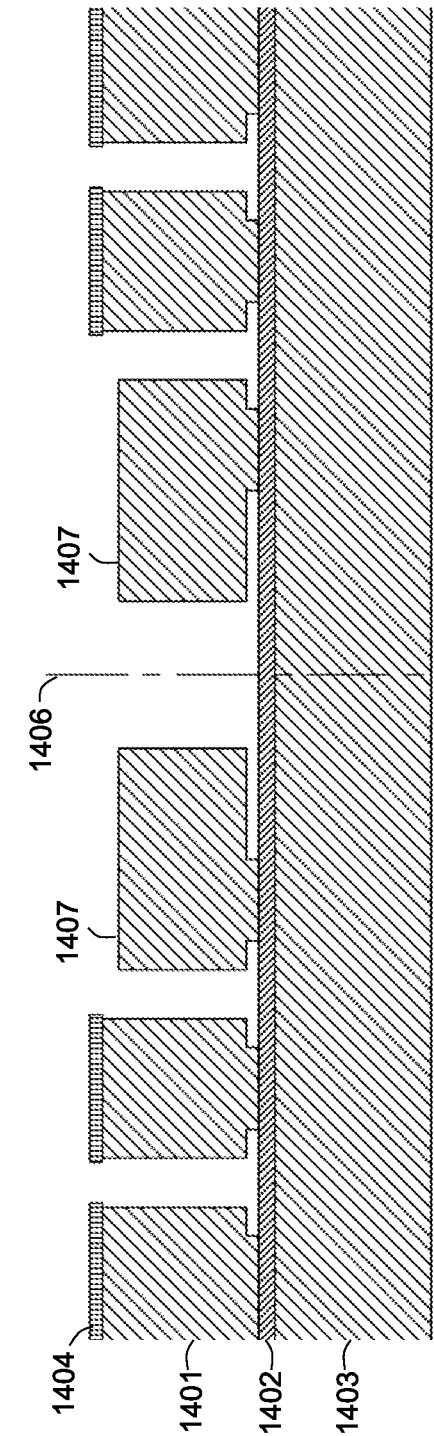

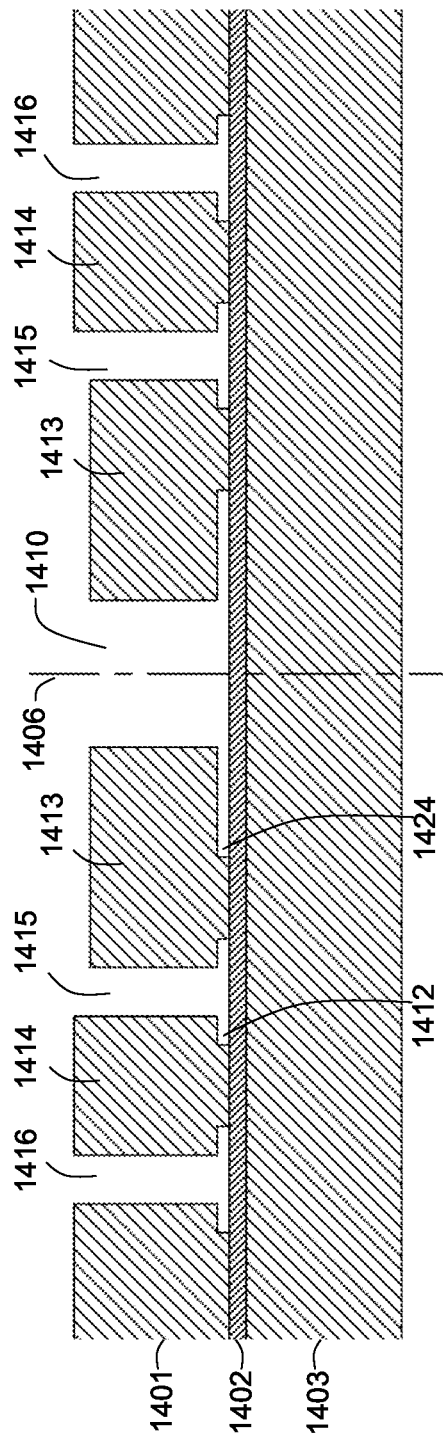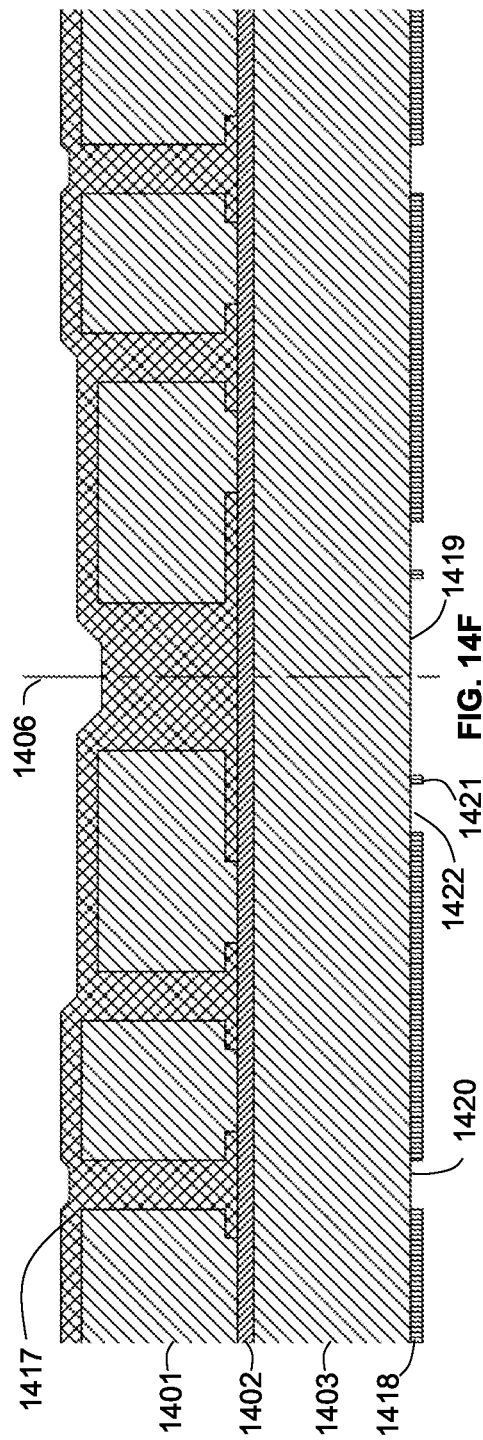

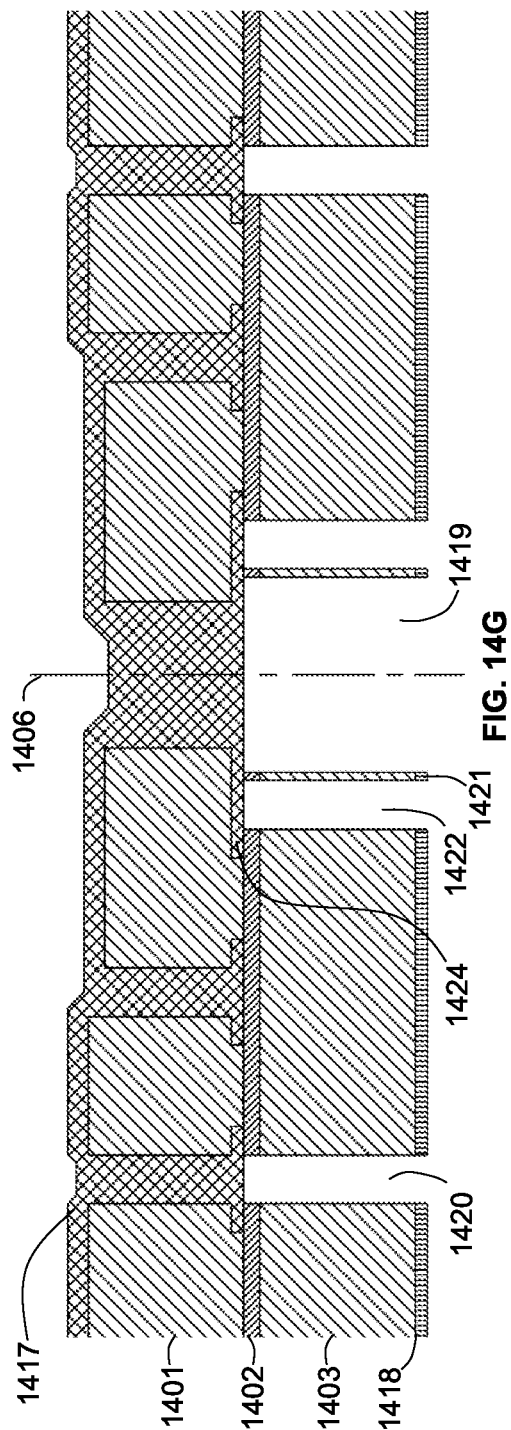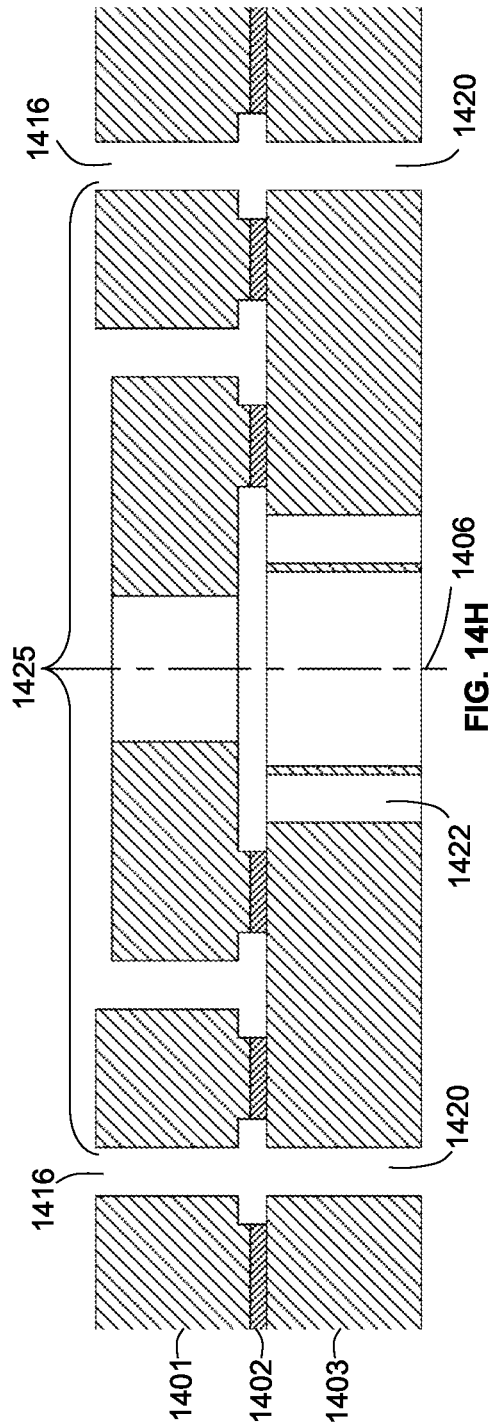

ELECTROSTATIC DEVICES TO INFLUENCE BEAMS OF CHARGED PARTICLES

REFERENCES

This application claims priority from U.S. provisional patent application Ser. No. 63/230,810, entitled "Electrostatic Devices to Influence Beams of Charged Particles", filed on Aug. 8, 2021, and from U.S. patent application Ser. No. 17/856,899, of the same title, filed on Jul. 1, 2022. It is further related to PCT application PCT/US22/36031, of the same title, filed on Jul. 1, 2022, and Taiwan patent application serial no. 1141164300, entitled "影響帶電粒子射束的靜電裝置," filed on Aug. 5, 2022. These applications are hereby incorporated by reference as if set forth in full in this application for all purposes.

BACKGROUND

The present invention relates to micro devices and their manufacturing methods. More particularly, it relates to electrostatic micro devices to influence charged particle beams in vacuum apparatus such as electron scanning microscopy and electron-beam lithography machines.

Measurements of linewidth, thickness variations, surface roughness, and inspections of defects are needed in all aspects of semiconductor or Integrated Circuit (IC) manufacturing, especially when device sizes are reduced, and wafer sizes are increased. A scanning electron microscope (SEM) generates images of a sample substrate (e.g., a wafer) by scanning the wafer surface with a focused beam of electrons in a raster scan pattern. On irradiation with an electron beam, the wafer substrate emits backscattered electrons and secondary electrons, from the point of electron beam incidence (electron probe spot). Either the backscattered or the secondary electrons can be subsequently collected and detected with an electron detector and then form an image of the wafer surface as the electron beam scans. SEM imaging can achieve resolution as small as one nanometer, yet the long scanning time per wafer results in low throughput. To increase the SEM throughput, efforts to convert a single electron beam to multiple electron beams have been made to gain an image of a large sample surface area, including electron probe spots of each individual beam simultaneously. An electron beam conversion unit converts a single electron beam to multiple electron beams. It may include micro-lenses, micro-deflectors, micro-compensators, and micro-stigmators to focus, direct, deflect, shape-correct, and compensate the multiple electron-beams individually. Examples of electron beam conversion units and related micro devices can be found in U.S. Pat. Nos. 6,617,587, 6,617,595, 6,943,349, and 9,691,586.

An electric field applies a direct force on a charged particle beam. A common operation to influence a charged particle beam is the application of single-pole or multipole electric fields. Electrostatic micro devices with electrodes arranged along the charged particle beam paths have been used in many electron beam conversion units. In such electrostatic systems, a micro-lens can focus an electron beam using a single-pole annular electrode, while a micro-deflector can deflect and control the propagation direction of an electron beam using a dipole, a quadrupole, or an octupole electrode configuration. For example, in an electrostatic micro-deflector device for handling a 5×5 array of electron beams, each of the 25 deflector units may have an octupole electrode configuration. As a result, there may be 200 individually controlled electrodes packed on a planar chip a few millimeters in lateral dimensions. The electrode packing density does not seem to be high if viewed only from the lateral dimensions. However, the electrode thicknesses may be larger than 10 µm, or even larger than 100 µm, in the vertical dimension along the charged particle beam paths. The aspect ratios (thickness over width) of the electrode and ground structures are high, making the microfabrication process difficult. Moreover, a high magnitude of electric fields is often needed in confined micro spaces to effectively influence the charged particle beams in vacuum. As an example, an electric field of higher than 10V/µm may be needed between an electrode and ground structures that may be 100 µm thick and that are placed a few microns apart. When a high voltage is applied across an insulating layer, electrical discharges and electrical breakdowns may occur across the insulating layer, at the interfaces of the insulating layer, or at the exposed dielectric surfaces of the insulating layer. Reducing the possibilities of electrical discharges and dielectric breakdowns has been a challenge in device structural designs and microfabrication methods for making reliable electrostatic micro devices. Another challenge in device structural designs and microfabrication is to reduce or eliminate trapped charges on the surfaces of the devices. If charges are trapped and accumulated on the device surfaces, they may randomly affect the electric field controls that influence the charged particle beams.

SUMMARY

The disclosed technology provides designs and manufacturing methods of electrostatic micro devices for manipulation of charged particle beams. The devices are used as micro-lenses, micro-deflectors, micro-compensators, or micro-stigmators, and manipulate and influence charged particle beams in apparatus such as electron scanning microscope and electron beam lithography.

The technology provides electrostatic devices with an improved performance with respect to electrical discharges and breakdowns. It is known that in a vacuum environment, when a large voltage is applied between two parallel conductive plates with an insulating thin plate in the middle, electrical discharges and breakdowns may occur across the electrical insulating thin plate, at buried interfaces, and at the exposed edge surfaces of the electrical insulating plate. Such electrical discharges and breakdowns are common failure mechanisms of many electrostatic devices.

In a first aspect, an electrostatic device includes a top silicon layer, a bottom silicon layer, and a buried layer wedged in between. The buried layer includes silicon dioxide. A beam opening, including concentric top and bottom beam openings, goes through the device to allow a beam of charged particles to pass through. The bottom beam opening may have a larger diameter than the top beam opening. The device is encapsulated in an insulating layer. One or more electrodes and ground planes may cover the insulating layer. A first electrode covers at least a part of the top beam opening. A ground plane covers at least a part of the bottom beam opening. Electrodes and ground structures (ground planes and ground tracks) are physically and electrically separated by micro-trenches and micro-undercuts. A micro-fence surrounds the bottom beam opening.

In a second aspect, a method of manufacturing an electrostatic device starts with a wafer that has a top silicon layer, a bottom silicon layer, and a buried insulating layer disposed between the top silicon layer and the bottom silicon layer. The method forms a top beam opening and one or more micro-trenches and micro-undercuts in the top silicon layer. It forms a bottom beam opening and one or more micro-trenches, micro-fences, micro-bridges, and micro-undercuts in the bottom silicon layer. Surfaces are encapsulated with an insulating layer, and conductive layers are deposited on selected surfaces. The method may include etching micro-trenches with a deep reactive ion etching (DRIE) process.

In a third aspect, a method of manufacturing an electrostatic device starts with two silicon wafers. Silicon dioxide is thermally grown on the second silicon wafer. One or more holes are etched through the first and second silicon wafers, and the two silicon wafers are bonded together. Surfaces are encapsulated with an insulating layer, and conductive layers are deposited on selected surfaces. The method may include etching micro-trenches with a deep reactive ion etching (DRIE) process.

The electrode and ground structures are made surface-conductive, instead of using the volumes of electrode and ground structures, to provide electrical conduction paths for generating electric fields in a vacuum space. More specifically, electrically insulating layers are used to fully separate the electrically conductive layer at the surfaces from the volumes of the electrode and ground structures. One advantage of surface-conducting electrodes is to prevent any strong electric fields being applied across the buried insulating layer from inside the electrode and ground structures. The surface-conductive electrode design significantly reduces the possibility of the electrical discharges and breakdowns occurring across a buried electrical insulating layer and at the buried interfaces of an electrical insulating layer. To fabricate surface-conductive electrodes, electrically conducting layers are selectively deposited on microstructures with the encapsulated insulating layers. The conductive surface layers of adjacent electrodes and ground structures are separated by dielectric surfaces of the encapsulating insulating layer.

In another aspect, the areas of the dielectric surfaces separating adjacent electrically conductive surface layers are in confined hidden spaces that are formed by microstructures including micro-trenches, micro-undercuts, micro-fences, and micro-bridges. The enlarged surface areas with increased length of dielectric surface paths in confined hidden spaces significantly reduce the possibilities of electrical discharges and breakdowns potentially occurring at dielectric surfaces of electrical insulating layers.

In yet another aspect, an implementation provides electrostatic devices with improved performance with respect to reducing trapped electric charges on exposed dielectric surfaces along the charged particle beam paths. Trapped charges on exposed dielectric surfaces along the charged particle beams path may randomly affect the control of the applied electric fields in the electrostatic devices.

In a further aspect, the dielectric surfaces exposed to the charged particle beam paths and exposed to the space charges are fully covered by thin layers of electrically conductive materials. The aforementioned dielectric surfaces separating adjacent electrically conductive surfaces layers are fully confined in small spaces and are hidden from the charged particle beam paths and space charges. Therefore, the dielectric surfaces separating adjacent electrically conductive surface layers are not exposed to the charged particle beams and are not exposed to other charges in the vacuum space. As a result, the electrostatic devices of the disclosed technology eliminate disturbances or interferences, caused by trapped surface charges, to the charge particle beams.

Another aspect of the technology provides a narrow-electrode design and fabrication method comprising overhanging electrode bridges with supporting anchors. The narrow-electrode method enables electrode and ground routings in high-density areas and reduces the possibilities of electrical discharges from dielectric surfaces and from particles in the vacuum systems.

More specifically, the advantages of the electrostatic devices of the disclosed technology are enabled by its overall microstructural design and manufactures methods. The following are brief descriptions of key implementations.

In an implementation, the micro electrostatic devices of the disclosed technology comprise multiple silicon layers, buried thin silicon dioxide layers, encapsulated thin electrically insulating layers, and deposited thin electrically conductive layers.

In an implementation, the electrostatic devices are made from substrates that include at least two layers of silicon with a thin silicon dioxide layer buried between the silicon layers. The silicon layers are used for mechanical structuring instead of electrical conducting. The middle silicon dioxide layer is used for mechanical structuring as well as for providing electrical insulation.

In an implementation, the silicon layers and the silicon dioxide layers are structured to form through-hole openings, elongated silicon islands, micro-trenches, micro-undercuts, micro-fences, and micro-bridges.

In an implementation, single or arrays of through-hole openings allow charged particle beams to pass through the devices along their transmission paths. The through-hole openings are also for influencing the charged particle beams with electrical fields generated at the through-hole openings. The through-hole openings may be circular. The circular holes at different layers along each beam path may have different diameters, but they are concentrically aligned.

In an implementation, elongated planar silicon islands are structured by etching micro-trenches that extend through a silicon layer and terminate at the surface of the buried silicon dioxide layer. The elongated silicon islands form the islands of the electrode and ground structures. To influence the charged particle beams with single-pole or multi-pole electric fields, each through-hole opening is formed by an annular electrode at one end of an elongated electrode island or by arc-shaped ends of multiple electrodes. The elongated silicon islands also serve as the supporting structures for making electrical routings with their other ends extending to the device edge areas to make external electrical contacts.

In an implementation, there are elongated ground islands in the same layer as the elongated electrode islands and the ground islands are placed between adjacent elongated electrode islands to provide electrical shielding between the adjacent electrodes.

In another aspect of the technology, the ends of the elongated electrode islands that form the annular electrodes or arc electrodes at the through-hole openings are overhanging. This overhanging structural design further reduces the chances of electrical discharges at the electrode ends.

In another aspect of the technology, portions of the elongated electrode and ground islands, especially those at dense routing spaces, are made overhanging between anchoring supports. This achieves narrow routing lines in confined spaces and reduces the chances of electrical discharges along the routing portions of the elongated electrode and ground islands.

In another aspect of the technology, the elongated electrode islands are recessed relative to their adjacent shielding ground island. The recesses prevent electrical shorting and electrical discharging when the multiple devices are stacked along the transmission paths of the charged partial beams.

In an implementation, narrow and deep micro-trenches are etched into silicon layers to define and surround elongated silicon islands for making electrode and ground structures. The micro-trenches have straight sidewalls, and the etching of the micro-trenches terminates at the surfaces of the buried silicon dioxide layer. The depth of the micro-trenches is the same as the silicon layer thickness and the width of the micro-trenches are smaller than the diameters of the through-hole opening.

In an implementation, each elongated silicon island is also fully surrounded by a micro-undercut along the bottom of the micro-trench surrounding the elongated silicon island. The micro-undercuts undercut the corresponding elongated silicon islands at their interfaces with the buried silicon dioxide layer. More specifically, the micro-undercut may be formed by selectively etching the silicon at the bottom portion of the silicon islands, beneath the silicon islands, or through controlled etching of the buried silicon dioxide layer at the bottom edges of the silicon islands. More specifically, the micro-undercuts may be enlarged by repeated cycles of thermal oxidation of the silicon layer and removal of the grown silicon dioxide layer by etching with hydrofluoric acid in liquid or vapor phases.

In an implementation, a thin-wall silicon micro-fence may be formed along the periphery of a large opening of a silicon layer by etching micro-trenches. The micro-fence is made overhanging but is held in place by overhanging micro-bridges. There is also a surrounding micro-undercut formed at the bottom of the micro-trench.

In an implementation, the micro-trench, micro-undercut, micro-fence, and micro-bridge structures around elongated silicon islands provide built-in shadow-masking effects at micro scale to enable pre-structured conductive thin film deposition processes.

In an implementation, the disclosed technology provides a method of cleaning and modification of the surfaces of the etched silicon micro-structures. More specifically, the silicon surface modification refers to reducing the silicon surface roughness, especially surface protrusion defects in micro and nano scales. The method uses at least one cycle of silicon thermal oxidation and controlled silicon dioxide etching with a hydrofluoric acid (HF) water solution or its vapor. The cleaner and smoother surfaces provided by this method significantly reduce the chances of electrical discharging and breakdowns in confined micro spaces when strong electric fields are applied to influence the charged particle beams.

In an implementation, all surfaces of the silicon structures, including the edge silicon surfaces of the devices, are fully encapsulated by a thin electrically insulating layer, for example a thermally grown silicon dioxide layer. Because the silicon dioxide layer is thermally grown from silicon surfaces at elevated temperatures, it ensures void-free and defect-free insulating layer coverage of all the silicon surfaces including the silicon surfaces in hidden spaces of micro-undercuts. Alternatively, a thin electrically insulating layer, such as silicon dioxide or aluminum oxide, may be deposited on and encapsulate the silicon surfaces by using atomic layer deposition, which are also considered part of the disclosed technology.

In an implementation, the electrode and ground structures are made electrically conductive by depositing thin electrically conductive materials on electrically insulating surfaces. As a result, the elongated electrode and ground islands are made electrically conductive through their surface layers instead of through their volume silicon structures. This surface-conducting design and its fabrication method enable high magnitudes of electric fields being applied in confined micro spaces without electrical discharges.

In an implementation, the surfaces of the electrostatic devices exposed to the charged particle beams along their transmission paths are covered with thin layers of electrically conductive materials to prevent charge trapping In an implementation, the external surfaces of the electrostatic devices are covered with thin layers of electrically conductive materials to prevent charge trapping.

The technology provides a pre-structured thin film deposition method for selectively depositing thin layers of conductive materials on the exposed surfaces of the microstructures in forming the electrostatic devices of the disclosed technology. The pre-structured thin film deposition method refers to achieving selective thin film surface coverage as the thin film is deposited without needing alignment to the existing microstructures on the devices and without requiring additional fabrication steps of masking and etching to form the patterns of the thin conductive film.

In an implementation, the pre-structured thin film deposition process uses a physical vapor deposition (PVD) that includes a sputtering deposition or a combined sputtering deposition and evaporation deposition with the built-in shadow-masking method of the disclosed technology.

More specifically, the sputtering deposition process is used to deposit thin conductive films on exposed surfaces, especially on exposed sidewall surfaces of through-hole openings along the charged particle beam paths. However, the electrically conductive thin films do not deposit on the dielectric surfaces in the hidden spaces of the micro-undercuts by the sputtering deposition process. This selective sputtering deposition process is enabled by built-in shadow masking effects generated by the microstructures including micro-trenches, micro-undercuts, micro-fences, and micro-bridges of the disclosed technology. As a result, the discontinuities of the conductive thin film surface coverages provide the physical and electrical separations among surface conducting electrode and ground structures. The discontinuities are generated without requiring patterning and etching of the deposited thin films. Therefore, the electrically conductive layer deposition process is pre-structured. For example, the conductive thin film may have a single metal layer that includes but not limited to titanium. Alternatively, the thin conductive film may include an inner adhesion layer and an outer conductive layer that are deposited in the same deposition process. The outer conductive layer may be a material that resists surface oxidation and corrosions. Examples of the thin inner adhesion layer materials include but are not limited to titanium, titanium tungsten, and chrome. Examples of the outer conductive layer materials include but are not limited to gold, platinum, and molybdenum.

More specifically, an evaporation deposition process may be used to deposit electrically conductive thin films on the top surfaces of the microstructures before or after a sputtering conductive material deposition process. Because an evaporation deposition process can provide line-of-sight deposition, so the evaporation deposition process is also pre-structured relative to the formed micro-structures on the devices. The electrically conductive films deposited on the top surfaces may be purposely made thicker by adding an evaporation deposition process after a sputtering deposition process. The thick electrically conductive films on the top surfaces may be used for probing and making electrical connections. Deposition by evaporation may also be used to add more robust thin film layers to better withstand the charged particle bombardment on the top surfaces of the microdevices. For example, the conductive thin film may be a single metal layer that includes but not limited to titanium. Alternatively, the thin conductive film may include an inner adhesion layer and an outer conductive layer that are deposited in the same deposition process. The outer conductive layer may be a material that resists surface oxidation and corrosions. Examples of the thin inner adhesion layer materials include but are not limited to titanium, titanium tungsten, and chrome. Examples of the outer conductive layer materials include but are not limited to gold, platinum, and molybdenum.

In an implementation, voltages of same or different magnitudes and same or different polarities are applied to the electrodes to form electric fields at through-hole openings to influence the passing charged particle beams.

In an implementation, the structural designs of the disclosed technology generate single-pole and multi-pole electric fields in radial and/or axial directions relative to the optical axis of the transmission paths of the charged particle beams.

In an implementation, multiple electrostatic devices can be stacked with their through-holes precisely aligned to the transmission paths of the charged particle beams to enable multiple and integrated charged particle beam influencing functionalities. Such integrated charged particle beam influencing functionalities include but are not limited to focusing, deflection, and compensation.

In an implementation, the pre-structured thin film deposition method can also be used to deposit either electrically conductive or electrically non-conductive thin film materials in other applications.

BRIEF DESCRIPTION OF THE DRAWINGS

FIG. 1 is a cross-sectional view schematic illustration of a triple-plate building block for making electrostatic devices.

FIGS. 6A-6B are isometric top and cross-sectional view schematic illustrations of the chip edge area with electrode contact pads of the electrostatic devices.

FIGS. 7A-7C illustrate a narrow-electrode configuration.

FIGS. 14A-14L are cross-sectional view schematic illustrations of another device microfabrication process after its key microfabrication process steps corresponding to the flow diagram in FIG. 13.

DETAILED DESCRIPTION

Terminology

Figure 2A:
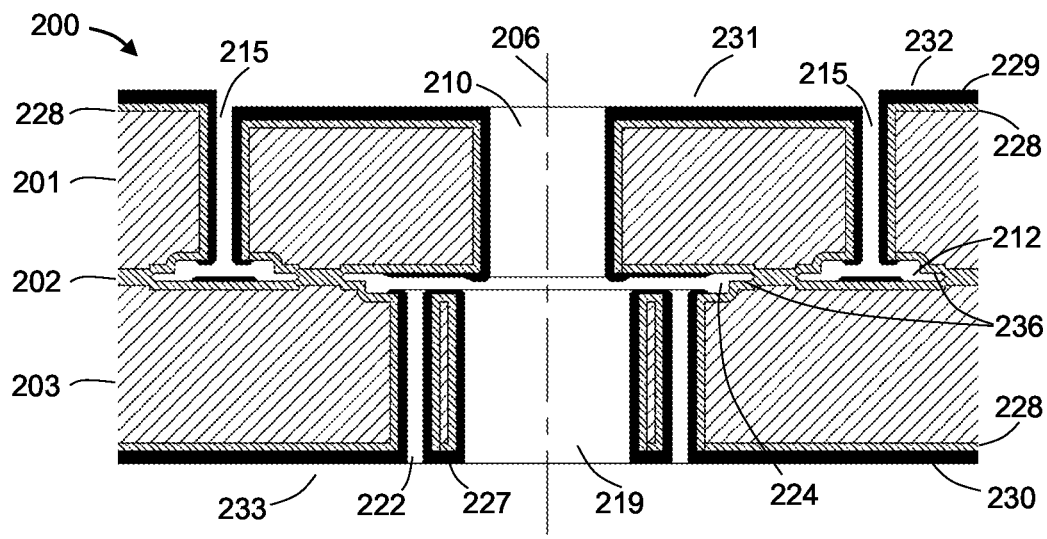
FIGS. 2A-2C are cross-sectional and isometric view schematic illustrations of a single-pole electrostatic device.

As used herein, the phrase "one of" should be interpreted to mean exactly one of the listed items. For example, the phrase "one of A, B, and C" should be interpreted to mean any of: only A, only B, or only C.

As used herein, the phrases "at least one of" and "one or more of" should be interpreted to mean one or more items. For example, the phrase "at least one of A, B, and C" or the phrase "at least one of A, B, or C" should be interpreted to mean any combination of A, B, and/or C.

Unless otherwise specified, the use of ordinal adjectives "first", "second", "third", etc., to describe an object, merely refers to different instances or classes of the object and does not imply any ranking or sequence.

The term "coupled" is used in an operational sense and is not limited to a direct or an indirect coupling. "Coupled to" is generally used in the sense of directly coupled, whereas "coupled with" is generally used in the sense of directly or indirectly coupled. "Coupled" in an electronic system may refer to a configuration that allows a flow of information, signals, data, or physical quantities such as electrons between two elements coupled to or coupled with each other. In some cases the flow may be unidirectional, in other cases the flow may be bidirectional or multidirectional. Coupling may be galvanic (in this context meaning that a direct electrical connection exists), capacitive, inductive, electromagnetic, optical, or through any other process allowed by physics.

The term "connected" is used to indicate a direct connection, such as electrical, optical, electromagnetical, or mechanical, between the things that are connected, without any intervening things or devices.

The term "configured to" perform a task or tasks is a broad recitation of structure generally meaning "having circuitry that" performs the task or tasks during operation. As such, the described item can be configured to perform the task even when the unit/circuit/component is not currently on or active. In general, the circuitry that forms the structure corresponding to "configured to" may include hardware circuits, and may further be controlled by switches, fuses, bond wires, metal masks, firmware, and/or software. Similarly, various items may be described as performing a task or tasks, for convenience in the description. Such descriptions should be interpreted as including the phrase "configured to." Reciting an item that is configured to perform one or more tasks is expressly intended not to invoke 35 U.S.C. 112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an implementation in which A is determined based solely on B. The phrase "based on" is thus synonymous with the phrase "based at least in part on."

The terms "substantially", "close", approximately", "near", and "about" refer to being within minus or plus 10% of an indicated value, unless explicitly specified otherwise.

Implementations describe electrostatic micro devices that can be used to influence an individual charged particle beam or multiple charged particle beams. Implementations of the disclosed technology also describe microfabrication methods that are used to make the micro devices. A person having ordinary skill in the art will readily recognize that the innovations herein can be applied in many ways. They may be implemented in any devices or systems that can be configured to generate electric fields in micro devices.

In various implementations, description is made with reference to figures. However, certain implementations may be practiced without one or more of these specific details, or in combination with other known methods and configurations. In the following description, numerous specific details are set forth, such as specific configurations, dimensions, and processes, etc., to provide a thorough understanding of the disclosed technology. In other instances, well-known semiconductor processes and manufacturing techniques have not been described in detail to avoid unnecessarily obscuring the disclosed technology. Reference throughout this specification to "one implementation", "an implementation" or the like means that a particular feature, structure, configuration, or characteristic described in connection with the implementation is included in at least one implementation of the technology. Thus, the appearances of the phrase "in one implementation," "an implementation" or the like in various places throughout this specification are not necessarily referring to the same implementation of the technology. Furthermore, the particular features, structures, configurations, or characteristics may be combined in any suitable manner in one or more implementations by anyone of ordinary skill in the art. Certain implementations may be practiced without one or more of these specific details, or in combination with other known methods and configurations. Accordingly, the following implementations of the technology are set forth without any loss of generality to, and without imposing limitations upon, the claimed technologies.

In the description of the technology, the X, Y and Z axes form a Cartesian coordinate system. The optical axis that charged particles primarily travel on is the Z-axis. The terms "radial", "horizontal", and "lateral" planes or directions refer to planes or directions that are perpendicular to the Z-axis. A "vertical" plane or direction is parallel to the Z-axis.

In the description of the technology, prepositions such as "top", "bottom", "on", "above" "below", "over", and "under" are used in relation to the conventional plane or surface of a device, wafer, or substrate, regardless of the propagation directions of charge particle beams.

The drawings herein are not necessarily to scale. Relative dimensions of each component and among components may be exaggerated for clarity, instead generally placing emphasis upon illustrating the principles and innovative features of the disclosed technology. For sake of clarity, only portions of a device, especially of a device for influencing a large array of charged particle beams, are shown in the drawings.

Implementations

As shown in FIG. 1, a triple-plate structure 100 might be used as a building block in the formation of the electrostatic micro devices. The triple-plate structure 100 comprises a top electrically conductive plate 101, a middle electrically insulating plate 102, and a bottom electrically conductive plate 103. The three plates support each other mechanically and form the concentric through-hole openings 104 for the passage of the charged particle beam. One or both conductive plates 101 and 102 have etched trenches 105 so that separated electrode and ground structures can be made within the plate. The plate thickness may be less than 1 mm and the through-hole diameter may be less than 0.5 mm. When voltages are applied from edges of the device, the volumes and surfaces of the electrode and ground structures formed from the electrically conductive plates 101 and 103 are used to provide electrical conduction paths for generating electric fields at the charged particle beam path along through-hole openings 104. Thus, the electrode and ground structures formed from the two electrically conductive plates 101 and 103 may be referred to as volume-conductive electrodes and grounds.

In a volume-conductive electrode and ground structural design as shown in FIG. 1, when a first voltage is applied to the top conductive plate 101 and a second voltage is applied to the bottom conductive plate 103, an electrostatic field is generated between the two conductive plates to influence the charged particle beam along the through-hole openings 104. Simultaneously, electric fields are also generated across the entire middle insulating plate 102, the exposed dielectric surfaces 106 of the middle insulating plate at the through-hole openings, and the exposed edge surfaces 107 of the devices. The conventional volume-conductive triple-plate structure shown in FIG. 1 has few limitations to provide stable electric fields, reduce charge trapping, reduce electrical discharging, and miniaturize multipole and multi-beam devices.

The middle insulating plate 102 may be thicker than 100 μm, which may be comparable to the diameters of the through-hole openings in the three plates. As an example, if the middle insulating layer 102 is 150 μm thick and its opening diameter is 150 μm, the exposed dielectric sidewall surface is larger than 70,000 μm$^2$. As a result, charges from the passing charged particle beams, floating charges from the vacuum space, and charges induced by the applied voltages, can be trapped, and accumulated at the exposed dielectric surface of the middle insulating layer. The number of trapped charges depends on many factors including the surface properties of the exposed dielectric material, intensity and spread of the charged particle beams, and applied voltages. Therefore, the number of trapped charges may vary based on time and location, even when a constant voltage is applied between the two conductive plates. As a result, the varying electric field generated by the trapped charges may randomly affect the charged particle beam control. It is then desirable to reduce the trapped charges by reducing the dielectric surface areas along the paths of charged particle beams, and by reducing the dielectric surface areas that are exposed to the floating space charges.

The middle insulating plate 102 may be relatively thick, such as in a range from 100 to 200 μm. And the through-hole opening diameter of the middle insulating plate 102 may be different than the opening diameters of the conductive plates 101 and 103. From the perspective of the microfabrication process, such through-hole opening in the thick insulating plate is difficult to make if the three plates are bonded together before the through-hole in the insulating plate is made. Due to the limitations of available microfabrication processes in making a straight sidewall through holes in a thick insulating plate, the through-holes in the middle insulating plate 102 may be etched or drilled before the three plates are bonded. With this fabrication process, not only does the bonding of the three plates require precision alignment, but its bonding process is likely to introduce small void defects and particle defects at the bonding interfaces among the three plates. When a high voltage is applied between the conductive plate 101 and 103, strong electric fields are generated at the interface of the conductive plate and the insulating plate, and electrical discharges and breakdowns are likely to occur at the void and particle defects of the interfaces.

A thin middle insulating plate, such as a few microns or less, may allow the forming of the through holes after the three plates are bonded. A thin insulating plate also reduces the exposed dielectric surfaces in the charged particle beam path, therefore reducing the number of trapped charges on the exposed dielectric surfaces. However, a short path on an exposed surface of the insulating plate may result in higher possibilities of an electrical discharge at the exposed dielectric surfaces, especially when an electric field larger than 10 V/μm is applied. The minimum electric field for an electrical discharge to occur on the exposed dielectric surface of a thin middle insulating plate may be affected by the insulating layer's thickness, surface properties, and surface cleanness. As an example, a small particle or protrusion defect on the dielectric surface may cause an electrical discharge at or near the exposed surfaces of the middle insulating plate. In addition, when the middle insulating layer is thin, such as 10 μm or less, the two conductive plates are contacted and separated by the thin insulating layer over a large area. Any defects in the thin insulating layer in the large overlap area may cause permanent electric breakdown of the thin insulating layer at the defect point, which is a major failure mode when using a thin insulating layer over a large interface area. The size and density of such defects in the thin insulating layer and at its surfaces are highly dependent on how the thin insulating layer is made and how the layers are assembled in the fabrication process.

One might attempt to use a thick insulating plate 102, such as 100 μm thick, while partially covering its large exposed dielectric surface 106 with a thin electrically conductive layer. Physical vapor deposition (PVD) methods, such as sputtering, may be used to deposit thin metal layers on the sidewalls of microstructures. However, a gap of the coated metal layers on the sidewall of the exposed dielectric surface 106 needs to be created so that conductive layers 101 and 102 are electrically separated. Patterning and etching of thin metal layers on the sidewalls of high-aspect ratio microstructures have been a microfabrication challenge. Photolithography patterning methods used in IC microfabrication are generally not suitable as they are intended to be applied on relatively flat top surfaces. Moreover, any attempts to pattern and etch thin metal layers on sidewall surfaces of high-aspect ratio microstructures is likely to introduce particles from the patterning and etching processes. These fabrication-process-introduced particles are difficult to remove from inside high-aspect ratio microstructures using common wafer cleaning methods in the IC microfabrication. As a result, particle and surface defects from the sidewall metal patterning and etching processes may cause a high possibility of electrical discharges when strong electric fields are applied to the electrostatic devices.

The disclosed technology provides designs and manufacturing methods of surface-conductive electrostatic devices for making high-yield, high-performance, and high-reliability devices for influencing multiple charged particle beams, especially for large arrays of multipole electrode devices. The surface-conductive electrode and ground design referred to uses electrically conductive thin-layers deposited on electrically insulating surfaces to provide electrical conduction paths for generating electric fields at the charged particle beam paths. The thickness of the deposited electrically conductive thin-layers in the surface-conductive structural design may be much thinner than the electrically conductive plates 101 and 103 shown in FIG. 1.

Figure 2B:
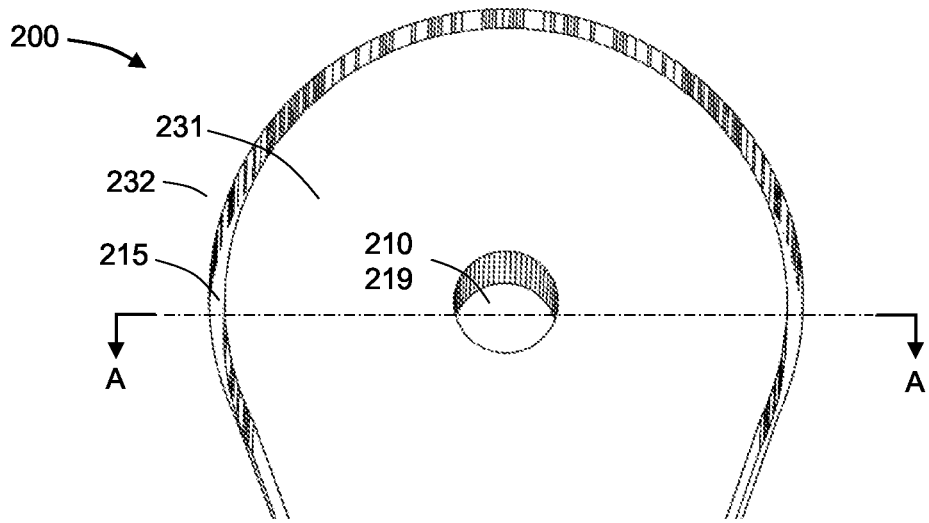
Figure 2C:
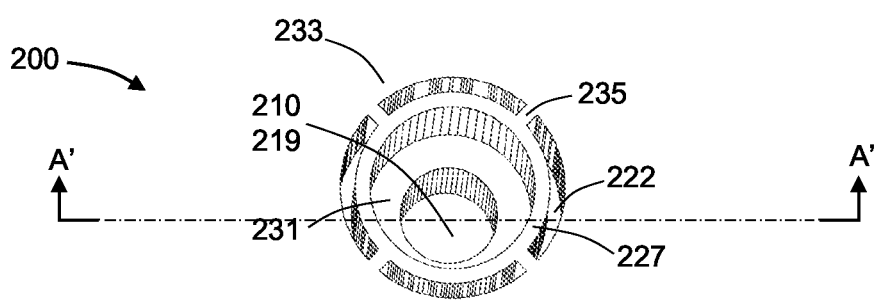

FIGS. 2A-2C illustrate a section along one charged particle beam path of a multiple-beam single-pole electrostatic device of the disclosed technology. FIG. 2A is a cross-sectional view schematic illustration of the device with its isometric top illustrated in FIG. 2B and isometric bottom view schematic illustration shown in FIG. 2C. The cross-sectional illustration shown in FIG. 2A is along section A-A of FIG. 2B and along section A'-A' of FIG. 2C. The device 200 comprises at least three inner structural layers. They are a first silicon layer 201, a second silicon layer 203, and a buried silicon dioxide layer 202 disposed between the first and the second silicon layers. The first silicon layer is also referred to as the top silicon layer and the second silicon layer is also referred to as the bottom silicon layer. The device 200 further comprises at least two outer layers. They are an encapsulating insulating layer 228, conductive layer 229, and conductive layer 230. The electrostatic device 200 is shown as a single-pole device with a charged particle beam path 206 as indicated in FIG. 2A. The beam path 206 is formed by a circular opening 210 of the top annular electrode 231 and a larger circular opening 219 of the bottom ground layer 233. The two circular openings 210 and 219 are concentrically aligned and together they form the through-hole opening for beam path 206. The diameter of 219 is larger than the diameter of 210 so that the annular electrode 231 is made overhanging on the opening 219. The diameter of 210 may be in the range of from 10 μm to 1000 μm, for example in the range of from 50 μm to 250 μm. The diameter of 219 may be in the range of from 10 μm to 1000 μm, for example larger than the diameter of 210. There is also a ground structure 232 in the top silicon layer that is physically and electrically separated from the electrode 231 with a surrounding micro-trench 215 in the top silicon layer. At the bottom of each micro-trench 215 there is a surrounding micro-undercut 212 around each electrode and ground structure. The micro-undercuts 212 are only shown in FIG. 2A and they are hidden and are not shown in FIG. 2B and FIG. 2C. There is also a micro-fence structure 227 in the bottom silicon layer with its cross-sectional view schematic illustration shown in FIG. 2A and its bottom view schematic illustration shown in FIG. 2C. The micro-fence 227 forms micro-trench 222 in the bottom silicon layer and there is a surrounding micro-undercut 224 formed at the bottoms of the micro-trench 222. Here, the bottom of the micro-trench 222 refers to the location that the micro-trench silicon etching ends. With the forming of micro-undercut 224, the micro-fence 227 is made overhanging with overhanging micro-bridges 235 connecting it to the backside ground layer 233. A thermally grown silicon dioxide layer 228 encapsulates all the silicon surfaces. The conductive layers 229 and 230 cover all the exposed silicon dioxide surfaces of the devices except the hidden inner surfaces 236 of the micro-undercuts 212 and 224. The conductive layer 229 is deposited from the top side and the conductive layer 230 is deposited from the backside of the device.

When a voltage is applied between electrode 231 and ground 232 and 233, an electric field is generated at the through-hole openings 210 and 219 along the charged particle beam path 206. The applied voltage controls the strength of the electric field to influence the charged particle beam. Thus, device 200 shown in FIGS. 2A-2C can be used as an electrostatic micro-lens or a micro-lens element of a micro-lens array for focusing multi-beam charged particle beams with individually controlled voltages.

As shown in FIG. 2A, each electrode and the ground structure of electrostatic device 200 includes a silicon layer 201, a buried silicon dioxide layer 202, a bottom silicon layer 203, an encapsulated insulating layer 228, and outer conductive layers 229 and 230. The electrostatic device 200 may be made from a silicon wafer with at least two thick silicon layers and a thin silicon dioxide layer buried in between. The thicknesses of the silicon layers 201 and 203 may be in the range of 10 μm to 1000 μm, for example in the range of 100 μm to 500 μm. The thickness of the buried silicon dioxide layer 202 may be in the range of 0.1 μm to 10 μm, for example in the range of 0.5 μm to 5 μm.

As shown in FIG. 2A and FIG. 2B, narrow and straight-sidewall micro-trenches 215 and 222 are etched into the silicon layers. The bottoms of the micro-trenches, where the silicon etching ends, are at the surfaces of the buried silicon dioxide. As a result, a silicon layer, such as the top silicon layer, is segmented into silicon islands that sit on top of the buried silicon dioxide layer. Both the top and the bottom silicon layers may be segmented into silicon islands if the micro-trenches in the top silicon layer do not overlap with the micro-trenches in the bottom silicon layer. The silicon islands in the top silicon layer and silicon islands in the bottom silicon layer are mutually supported. The depths of the micro-trenches are equivalent to the thickness of the silicon layers. The widths of the micro-trenches may be in the range of 1 μm to 100 μm, for example in the range of 3 μm to 30 μm. The width of a micro-trench may also be less than the depths of the micro-trenches. The micro-trenches in the same silicon layer may share a same width or similar widths. The silicon islands are elongated shapes with one end of each island forming the structure of the annular electrode and the circular opening for the charged beam path. Each elongated silicon island also forms the structure of the electrode routing with another end extended to the device edge area for making electrical contacts.

As shown in FIG. 2A, each elongated silicon island in the top silicon layer is also fully surrounded by a micro-undercut 212 along the bottom of the micro-trench surrounding the elongated silicon island. The micro-undercuts undercut the corresponding elongated silicon islands at their interfaces with the buried silicon dioxide layer. The micro-undercut may be formed by selectively etching the silicon at the bottom portion of the silicon islands or controlled etching of the buried silicon dioxide layer from the bottom edge of the silicon islands. The micro-undercuts may be enlarged by repeated cycles of thermal oxidation of the silicon layer and removal of the grown silicon dioxide layer by etching with hydrofluoric acid in liquid or vapor phases.

The openings of the micro-undercuts 212 are at the bottom sidewalls of the micro-trenches 215. The opening sizes of the micro-undercuts are less than the widths of the micro-trenches. The depth of each micro-undercut is no less than the opening size of the micro-undercut. For example, the micro-undercut may be 5 μm high and m deep. As a result, a large hidden surface area is created by forming the micro-undercut in the confined space at the bottom of a micro-trench. And the hidden surface areas in the micro-undercuts are used to enable the pre-structured thin conductive layer deposition process. The opening height of a micro-undercut may be in the range of 1 μm and 25 μm. The depth of a micro-undercut may be in the range of 2 μm and 50 μm.

As shown in FIG. 2A and FIG. 2C, a thin-wall silicon micro-fence 227 may be formed along the periphery of a large opening 219 of a silicon layer by etching a micro-trench 222. Each thin-wall micro-fence is overhanging and held in place by overhanging micro-bridges 235 over the peripheral micro-trench 222 and connects to the silicon structure 233. There is also a surrounding micro-undercut 224 formed at the bottom of the silicon structure and the micro-trench 222. The width of the micro-fence and the micro-bridges may be in the range of 2 μm to 20 μm. The surrounding micro-undercut 224 formed at the bottom of the micro-trench and the overhanging space of the micro-fence creates a large hidden surface area in the confined space at the bottom of the large opening 219.

As shown in FIG. 2A, all the surfaces of the silicon structures, including the hidden silicon surfaces inside the micro-undercuts and edge silicon surfaces of the devices, are fully encapsulated by a thin electrically insulating layer 228, for example a thermally grown silicon dioxide layer. The silicon thermal oxidation process is performed at a temperature range from 800° C. to 1200° C., for example at around 1100° C., and it may be performed at chip level to ensure the silicon surfaces on chip edges are also encapsulated by the silicon dioxide layer. The silicon surface coverage by the insulating layer 228 is conformal. In other words, the coverage of thermally grown silicon dioxide layer 228 conforms to the contours of all the silicon micro-structures. FIG. 2A only shows a portion of the electrostatic device without showing the chip edges. The thin, thermally grown silicon dioxide layer is a good electrical insulator with a resistivity larger than $10^{10}\Omega$-μm and dielectric strength of $10^3$V/μm. The thickness of this silicon dioxide encapsulation layer may be in the range of 0.1 μm to 10 μm, for example in the range of 0.5 μm to 2 μm. Because the silicon dioxide layer is thermally grown from silicon surfaces at elevated temperatures, it guarantees void-free and defect free coverage to all the silicon surfaces including the sidewall surfaces of the through-hole openings, the silicon surfaces of micro-trenches, and the silicon surfaces in the hidden spaces of micro-undercuts. The conformal dielectric layer that fully encapsulates the silicon surfaces may be deposited by other suitable techniques such as, but not limited to, thermal-assist atomic layer deposition (ALD) or plasma-assist ALD.

As shown in FIG. 2A, thin electrically conductive layers 229 and 230 cover selected surfaces of the insulating layer-encapsulated electrode and ground islands from both sides of the device 200. Unlike the insulating layer 228, the deposition of the conductive layers 229 and 230 are not conformal. The conductive layer-coated insulating layer surfaces include the top and the bottom surfaces of the device, the sidewall surfaces of the top opening 210 and the bottom opening 219, and the sidewall surfaces of the micro-trenches 215 and 222. Depending on the thickness and deposition methods, the deposited conductive layer may or may not reach the surfaces at the bottom portion of the micro-trenches 215 and 222. The deposited electrically conductive layer does not reach the surfaces 236 in the hidden space of micro-undercuts 212 and 224. Not only do the conductive layers 229 and 230 have discontinuities on the surface 236 in the hidden spaces of the micro-undercuts 212 and 224, but their thicknesses also vary across different surfaces. More specifically, the thicknesses of conductive layers 229 and 230 on the sidewall surfaces of microstructures are less than on the top and the bottom surfaces. The electrically conductive layer provides at least two functions in implementations of the disclosed technology. One function is to cover the exposed dielectric surfaces to prevent charge trapping. More specifically, the top and the bottom surfaces of the device are coated by the thin conductive layers 229 and 230 to avoid trapping space charges from the vacuum space. The sidewall surfaces of the top opening 210 and the bottom opening 219 are also coated with the thin electrically conductive layers 229 and 230 to avoid trapping charges coming from the vacuum space and the charged particle beams. The second function of the conductive layers 229 and 230 is to provide surface-conductive paths so that electric fields can be applied around the through-hole openings to influence the charged particle beams. To do so, the conductive layers 229 and 230 that are deposited from blanket deposition processes are made discontinuous physically and electrically on the surfaces 236 in the hidden spaces of the micro-undercuts 212 and 224 as shown in FIG. 2A. The discontinuities of the conductive layers 229 and 230 are made possible by the built-in shadow masking effects from the surrounding micro-trenches, micro-undercuts, micro-fences, micro-bridges, and other overhanging microstructures of the disclosed technology. As a result, the surface-conductive electrode and ground islands are pre-structured with blanket conductive layer depositions, avoiding post-deposition aligned photolithography and etching processing steps. The conductive thin film may be deposited from both the top and bottom sides by sputtering deposition processes or combined sputtering deposition and evaporation deposition processes. The conductive thin film may have a single metal layer that includes but is not limited to titanium. The thickness of the single metal film may be in the range of 0.1 µm to 0.5 µm. Alternatively, the thin conductive film may include an inner adhesion layer and an outer conductive layer that are deposited in the same deposition process. The outer conductive layer may be a material that resists surface oxidation and corrosions. Examples of the thin inner adhesion layer materials include but are not limited to titanium, titanium tungsten, and chrome. Examples of the outer conductive layer materials include but are not limited to gold, platinum, and molybdenum. The thickness of the inner adhesion layer may be in the range of 0.01 µm to 0.05 µm. The thickness of outer metal layer may be in the range of 0.1 µm to 0.5 µm. This pre-structured conductive layer deposition method of the disclosed technology is essential in providing advantageous reliable electrostatic devices and are further explained in the flowing fabrication process description.

The surface-conductive electrode design and fabrication method are advantageous compared to the volume-conductive electrode design and fabrication method. The volume conductive structure is shown in FIG. 1, where two electrically conductive plates 101 and 103 are volume conductive, and they are separated by an insulating plate 102. A volume-conductive structure refers to both the bulk and surfaces of plate 101 and 103 being electrically conductive. When the insulating plate 102 is made thick, such as 50 µm to 200 µm, the large and exposed dielectric surface 106 along the charged particle beam paths may have charge trapping effects. If the insulating plate 102 is made thin, such as a couple of microns or less, the high voltages are directly applied across the thin insulating plate 102 in its large buried-interfaces and small exposed-surface areas. As a result, electrical discharges and breakdowns, through the thin insulating plate and at its exposed surfaces, are likely to occur at defects inside or at surfaces of the thin insulating layer. The electrical discharges and breakdowns at the defect sites of the thin insulating layer and its exposed surfaces are the major failure mechanisms of such electrostatic devices. In comparison, both the electrode 231 and ground islands 232 and 233 as shown in FIG. 2A are made surface conductive. A surface-conductive structure refers to placing a thin encapsulating electrically insulating layer 228 under the electrically conductive layers 229 and 230. The applied voltages are conducted through the surface-conductive layers 229 and 230 for generating electric fields to influence the charged particle beams. In other words, the electric field across the thin and buried insulating layer 202 is much smaller with the encapsulating insulating layer 228 than without it. In FIG. 2A, the buried insulating layer 202 is made thin, such as a couple of microns or less. The formation of the micro-undercut significantly enlarges the exposed areas of the dielectric surfaces 236 in the hidden space of the micro-undercuts 212 and 224. For example, if the buried insulating layer 202 is 1 µm thick and the micro-undercut is 5 µm high and 15 µm deep, the dielectric surface length between the two adjacent conductive layers is at least increased to 35 µm. As a result, the electric field along the dielectric surface is reduced by 35 times. In the meantime, the potential electrical discharges and breakdowns across the buried insulating layer 202 is also significantly reduced due to the much weaker electric field across the buried insulating layer 202. The dielectric surface enlargement in the confined hidden space of the micro-undercut will become more apparent in the following micro-undercut fabrication process descriptions. The dielectric surface 236 in the micro-undercut may be formed by thermally grown silicon dioxide, which has better surface dielectric strength and surface cleanness than many other deposited dielectric surfaces. Furthermore, the disclosed technology utilizes overhanging electrode structures to further reduce the chances of electrical discharge on exposed dielectric surfaces. More specifically, the electrodes 231 in FIG. 2A are made overhanging over the bottom opening 219 and there is a gap between each electrode 231 and the structures of the bottom silicon layer at the bottom opening 219. In addition, the electrode and ground routings in dense areas are also made overhanging with supporting anchors. This overhanging routing structures are not shown in FIG. 2A but are shown in following descriptions. In the electrode overhanging locations, the use of gaps to replace exposed dielectric surfaces between electrodes and grounds significantly reduces the chances of electrical discharges and breakdowns in vacuum.

As shown in FIGS. 2A and 2B, there are surrounding grounds 232 around the electrode islands 231 on the same silicon layer. The surrounding grounds provide electrical shielding to reduce crosstalk between adjacent electrodes in a multiple electrostatic lens array. The detailed layout of the ground structure will become apparent in the following descriptions of a 3×3 array of electrostatic lens. Furthermore, there is a vertical recess of the electrodes 231 relative to the adjacent grounds 232. The depth of the recess is equivalent to the width of the micro-trench, for example in the range of 5 μm to 30 μm. The purpose of this electrode vertical recess is to provide a gap when two or more electrostatic devices are stacked on one another. With the recess, a gap in vacuum is created between the two stacked chips in the vacuum apparatus. The gap in vacuum not only reduces the chances of electrical discharges but also provides electrical shielding by stacking a ground surface of a top chip on top of an electrode surface of a bottom chip. As a result, each electrode can be shielded laterally and vertically for crosstalk elimination in a multi-beam electrostatic device.

Figure 3A:
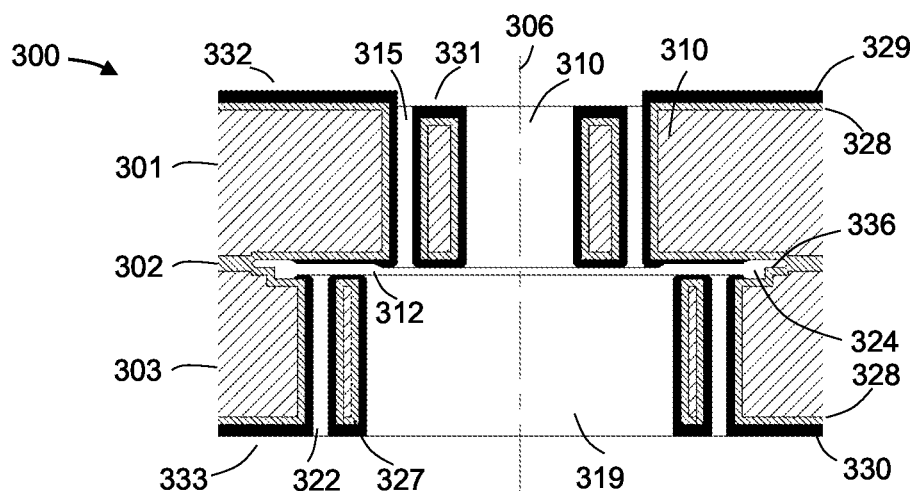
FIGS. 3A-3C are cross-sectional and isometric view schematic illustrations of an octupole electrostatic device.
Figure 3B:
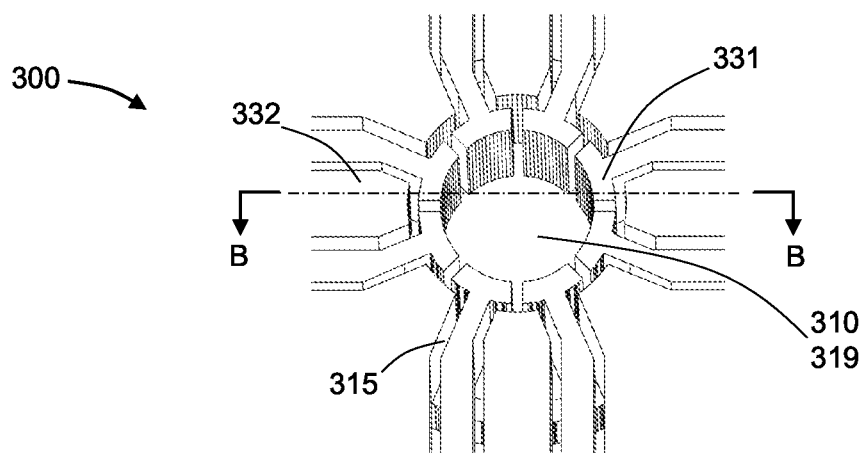
Figure 3C:
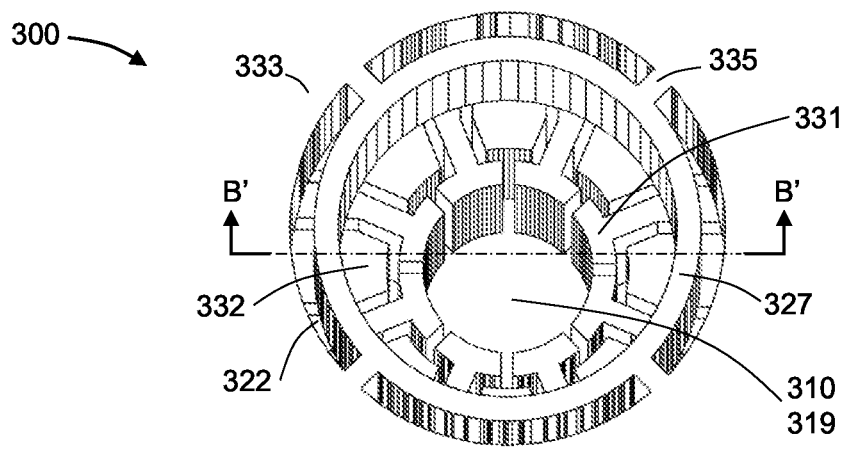

FIGS. 3A-3C illustrate a section along one charged particle beam path of a multiple-beam and octupole electrostatic device. FIG. 3A is the cross-sectional view schematic illustration of the device with its isometric top illustrated in FIG. 3B and isometric bottom view schematic illustration shown illustrated in FIG. 3C. The cross-sectional illustration shown in FIG. 3A is along section B-B of FIG. 3B and along section B'-B' of FIG. 3C. The device 300 comprises at least three inner structural layers. They are a first silicon layer 301, a second silicon layer 303, and a buried silicon dioxide layer 302 disposed between the first and the second silicon layers. The first silicon layer is also referred to as the top silicon layer and the second silicon layer is referred to as the bottom silicon layer. The device 300 further comprises outer layers. These may include an encapsulating insulating layer 328, conductive layer 329 deposited from the top, and conductive layer 330 deposited from the bottom. The electrostatic device 300 is shown as an octuple-pole device with a charged particle beam path 306 as indicated in FIG. 3A. The top circular opening 310 for beam path 306 is formed by eight concentric arc-shaped overhanging electrodes 331. The larger bottom circular opening 319 is made through the bottom ground layer 333. The two circular openings 310 and 319 are concentrically aligned and together they form the through-hole opening for beam path 306. The diameter of 319 is larger than the diameter of 310 so that the arc-shaped electrodes 331 are made overhanging on the bottom opening 319. The diameter of 310 may be in the range of 10 μm to 1000 μm, for example in the range of 50 μm to 250 μm. The diameter of 319 may be in the range of 10 μm to 1000 m, and may be larger than the diameter of 310. There are also ground structures 332 in the top layer, and they physically and electrically separate the adjacent electrodes 331 with surrounding micro-trenches 315. At the bottom of each micro-trench 315 there is a surrounding micro-undercut 312 around each electrode and ground structures. The micro-undercuts 312 are shown in FIG. 3A but they merge with the backside opening 319. The micro-undercuts 312 are hidden and are not shown in FIG. 3B and FIG. 3C. There is also a micro-fence structure 327 with its cross-sectional view schematic illustration shown in FIG. 3A and the bottom view schematic illustration shown in FIG. 3C. The micro-fence 327 forms micro-trench 322 in the bottom silicon layer 303. There is a surrounding micro-undercut 324 at the bottom of the micro-trench 322. Here, the bottom of the micro-trench 322 refers to the location that the micro-trench silicon etching ends. With the forming of micro-undercut 324, the micro-fence 327 is made overhanging with overhanging micro-bridges 335 connecting it to the backside ground layer 330. A thermally grown silicon dioxide layer 328 encapsulates all the silicon surfaces. The conductive layers 329 and 330 cover all the exposed silicon dioxide surfaces of the devices except the hidden inner surfaces 336 of the micro-undercuts 312 and 324. The conductive layer 329 is deposited from the top and the conductive layer 330 is deposited from the bottom of the device.

The multipole electrostatic devices of the disclosed technology include but are not limited to the octupole electrode configuration shown in FIGS. 3A-3C. Electrodes with other numbers of poles, such as dipole, quadrupole, or higher numbers than octupole electrodes with the example implementation are also considered part of the disclosed technology. When a common voltage is applied to all arc-shaped electrodes 331 relative to ground 332 and 333, the octupole electrostatic device 300 works as an electrostatic micro-lens for focusing the charged particle beam 306. When the arc-shaped electrodes 331 are configured to have different or independent voltages applied, electric fields in planes perpendicular or at angles to the optical axis of beam path 306 can be generated. Such electric fields can be used for deflecting or bending the charged particle beam 306. In such multipole configurations, the electrostatic device 300 can be configured and used as an electrostatic micro-deflector, a micro-stigmator, or a micro-compensator for beam aberration compensation of a multibeam system.

As shown in FIG. 3A, each electrode and ground structure of electrostatic device 300 includes a silicon layer 301, a buried silicon dioxide layer 302, a bottom silicon layer 303, an encapsulated insulating layer 328, and outer conductive layers 329 and 330. The electrostatic device 300 may be made from a silicon wafer with at least two thick silicon layers and a thin silicon dioxide layer buried in between. The thicknesses of the silicon layers may be in the range of 10 μm to 1000 μm, for example a range from 100 μm to 500 μm. The thickness of the buried silicon dioxide layer may be in the range of 0.1 μm to 10 μm, for example a range from 0.5 μm to 5 μm.

As shown in FIG. 3A and FIG. 3B, narrow and straight-sidewall micro-trenches 315 and 322 are etched into the silicon layers. The bottoms of the micro-trenches, where the silicon etching ends, reach the buried silicon dioxide area. As a result, a silicon layer, such as the top silicon layer, is segmented into silicon islands that sit on top of the buried silicon dioxide layer. Both the top and the bottom silicon layers may be segmented into silicon islands if the micro-trenches in the top silicon layer do not overlap with the micro-trenches in the bottom silicon layer. The silicon islands in the top silicon layer and silicon islands in the bottom silicon layer are mutually supported. The depths of the micro-trenches are equivalent to the thickness of the silicon layers. The widths of the micro-trenches may be in the range of 1 μm to 100 μm, for example in the range of 3 μm to 30 μm. The width of a micro-trench may also be less than the depths of the micro-trenches. The micro-trenches in the same silicon layer may share the same width or similar widths. The silicon islands are in elongated shapes with one end of each island forming the structure of the arc-shaped electrode at the circular opening for the charged beam path. The elongated silicon island also forms the structure of the electrode routing with another end extended to the device edge area for making electrical contacts.

As shown in FIG. 3A, each elongated silicon island in the top silicon layer is also fully surrounded by a micro-undercut 312 along the bottom of the micro-trench surrounding the elongated silicon island. The micro-undercuts undercut the corresponding elongated silicon islands at their interfaces with the buried silicon dioxide layer. The micro-undercut can be formed by selectively etching the silicon at the bottom portion of the silicon islands or controlled etching of the buried silicon dioxide layer from the bottom edge of the silicon islands. The micro-undercuts may be enlarged by repeated cycles of thermal oxidation of the silicon layer and removal of the grown silicon dioxide layer by etching with hydrofluoric acid in liquid or vapor phases. The openings of the micro-undercuts 312 are at the bottom sidewalls of the micro-trenches 315. The opening sizes of the micro-undercuts are less than the widths of the micro-trenches. The depth of each micro-undercut is no less than the opening size of the micro-undercut. For example, the micro-undercut may be 5 µm high and m deep. As a result, a large hidden surface area is created by forming the micro-undercut in the confined space at the bottom of a micro-trench. And the hidden surface areas in the micro-undercuts are used to enable the pre-structured thin conductive layer deposition process. The opening height of a micro-undercut may be in the range of 1 µm and 25 µm. The depth of a micro-undercut may be in the range of 2 µm and 50 µm.

As shown in FIG. 3A and FIG. 3C, a thin-wall silicon micro-fence 327 may be formed along the periphery of a large opening 319 of a silicon layer by etching micro-trenches. Each thin-wall micro-fence is overhanging and held in place by overhanging micro-bridges 335 over the peripheral micro-trench and connects to the silicon structure 333. There is also a surrounding micro-undercut 324 formed at the bottom of the silicon structure and the micro-trench 322. The width of the micro-fence and the micro-bridges may be in the range of 2 µm to 20 µm. The surrounding micro-undercut 322 formed at the bottom of the micro-trench and the overhanging space of the micro-fence create a large hidden surface area in the confined space at the bottom of the large opening 319.

As shown in FIG. 3A, all the surfaces of the silicon structures, including the hidden silicon surfaces inside the micro-undercuts and edge silicon surfaces of the devices, are fully encapsulated by a thin electrically insulating layer 328, for example a thermally grown silicon dioxide layer. The silicon thermal oxidation process is performed at a temperature range from 800° C. to 1200° C., for example at around 1100° C., and it may be performed at chip level to ensure the silicon surfaces on chip edges are also encapsulated by the silicon dioxide layer. The silicon surface coverage by the insulating layer 328 is conformal. In other words, the coverage of thermally grown silicon dioxide layer 328 conforms to the contours of all the silicon micro-structures. FIG. 3A only shows a portion of the electrostatic device without showing the chip edges. The thin, thermally grown silicon dioxide layer is a good electrical insulator with a resistivity larger than $10^{10}\Omega$-µm and dielectric strength of $10^3$V/µm. The thickness of this silicon dioxide encapsulation layer may be in the range of 0.1 µm to 10 µm, for example ranging from 0.5 µm to 2 µm. Because the silicon dioxide layer is thermally grown from silicon surfaces at elevated temperatures, it guarantees void-free and defect free coverage to all the silicon surfaces including the sidewall surfaces of the through-hole openings, the silicon surfaces of micro-trenches and the silicon surfaces in the hidden spaces of micro-undercuts. The conformal dielectric layer that fully encapsulates the silicon surfaces may be deposited by other suitable techniques such as, but not limited to, thermal-assist atomic layer deposition (ALD) or plasma-assist ALD.

As shown in FIG. 3A, thin electrically conductive layers 329 and 330 cover selected surfaces of the insulating layer-encapsulated electrode and ground islands on both sides of the device 300. Unlike the insulating layer 328, the depositions of the conductive layers 329 and 330 are not conformal. The conductive layer-coated insulating layer surfaces include the top and the bottom surfaces of the device, the sidewall surfaces of the top opening 310 and the bottom opening 319, and the sidewall surfaces of the micro-trenches 315 and 322. Depending on the thickness and deposition methods, the deposited conductive layer may or may not reach the surfaces at the bottom portion of the micro-trenches 315 and 322. The deposited electrically conductive layer does not reach the surfaces 336 in the hidden space of micro-undercuts 312 and 324. Not only do the conductive layers 329 and 330 have discontinuities on the surface 336 in the hidden spaces of the micro-undercuts 312 and 324, but their thicknesses also vary across different surfaces. More specifically, the thicknesses of conductive layers 329 and 330 on the sidewall surfaces of microstructures are thinner than on the top and the bottom surfaces. The electrically conductive layer provides at least two functions. One function is to cover the exposed dielectric surfaces to prevent charge trapping. More specifically, the top and the bottom surfaces of the device are coated by the thin conductive layers 329 and 330 to avoid trapping of space charge from the vacuum space. The sidewall surfaces of the top opening 310 and the bottom opening 319 are also coated with the thin electrically conductive layers 329 and 330 to avoid trapping charges coming from the vacuum space and the charged particle beams. The second function of the conductive layers 329 and 330 is to provide surface-conductive paths so that electric fields can be applied around the through-hole openings to influence the charged particle beams. To do so, the conductive layers 329 and 330 that are deposited from blanket deposition processes are made discontinuous physically and electrically on the surfaces 336 in the hidden spaces of the micro-undercuts 312 and 324 as shown in FIG. 3A. The discontinuities of the conductive layers 329 and 330 are made possible by the built-in shadow masking effects from the surrounding micro-trenches, micro-undercuts, micro-fences, micro-bridges, and other overhanging micro-structures. As a result, the surface-conductive electrode and ground islands are pre-structured with blanket conductive layer depositions, avoiding post-deposition aligned photolithography and etching processing steps. The conductive thin film may be deposited from both the top and bottom by sputtering deposition processes or combined sputtering deposition and evaporation deposition processes. The conductive thin film may have a single metal layer that may include but is not limited to titanium. The thickness of the single metal film may be in the range of 0.1 µm to 0.5 µm. Alternatively, the thin conductive film may include an inner adhesion layer and an outer conductive layer that are deposited in the same deposition process. The outer conductive layer may be a material that resists surface oxidation and corrosions. Examples of the thin inner adhesion layer materials include but are not limited to titanium, titanium tungsten, and chrome. Examples of the outer conductive layer materials include but are not limited to gold, platinum, and molybdenum. The thickness of the inner adhesion layer may be in the range of 0.01 µm to 0.05 µm. The thickness of outer metal layer may be in the range of 0.1 µm to 0.5 µm. This pre-structured conductive layer deposition method is essential in providing advantageous reliable electrostatic devices and it is further explained in the following fabrication process description.

The surface-conductive electrode design and fabrication method are advantageous compared to the volume-conductive electrode design and fabrication method. The volume conductive structure is shown in FIG. 1, two electrically conductive plate 101 and 103 are volume conductive and they are separated by an insulating plate 102. A volume-conductive structure refers to both the bulk and surfaces of plate 101 and 103 being electrically conductive. When the insulating plate 102 is made thick, such as 50 μm to 200 μm, the large and exposed dielectric surface 106 along the charged particle beam paths may have charge trapping effects. If the insulating plate 102 is made thin, such as a couple of microns or less, the high voltages are directly applied across the thin insulating plate 102 in its large buried-interfaces and small exposed-surface areas. As a result, electrical discharges and breakdowns, through the thin insulating plate and at its exposed surfaces, are likely to occur at defects inside or at surfaces of the thin insulating layer. The electrical discharges and breakdowns at the defect sites of the thin insulating layer and its exposed surfaces are the major failure mechanisms of such electrostatic devices. In comparison, both the electrode 331 and ground islands 332 and 333 as shown in FIG. 3A are made surface conductive. A surface-conductive structure refers to placing a thin encapsulating electrically insulating layer 328 under the electrically conductive layers 329 and 330. The applied voltages are conducted through the surface-conductive layers 329 and 330 for generating electric fields to influence the charged particle beams. In other words, the electric field across the thin and buried insulating layer 302 is much smaller with the encapsulating insulating layer 328 than without it. In FIG. 3A, the buried insulating layer 302 is made thin, such as a couple of microns or less. The formation of the micro-undercut significantly enlarges the exposed areas of the dielectric surfaces 336 in the hidden space of the micro-undercuts 312 and 324. For example, if the buried insulating layer 302 is 1 μm thick and the micro-undercut is 5 μm high and 15 μm deep, the dielectric surface length between the two adjacent conductive layers is at least increased to 35 μm. As a result, the electric field along the dielectric surface is reduced by 35 times. In the meantime, the potential electrical discharges and breakdowns across the buried insulating layer 302 is also significantly reduced due to the much weaker electric field across the buried insulating layer 302. The dielectric surface enlargement in the confined hidden space of the micro-undercut will become more apparent in the following micro-undercut fabrication process descriptions. The dielectric surface 336 in the micro-undercut may be formed by thermally grown silicon dioxide, which has better surface dielectric strength and surface cleanness than many other deposited dielectric surfaces. Furthermore, the overhanging electrode structures further reduce the chances of electrical discharge on exposed dielectric surfaces. More specifically, the electrodes 331 in FIG. 3A are made overhanging over the bottom opening 319 and there is a gap between each electrode 331 and the structures of the bottom silicon layer at the bottom opening 319. In addition, the electrode and ground routings in dense areas are also made overhanging with supporting anchors. This overhanging routing structural features are not shown in FIG. 3A but are shown in following descriptions. In the electrode overhanging locations, the use of gaps to replace exposed dielectric surfaces between electrodes and grounds significantly reduces the chances of electrical discharges and breakdowns when the devices are used in vacuum.

As shown in FIGS. 3B and 3C, there are elongated ground islands 332 between two adjacent elongated electrode islands 331. In other words, each elongated electrode island is surrounded by elongated ground islands. The surrounding grounds provide electrical shielding to reduce crosstalk between adjacent electrodes. The detailed layout of the ground structure will become apparent in the following descriptions of a 3×3 array of a multipole and multibeam electrostatic device. Furthermore, there is a vertical recess of the electrode 331 relative to the adjacent ground 332. The depth of the recess is equivalent to the width of the microtrench, for example in the range of 5 μm to 30 μm. The purpose of this electrode vertical recess is to provide a gap when two or more electrostatic devices are stacked on one another. With the recess, a gap in vacuum is created between the two stacked chips. The gap in vacuum not only reduces the chances of electrical discharges but also provides electrical shielding by stacking a ground surface of a top chip on top of an electrode surface of a bottom chip. As a result, each electrode can be shielded laterally and vertically for crosstalk elimination of a multi-beam electrostatic device.

This document further describes micro electrostatic devices with 3×3 arrays to influence 3×3 arrays of charged particle beams. A 3×3 array refers to a regular array of 3 rows and 3 columns. The 3×3 array devices are chosen as an example for the purpose of describing the structural design of the disclosed technology. Other multi-beam array devices, such as a 5×5 array devices may be implemented with the same design principles and microfabrication methods, therefore they are also considered as part of the disclosed technology.

Figure 4A:
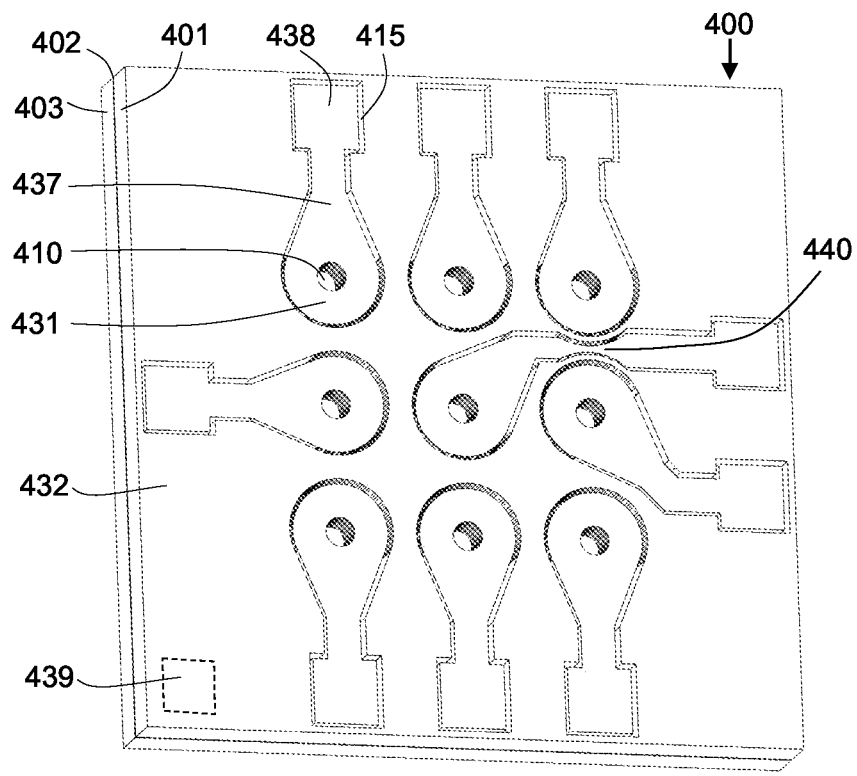
FIGS. 4A-4B are isometric top and bottom view schematic illustrations of an electrostatic device with a 3×3 array of single-pole-electrode configuration to influence a 3×3 array of charged particle beams.
Figure 4B:
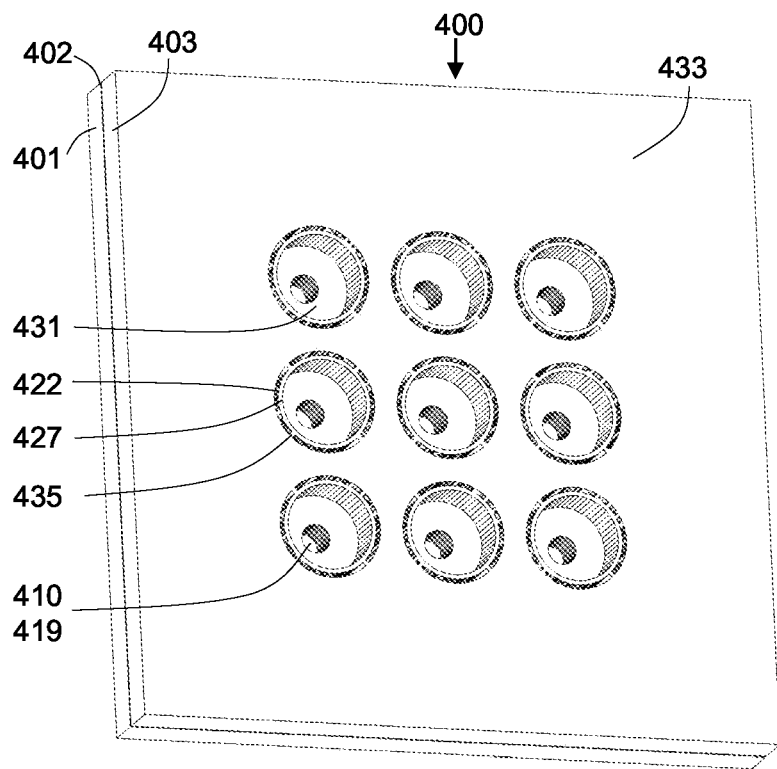

FIGS. 4A and 4B are isometric top and bottom view schematic illustrations of an electrostatic device. The device has a 3×3 array of single-pole-electrode configuration to influence a 3×3 array of charged particle beams. It is used as an example to describe the structural design and the fabrication methods in the disclosed technology. Configurations with other array numbers are also considered as part of the disclosed technology. The electrostatic device may be used as an electrostatic micro-lens for focusing a 3×3 array of charged particle beams. The annular electrode configuration and its through-hole opening section have been described in the descriptions for FIGS. 2A-2C.

The micro lens device 400 is a planar chip comprised of a structured first electrode and ground layer 401, a middle thin silicon dioxide insulating layer 402, and a second structured ground layer 403. The first layer 401 is also referred to as the top layer and the second layer 403 is also referred to as the bottom layer. The structured electrode and ground layer 401 include elongated silicon islands, silicon surface encapsulating silicon dioxide layer, and outer thin metal layers deposited on the exposed silicon dioxide surfaces. FIGS. 4A and 4B are used to illustrate the structural designs and drawings may not be to scale. The electrostatic device 400 may have square, rectangle, circular, or other shapes. The lateral dimension of micro-lens device 400 may be in the range of 1 mm by 1 mm to 50 mm by 50 mm depending on the number of multi-beam arrays. The top layer 401 thickness may be in the range of 10 μm to 1000 μm, for example in the range of 100 μm to 500 μm. The middle insulating layer 402 thickness may be in the range of 0.1 μm to 10 μm, for example in the range of 0.5 μm to 5 μm. The bottom layer 403 thickness may be in the range of 10 μm to 1000 μm, for example in the range of 100 μm to 500 μm. The thickness of the encapsulating silicon dioxide layer may be in the range of 0.1 μm to 10 μm, for example in the range of 0.5 μm to 2 μm. The thickness of the outer metal layer may be in the range of 0.1 μm to 0.5 μm.

The micro lens device 400 also comprises a 3×3 array of through openings for passing charged particle beams. Each circular through-opening extends transverse to the planar layers 401, 402 and 403. The circular openings 410 in the top layer may be smaller than the circular openings 419 in the bottom layer, but they are concentrically aligned. The top circular opening 410 is formed by overhanging annular electrodes 431. The diameter of 410 may be in the range of about 10 μm to 1000 μm, for example in the range of about 50 m to 250 μm. The diameter of 419 may be in the range of about 10 μm to 1000 μm, and may be larger than the diameter of 410. The pitch of the 3×3 through-hole openings may be in the range of 100 μm to 1000 μm, for example ranging from 300 μm to 700 μm.

As shown in FIG. 4A, the top layer 401 is structured to form elongated electrode islands 437 and ground island 432 separated by narrow and straight-sidewall micro-trenches 415. The width of the micro-trench 415 may be in the range of 1 μm to 100 μm, for example in the range of 3 μm to 30 μm. The bottom surfaces of the micro-trenches 415 reach the buried middle silicon dioxide insulating layer 402. A surrounding micro-undercut is etched into the base of each elongated island. The micro-undercuts are not shown in FIG. 4A, as they are hidden at the bottom of the micro-trenches. The elongated islands 437 and 432 are supported by the bottom silicon layer 403 through the silicon dioxide layer 402. One end of each elongated electrode island 437 has an overhanging annular electrode 431 that forms the beam path circular opening 410. Each electrode island 437 also serves as its own electrical routing, with the other end reaching the chip edge area to make electrical contact 438. The ground contact pad 439 may be placed at corners or edges of the top layer 401. Certain portions of the electrode routing are also made overhanging between anchors in high density routing areas, such as in the area 440. In narrow portions of electrode and routings, when the micro-undercuts from both sides of a narrow electrode routing meet, the narrow portion of the electrode routing is made overhanging. This overhanging electrode design not only enables electrode routing in compact spaces but also reduces the chances of electrical discharge in vacuum. As shown in FIG. 4A, each elongated electrode 437 island is fully surrounded by a ground island 432. The ground islands 432 provide electrical shielding for reducing cross-talks between adjacent electrodes. The electrode islands 437 are also optionally recessed relative to the ground islands 432, and the depth of the recess is equivalent to the width of the micro-trenches. The electrode recess allows ground shielding on its top when multiple chips are stacked. The ground islands 432 on the top layer 401 and ground islands 433 on the bottom layer 403 are electrically connected are chip edges. This ensures all the electrodes are fully shielded on the chip edges. It also allows electrical connection to the ground on the bottom layer 403 for ease of external grounding connection.

As shown in FIGS. 4A and 4B, the bottom layer 403 is made as a single ground layer with a 3×3 array of circular openings concentrically aligned to the top side openings for the beam paths. The diameter of 419 is larger than the diameter of 410 so that at least portions of the annular electrodes 431 are made overhanging on the backside openings 419. The diameter of the bottom layer through-hole opening 419 may be at least 10 μm larger than the diameter of the top layer through-hole opening 410. The thin-wall micro-fence 427 forms the circumference of the bottom circular opening 419. The thin-wall micro-fence 427 is suspended over the frontside electrode and it is held in place by short and overhanging micro-bridges 435. The thin-wall micro-fence 427 and its overhanging micro-bridges 435 have a wall thickness ranging from 2 μm to 20 μm. The width of the micro-trench 422 next to the micro-fence may be in the range of 1 μm to 100 μm, for example in the range of 3 μm to 30 μm. There is also a surrounding micro undercut at the interface of 433 and 402 layers at the backside circular cavities. The micro undercuts are hidden and not shown in FIG. 4B.

As illustrated in FIG. 2A-2C, each electrode and ground island on both the top and the bottom sides shown in FIG. 4A are comprised of a silicon island, an encapsulated silicon dioxide insulating layer, and a thin electrically conductive outer layer on its exposed dielectric surfaces except the surfaces inside the micro-undercuts. The encapsulating insulating layer may be a thermally grown silicon dioxide layer. The conductive thin film may be deposited from both the top and bottom sides by sputtering deposition processes or combined sputtering deposition and evaporation deposition processes. The conductive thin film may have a single metal layer that may include, but is not limited to, titanium. The thickness of the single metal film may be in the range of 0.1 μm to 0.5 μm. Alternatively, the thin conductive film may comprise an inner adhesion layer and an outer conductive layer that are deposited in the same deposition process. The outer conductive layer may be a material that resists surface oxidation and corrosions. Examples of the thin inner adhesion layer materials include but are not limited to titanium, titanium tungsten, and chrome. Examples of the outer conductive layer materials include but are not limited to gold, platinum, and molybdenum. The thickness of the inner adhesion layer may be in the range of 0.01 μm to 0.05 μm. The thickness of outer metal layer may be in the range of 0.1 μm to 0.5 μm. As described, the micro-structures of micro-trenches, micro-undercuts, micro-fences, micro-bridges, and other overhanging micro-structures provide built-in shadow effects for the pre-structured conductive deposition process. The surface-conductive layer of each elongated island is separated from the surface-conductive layers of other elongated islands at the hidden silicon dioxide surfaces of the micro-undercuts. As a result, each elongated island 437 becomes a surface-conductive elongated electrode and is electrically isolated from its neighboring electrodes. At the end of each elongated island, closer to the device center region, is the through-substrate circular opening 410 formed by annular electrode 431. At the other end of each elongated island, closer to the device edge region, there is a pad area 438 to make electrical contact to an external electrical connection. The bottom silicon surfaces of 400 are also fully encapsulated in an insulating layer, such as a layer of thermally grown silicon dioxide. The exposed silicon dioxide surfaces of the layer 403 are covered with thin and noble metal layers and connected to the ground electrode. The silicon dioxide layer and the thin metal layers are not shown in FIG. 4B. Due to the hidden micro undercuts and the overhanging micro-fences, the deposited bottom metal layer does not reach to the inner section of the micro undercuts. As a result, the backside metal layer is electrically isolated from the metal layer on the electrode 431 surfaces. The metal layers on the backside are electrically connected to the ground from the metal layers at edge surfaces of the device or through direct ground contact on the backside. Individually adjustable voltages are applied to the annular electrodes 431 from their contact pads at the edges of the device and through their surface-conductive routing structures. Around each annular electrode, an electric field is generated along its charged particle beam path. The electric fields are used to focus each charge particle beam independently. Therefore, the single-pole electrostatic device with a 3×3 array annular electrodes may be used as a micro-lens array to focus a 3×3 array of charged particle beams.

Figure 5A:
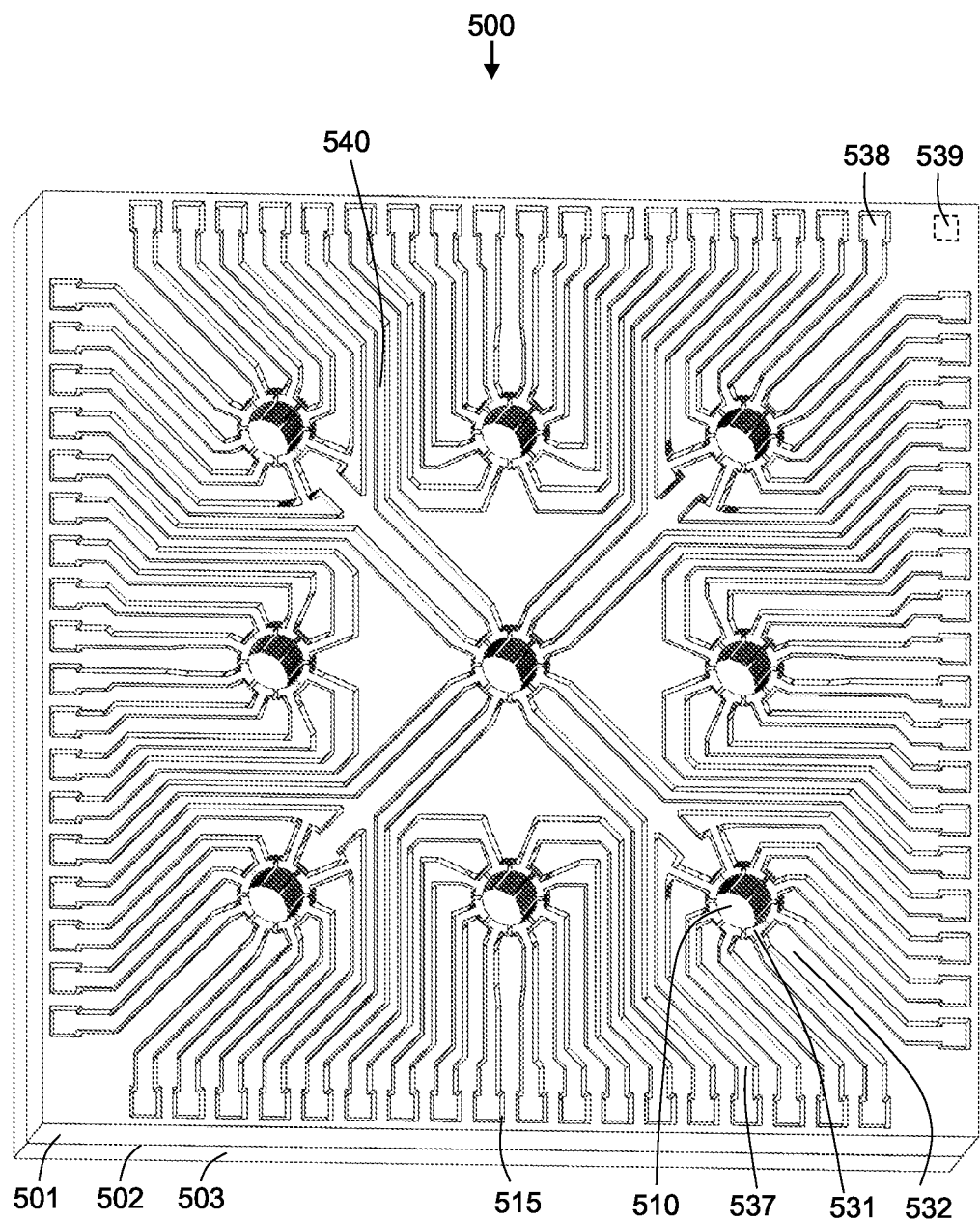
FIGS. 5A-5B are isometric top and bottom view schematic illustrations of an electrostatic device with a 3×3 array of octupole-electrode configuration to influence a 3×3 array of charged particle beams.
Figure 5B:
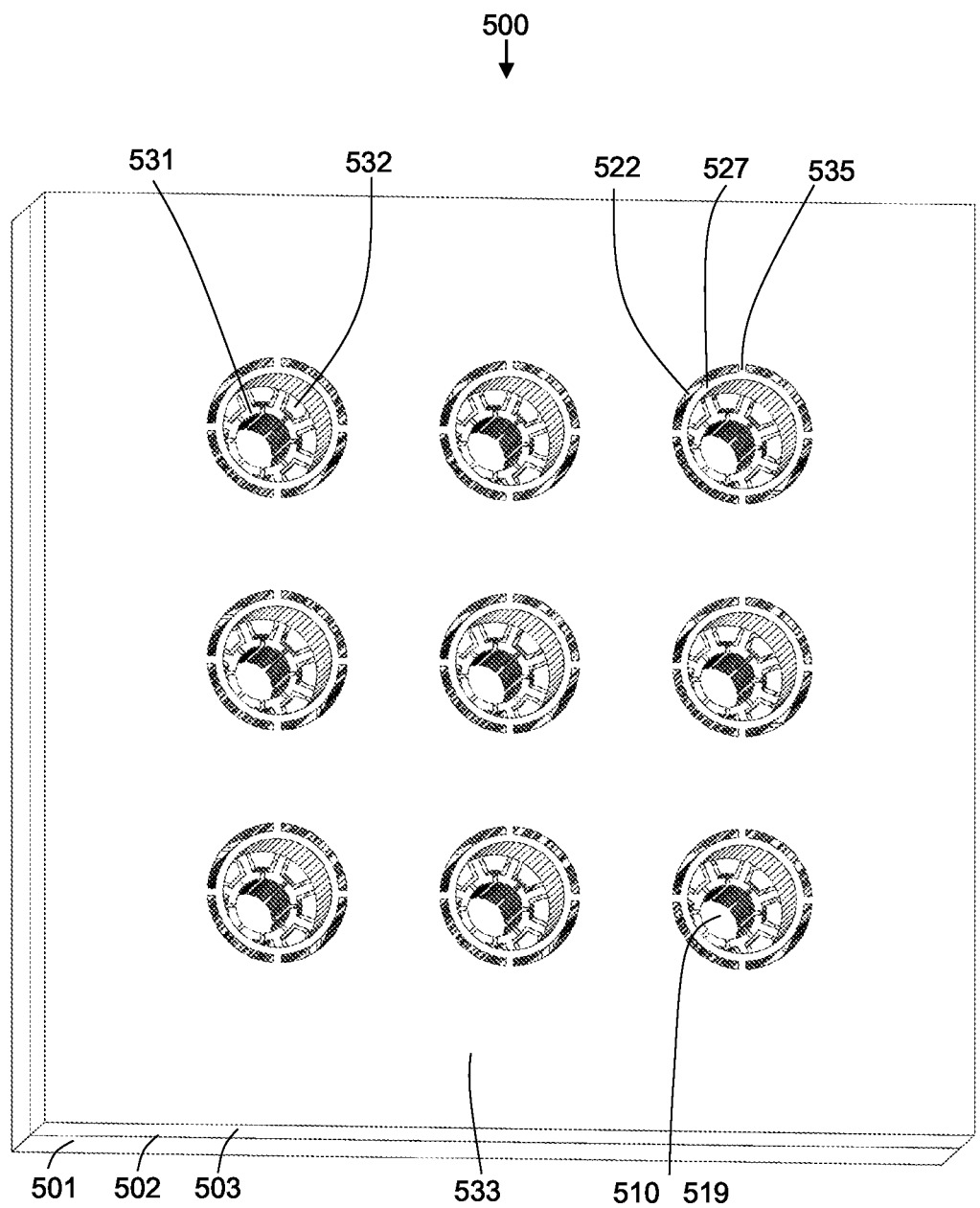

FIGS. 5A and 5B are isometric top and bottom view schematic illustrations of an electrostatic device. The device has a 3×3 array of octupole-electrode configuration to influence a 3×3 array of charged particle beams. It is used as an example to describe the structural design and the fabrication methods in the disclosed technology. The multi-beam and multipole electrode devices that have other array and electrode numbers are also considered part of the disclosed technology. The electrostatic device may be used as electrostatic micro-lenses, micro-deflectors, micro-compensators, or micro-stigmators to influence a 3×3 array of charged particle beams. The octuple-electrode configuration and its through-hole opening section have been described in the descriptions for FIGS. 3A-3C.

The micro device 500 is a planar chip comprised of a structured first' electrode and ground layer 501, a middle thin silicon dioxide insulating layer 502, and second structured ground layer 503. The first layer 501 is also referred to as the top layer and the second layer 503 is also referred to as the bottom layer. The structured electrode and ground layer 501 comprises elongated silicon islands, a silicon surface encapsulating silicon dioxide layer, and outer thin metal layers deposited on the exposed silicon dioxide surfaces. FIGS. 5A and 5B are used to illustrate the structural designs and drawings may not be to scale. The electrostatic device 500 may have square, rectangle, circular, or other shapes. The lateral dimension of multipole device 500 may be in the range of 1 mm by 1 mm to 50 mm by 50 mm depending on the number of multi-beam arrays. The top layer 501 thickness may be in the range of 10 μm to 1000 μm, for example in the range of 100 μm to 500 μm. The middle insulating layer 502 thickness may be in the range of 0.1 μm to 10 μm, for example in the range of 0.5 μm to 5 μm. The bottom layer 503 thickness may be in the range of 10 μm to 1000 μm, for example in the range of 100 μm to 500 μm. The thickness of the encapsulating silicon dioxide layer may be in the range of 0.1 μm to 10 μm, for example in the range of 0.5 μm to 2 μm. The thickness of the outer metal layer may be in the range of 0.1 μm to 0.5 μm.

The multipole electrostatic device 500 also comprises a 3×3 array of through openings for passing charged particle beams. Each circular through-opening extends transverse to the planar layers 501, 502 and 503. The circular openings 510 in the top layer may be smaller than the circular openings 519 in the bottom layer but they are concentrically aligned. The top circular opening 510 is formed by eight concentric arc-shaped overhanging electrodes 531. The diameter of 510 may be in the range of about 10 μm to 1000 μm, for example in the range of about 50 μm to 250 μm. The diameter of 519 may be in the range of about 10 μm to 1000 μm, and may be larger than the diameter of 510. The pitch of the 3×3 through-hole openings may be in the range of 100 μm to 1000 μm, for example ranging from 300 μm to 700 μm.

As shown in FIG. 5A, the top layer 501 is structured to form elongated electrode islands 537 and ground islands 532 separated by narrow and straight-sidewall micro-trenches 515. The width of the micro-trench 515 may be in the range of 1 μm to 100 μm, for example in the range of 3 μm to 30 μm. The bottom surfaces of the micro-trenches 515 reach the buried middle silicon dioxide insulating layer 502. A surrounding micro-undercut is etched into the base of each elongated island. The micro-undercuts are not shown in FIG. 5A, as they are hidden at the bottom of the micro-trenches. The elongated islands 537 and 532 are supported by the bottom silicon layer 503 through the silicon dioxide layer 502. One end of each elongated electrode island has an overhanging arc-shaped electrode 531 that forms a portion of the circular beam path opening 510. As shown in FIG. 5A, the arcs may have the same length and may be arranged with same radial gap between adjacent arcs. Depending on the applications, the arcs may also have different lengths and may be arranged with different radial shifts. Each electrode also serves as its own electrical routing, with the other end reaching the chip edge area to make electrical contact 538. The ground contact pad 539 may be placed at corners or edges of the top layer 501. Certain portions of the electrode routing are also made overhanging between anchors in high density routing areas, such as in the area 540. In narrow portions of electrode and ground routings, when the micro-undercuts from both sides of a narrow routing meet, the narrow portion of the electrode or ground routing is made overhanging. This overhanging electrode design not only enables electrode and ground routings in compact spaces but also reduces the chances of electrical discharge in vacuum. As shown in FIG. 5A, each elongated electrode 537 island is surrounded by a ground island 532. The ground islands 532 provide electrical shielding for reducing cross-talks between adjacent electrodes. The electrode islands 537 are also optionally recessed relative to the ground islands 532 and the depth of the recess is equivalent to the width of the micro-trenches. The electrode recess allows ground shielding on its top when multiple chips are stacked. The ground islands 532 on the top layer 501 and ground islands 533 on the bottom layer 503 are electrically connected are chip edges. This ensures all the electrodes are fully shielded on the chip edges. It also allows electrical connection to the ground on the bottom layer 503 for ease of external grounding connection.

As shown in FIGS. 5A and 5B, the bottom layer 503 is made as a single ground layer with a 3×3 array of circular openings concentrically aligned to the top side openings for the beam paths. In certain applications, both electrode and ground island structures may be formed in both the top layer 501 and in the bottom layer 503. However, the islands and trenches on the top and the bottom layers are not overlapping. Thus, the islands on the top and the bottom layer can be mutually supported. Even though this structural design with electrode and ground islands on both top and the bottom layers is not shown in the figures, they are part of the disclosed technology. As shown in FIGS. 5A and 5B, the diameter of 519 is larger than the diameter of 510 so that the arc portions of the electrodes 531 are made overhanging on the bottom openings 519. The diameter of the bottom layer through-hole opening 519 may be at least 10 μm larger than the diameter of the top layer through-hole opening 510. The thin-wall micro-fence 527 forms the circumference of the bottom circular opening 519. The thin-wall micro-fence 527 is suspended over the frontside electrode and it is held in place by four short and overhanging micro-bridges 535. The thin-wall micro-fence 527 and its overhanging micro-bridges 535 have a wall thickness ranging from 2 μm to 20 μm. The width of the micro-trench 522 next to the micro-fence may be in the range of 1 μm to 100 μm, for example in the range of 3 μm to 30 μm. There is also a surrounding micro undercut at the interface of 533 and 502 layers at the backside circular cavities. The micro undercuts are hidden and not shown in FIG. 5B.

As illustrated in FIG. 3A-3C, each electrode and ground island on both the top and the bottom layers shown in FIG. 5A are comprised of a silicon island, an encapsulated silicon dioxide insulating layer, and a thin electrically conductive outer layer on its exposed dielectric surfaces, except the surfaces inside the micro-undercuts. The encapsulating insulating layer may be a thermally grown silicon dioxide layer. The conductive thin film may be deposited from both the top and bottom sides by sputtering deposition processes or combined sputtering deposition and evaporation deposition processes. The conductive thin film may have a single metal layer that may include but is not limited to titanium. The thickness of the single metal film may be in the range of 0.1 µm to 0.5 µm. Alternatively, the thin conductive film may comprise an inner adhesion layer and an outer conductive layer that are deposited in the same deposition process. The outer conductive layer may be a material that resists surface oxidation and corrosions. Examples of the thin inner adhesion layer materials include but are not limited to titanium, titanium tungsten, and chrome. Examples of the outer conductive layer materials include but are not limited to gold, platinum, and molybdenum. The thickness of the inner adhesion layer may be in the range of 0.01 µm to 0.05 µm. The thickness of outer metal layer may be in the range of 0.1 µm to 0.5 µm. As described, the micro-structures of micro-trenches, micro-undercuts, micro-fences, micro-bridges, and other overhanging micro-structures provide built-in shadow effects for the pre-structured conductive deposition process. The surface-conductive layer of each elongated island is separated from the surface-conductive layers of other elongated islands at the hidden silicon dioxide surfaces of the micro-undercuts. As a result, each elongated island 537 becomes a surface-conductive elongated electrode and is electrically isolated from its neighboring electrodes. At the end of each elongated island, closer to the device center region, an arc-shaped is formed and eight arc-shaped electrodes 531 form the through-substrate circular opening 510. At the other end of each elongated island, closer to the device edge region, there is a pad area 538 to make electrical contact to an external electrical connection. The backside silicon surfaces of 500 are also fully encapsulated with an insulating layer, such as a layer of thermally grown silicon dioxide. The exposed silicon dioxide surfaces of the layer 503 are covered with thin metal layers and connected to the ground electrode. The silicon dioxide layer and the thin metal layers are not shown in FIG. 5B. Due to the hidden micro undercuts and the overhanging micro-fences, the backside metal layers do not reach the inner section of the micro undercuts. As a result, the backside metal layers are electrically isolated from the metal layer on the electrode 531 surfaces. The metal layers on the backside are electrically connected to the ground from the metal layers at edge surfaces of the device or through direct ground contact on the backside. Individually adjustable voltages are applied to the arc-shaped electrodes 531 from the contact pads at the edges of the device Individually adjustable voltages are applied to the arc-shaped electrodes 531 from their contact pads at the edges of the device and through their surface-conductive routing structures. When common voltages are applied to all arc-shaped electrodes 531 at each beam path opening 510, the octupole electrostatic device 500 works as a 3×3 electrostatic micro-lens array to focus the charged particle beams. When the arc-shaped electrodes 531 are configured to have different and independent voltages applied at each arc-shaped electrode 531 at each beam path openings, electric fields perpendicular to or at angles to the optical axis of the beam path can be generated. Such electric fields can be used for deflecting or bending the charged particle beam. In such multipole configurations, the electrostatic device 500 can be configured and used as a 3×3 array of a micro-deflector, a micro-stigmator, or a micro-compensator in a multibeam system.

FIG. 6A is an isometric top view schematic illustration of the chip edge pad contact portion 600 of the electrostatic devices. The electrode and ground contact pads are arranged in the chip edge areas for making external electrical contacts. Each electrode contact pad 638 is at the end of an elongated electrode island 637. Each elongated electrode island, including its pad end, is fully surrounded by a micro-trench 615. There are also surrounding micro-undercuts at the bottom of each electrode and ground islands. Since the micro-undercuts are hidden at bottom of the micro-trenches, they are not shown in FIG. 6A. Elongated ground islands 632 between adjacent electrode islands to provide electrical shielding. The elongated ground islands are electrically connected at the chip edges and corners. In other words, the chip edges are formed by the ground structures while electrode structures are kept away from the edges of the chip. Furthermore, the grounds on the top side and on the bottom side are also electrically connected at chip edges. This chip edge design with surrounding ground structures fully eliminates any possibility of discharging or shorting caused by chip edge defects or chip holder contacts. Because all the ground structures are electrically connected, the contact pad for the ground can be used at any locations on the top surface of the ground structures. As an example, ground contact location 639 is shown at a chip corner. When the top surfaces of the chip are coated with metals, such as gold, wire bonding can be applied readily on the pad surfaces.

FIG. 6B is the cross-sectional view schematic illustration of the chip edge pad contact area along the C-C section in FIG. 6A. The device includes the first silicon layer 601, a buried silicon dioxide layer 602, and the second silicon layer 603. The first silicon layer 601 is also referred to as the top silicon layer and the second silicon layer 603 is also referred to as the bottom silicon layer. In the top layer, adjacent elongated electrode islands 637 are separated by ground islands 632 so that the electrode islands are shielded in the lateral directions individually. The elongated electrode islands 637 are also recessed relatively to the ground islands so that ground structures of another chip may be stacked on top and leave a small gap formed by the electrode recess. Thus, the electrode islands may be shielded in the vertical direction. As descried in previous sections, the electrode islands 637 and ground islands 632 in the top layer are made surface-conductive and each of them includes silicon island 601, thermally grown silicon dioxide encapsulating layer 628, and outer electrically conductive layer 629. The electrode and ground islands are separated and surrounded by micro-trenches 615 and micro-undercuts 622. In the bottom silicon layer 603, ground 633 is formed by depositing conductive layer 630 on encapsulating silicon dioxide layer 628. The electrically conductive layers 629 and 630 are deposited from the top and bottom respectively. The conductive layers 629 and 630 cover the top surfaces, the bottom surfaces, edge surfaces of the chip, and the sidewall surfaces of the micro-trenches 615. Due to the built-in shadow effects, the surfaces 636 of the insulating layer inside the micro-undercuts 622 are not covered by the conductive layer, thus creating discontinuities in the conductive layer 629, and forming electrically isolated electrodes and ground structures. The electrically conductive metal layers 629 and 630 cover the sidewalls of the chip edges including the inner surfaces of the micro-undercuts 634 at the chip-edge. As a result, the ground structure 632 on the top layer and the ground structure 633 on the bottom layer of the chip are electrically connected through the chip-edge metal coverage. The conductive layers 629 and 630 may be deposited from both the top and bottom sides by sputtering deposition processes or combined sputtering deposition and evaporation deposition processes. The conductive thin film may have a single metal layer that may include but is not limited to titanium. The thickness of the single metal film may be in the range of 0.1 µm to 0.5 µm. Alternatively, the thin conductive film may include an inner adhesion layer and an outer conductive layer that are deposited in the same deposition process. The outer conductive layer may be a material that resists surface oxidation and corrosions. Examples of the thin inner adhesion layer materials include but are not limited to titanium, titanium tungsten, and chrome. Examples of the outer conductive layer materials include but are not limited to gold, platinum, and molybdenum. The thickness of the inner adhesion layer may be in the range of 0.01 µm to 0.05 µm. The thickness of outer metal layer may be in the range of 0.1 µm to 0.5 µm.

FIG. 7A is an isometric top view schematic illustration of an electrode and ground routing area 700 of a narrow-electrode design. FIG. 7B illustrates the cross-sectional view schematic illustration of the electrode and ground routing area 700 along the D-D section. FIG. 7C illustrates the cross-sectional view schematic illustration of the electrode and ground routing area 700 along the E-E section.

As shown in FIG. 7A, the electrode routings 737 and ground routings 732 have narrow widths in a high-density routing area and they are separated by micro-trenches 715. The elongated electrode islands 737 have overhanging portions 740 between supporting electrode anchors 741. The overhanging electrode section 740 may also be referred to as narrow electrode bridges. The overhanging length of electrode bridges 740 may be in the range of 10 µm to 1000 µm, for example in the range of 50 µm to 500 µm, depending on the width of the electrode bridge and the thickness of its silicon island. The ground routings 732 may also be partially overhanging at their narrow portions. As shown in FIG. 7B, there is a gap 742 under the overhanging electrode bridge 740. The electrode anchors 741 may have circular or other shapes. Each electrode anchor 741 has a hidden micro-undercut 722 at its bottom as shown in FIG. 7C. Micro-undercuts 722 also surround ground islands 732. As descried in previous sections, the electrode and ground islands in the top layer are made surface-conductive and each includes silicon island 701, thermally grown silicon dioxide encapsulating layer 728, and outer electrically conductive layer 729. The electrode and ground islands are separated and surrounded by micro-trenches 715 and micro-undercuts 722. In the bottom silicon layer 703, ground 733 is formed by depositing conductive layer 730 on encapsulating silicon dioxide layer 728. The electrically conductive layers 729 and 730 are deposited from the top and bottom respectively. The conductive layers 729 and 730 cover the top surfaces, the bottom surfaces, edge surfaces of the chip, and the sidewall surfaces of the micro-trenches 715. Due to the built-in shadow effects, the surfaces 736 of the insulating layer inside the micro-undercuts 722 are not covered by the conductive layer, thus creating discontinuities in the conductive layer 729, and forming electrically isolated electrodes and ground structures. The electrically conductive metal layers 729 and 730 are electrically connected through the chip-edge metal coverage. The conductive layers 729 and 730 may be deposited from both the top and bottom by sputtering deposition processes or combined sputtering deposition and evaporation deposition processes. The conductive thin film may have a single metal layer that may include but is not limited to titanium. The thickness of the single metal film may be in the range of 0.1 µm to 0.5 µm. Alternatively, the thin conductive film may comprise an inner adhesion layer and an outer conductive layer that are deposited in the same deposition process. The outer conductive layer may be a material that resists surface oxidation and corrosion. Examples of the thin inner adhesion layer materials include but are not limited to titanium, titanium tungsten, and chrome. Examples of the outer conductive layer materials include but are not limited to gold, platinum, and molybdenum. The thickness of the inner adhesion layer may be in the range of 0.01 µm to 0.05 µm. The thickness of outer metal layer may be in the range of 0.1 µm to 0.5 µm.

The narrow-electrode design enables routing in high density areas, such as the areas of 440 and 540 as shown respectively in FIGS. 4A and 5A, where both the electrode and ground routing lines must be made narrower than other areas on the chips. Also, when the size of the multi-beam array and the number of electrode poles are increased, the densities of electrode and ground routings are increased. Furthermore, to reduce electrical discharges and breakdowns, the electrode routing lines may be made narrow and overhanging. When electrode routings are made narrow compared to the ground routings, the ratio of total exposed electrode surface area to the total surface area of a chip is reduced. Therefore, the narrow-electrode design reduces the probability of discharging caused by given numbers of particles randomly reaching the chip surfaces during chip fabrication, assembly, and operation in the vacuum system. Especially, when the multiple electrostatic chips are vertically stacked to form a multi-function charged particle beam manipulation system, a small total exposed electrode surface area on each chip of the chip-stack is preferred. Reducing the total electrode surface areas to be shielded further reduces the probability of discharging between an electrode surface and its ground shielding in the vertical direction. Also, when portions of the narrow electrodes are made overhanging, the hidden dielectric surfaces inside the micro-undercuts are reduced, in turn reducing the possibilities of electrical discharges and breakdowns.

Figure 8:
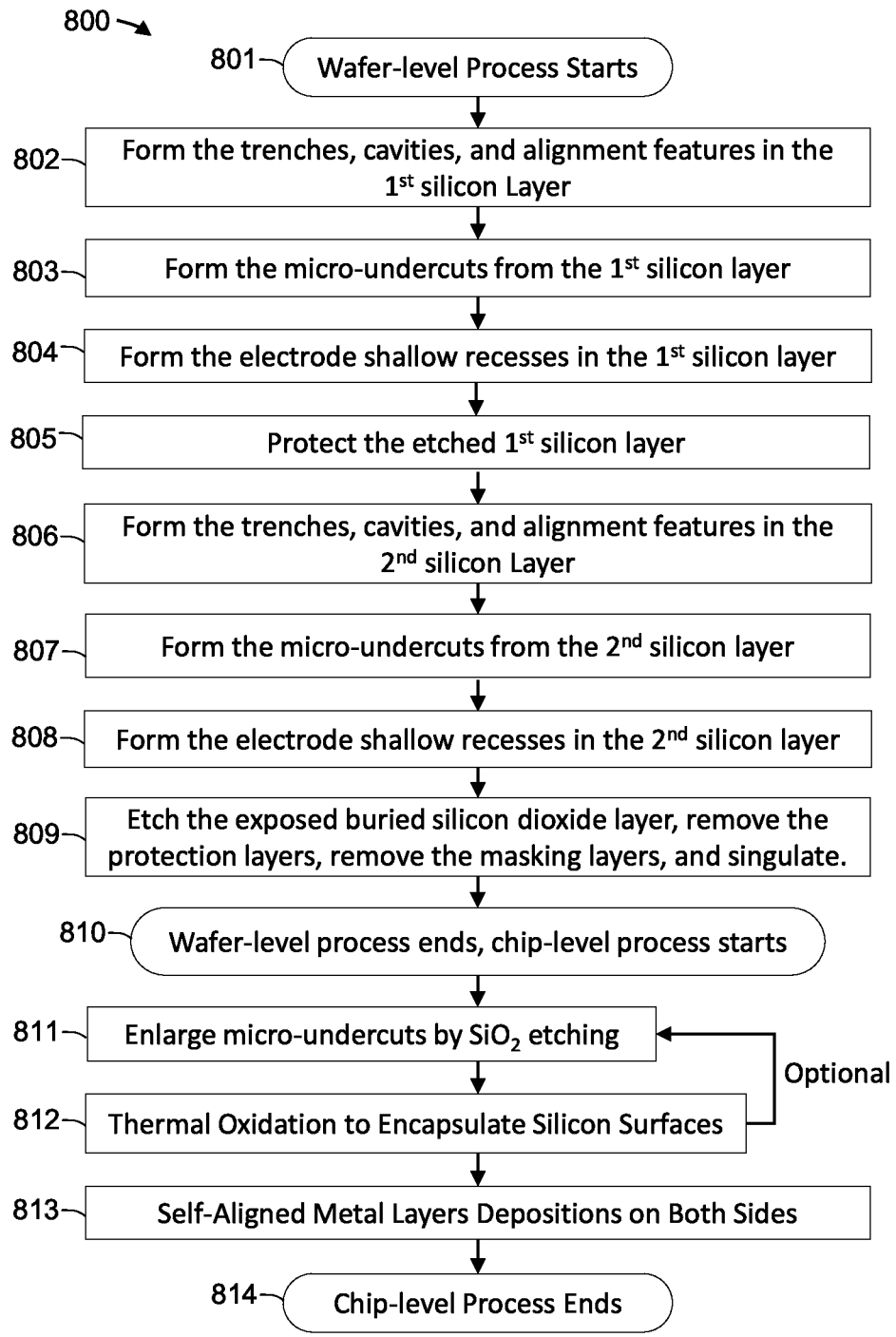
FIG. 8 is an example of a flow diagram illustrating major fabrication process steps.

FIG. 8 is an example of a flow diagram illustrating major fabrication process steps. In FIG. 8, the starting substrate, which is referred to as a wafer here, comprises a first silicon layer, a second silicon layer, and a buried silicon dioxide layer disposed between the first and the second silicon layers. The first silicon layer is also referred to as the top silicon layer and the second silicon layer is also referred to as the bottom silicon layer. Such a planar starting wafer may be a commercially available silicon-on-insulator (SOI) wafer with specified layer thicknesses. In FIG. 8, there are no micro-structures made and buried in the starting wafer. An example of a fabrication process flow diagram with buried micro-structures in a bonded wafer is described with respect to FIG. 13. The example of FIG. 8 includes multiple methods of forming micro-undercuts, overhanging micro-structures, and the shallow silicon recesses. Their corresponding cross-sectional views of key processing steps of FIG. 8 are described in more details in FIGS. 9-12.

In FIG. 8, the process flow 800 includes two process modules: first, a wafer-level fabrication process module and second, a chip-level fabrication process module. The fabrication process starts with wafer-level process step 801. The shapes and sizes of the starting wafer include but are not limited to circular wafers and the diameters of standard circular wafers may be 100 mm, 150 mm, and 200 mm. The two silicon layers of the starting wafer may have different thickness: the first silicon layer may be either thicker or thinner than the second silicon layer. The fabrication process of structuring each of the two silicon layers may comprise the following major silicon etching steps. First, a straight-sidewall silicon etching process forms circular cavities for the charged particle beam paths, micro-trenches, and other micro-structures as in step 802; second, it forms micro-undercuts as in step 803. The disclosed technology provides multiple methods to form the micro-undercuts including silicon undercutting etching of the first silicon layer, buried silicon dioxide etching, silicon etching of the second silicon layer, or combined silicon and buried silicon dioxide layer etching. Details of the micro-undercut forming methods are provided in the descriptions for FIG. 9-12. Third, silicon etching step 804 forms the shallow silicon recesses in the first silicon layer. This silicon recess etching step is optional and it may be needed when the electrode side of the chip is bonded to a surface of another chip to form a multi-functional chip-stack. In such a case, the etched silicon recesses of the electrodes form gaps between the top surfaces of the electrodes on one chip to the bonded surface of another chip. The gaps formed by the etched recesses reduce the possibility of electrical shorting and discharging. The disclosed technology provides multiple masking methods for etching the shallow silicon recesses. Details of the masking methods for the shallow silicon recess etching are provided in the description for FIGS. 9-12. As shown in FIG. 8, step 805 protects the micro-structures etched from the side of the first silicon layer. The fabrication process for structuring the second silicon layer is the same or similar to that of the first silicon layer. Step 806 forms micro-trenches, circular cavities, and other micro-structures in the second silicon layer by straight-sidewall silicon etching with a patterned masking layer. Step 807 forms the micro-undercuts at the bottoms of the micro-trenches. Step 808, which may be optional, forms the shallow silicon recesses in the second silicon layer by short silicon etching as in step 804. Step 809 etches the exposed silicon dioxide layer between the two silicon layers and removes the masking and protective layers on both sides. The chip boundaries on a wafer are defined by aligned and overlapped micro-trenches etched in the first and second silicon layers. After the removal of the silicon dioxide layer at bottom surfaces of the micro-trenches and the protective layers, the chips are singulated simultaneously. Chip singulation methods such as mechanical saw dicing are avoided to prevent dicing debris from being introduced and trapped in micro-trenches and micro-undercuts.

As shown in FIG. 8, the chip-level process 810 starts from step 811. One of the methods to create or increase the dimensions of a micro-undercut is to etch the buried silicon dioxide layer in a time-controlled process. In step 811, hydrofluoric acid (HF) vapor or a diluted HF solution is used for the time-controlled buried silicon dioxide etching. Then a thermal oxidation step 812 is performed at the chip-level to encapsulate all the exposed silicon surfaces, including the edges of the chips, with a thermally grown silicon dioxide layer. The thermally grown silicon dioxide layer may then be etched by an HF vapor or HF solution with controlled etching time as in step 811. The repetition of step 811 and step 812 can be used to create and enlarge the micro-undercuts. Because the thermal oxidation process incorporates silicon into the grown silicon dioxide layer, the repetition of steps 811 and 812 provides the following benefits. First, it increases the sizes of the micro-undercuts after removing the silicon dioxide layer in each repetition cycle. Second, the thermal oxidation process at elevated temperatures burns off surface contaminants and particles. As a result, the possibility of electrical discharges from particles and surface contaminants is reduced. Third, the HF silicon dioxide etching, and thermal oxidation processes also provide another advantage of the devices in the disclosed technology. The etched silicon surfaces are made smoother and have fewer particles after each cycle of thermal oxidation and HF oxide removal process. As a result, many surface protrusions in micro or nano scales may be removed. The smoother and cleaner surfaces provided by this process significantly reduce the chances of electrical discharging and breakdowns in confined micro spaces when strong electric fields are applied to influence the charged particle beams. After forming the micro-undercuts, in the last step of 812, another thermal oxidation process is conducted and the thermally grown silicon dioxide layer fully encapsulates all the silicon surfaces of the chips. In step 813, thin conductive films are deposited from the top side and from the bottom side of the chips. The chip-level conductive film deposition process can be a sputtering metal deposition process or a combined sputtering and evaporation metal deposition process. A sputtering metal deposition process provides metal film coverage on all the exposed surfaces of the structured chip, except the surfaces shadowed by the built-in micro-shadow-masking structures. An evaporation process may deposit a metal film only on the surfaces facing the line-of-sight direction from the metal evaporation source. The conductive thin films may have a single metal layer that may include but is not limited to titanium. Alternatively, the thin conductive films may include an inner adhesion layer and an outer conductive layer that are deposited in the same deposition process. The outer conductive layer may be a metal that resists surface oxidation and corrosions. Examples of the thin inner adhesion layer materials include but are not limited to titanium, titanium tungsten, and chrome. Examples of the outer conductive layer materials include but are not limited to gold, platinum, and molybdenum. The built-in micro-shadow-masking structures include the micro-trenches, micro-undercuts, micro-fences, and micro-bridges. Due to the built-in micro shadowing effects provided by these micro-structures, the metal deposition process is pre-structured and metal layers for the electrode and ground structures are physically separated and electrically isolated as deposited. No additional metal layer patterning and etching processes are required. As a result, the chip surfaces are kept clean from particle contaminations, reducing the possibility of electrical shorting, discharging and breakdowns when high magnitudes of electric fields are applied. This concludes the fabrication process flow in FIG. 8.

The disclosed technology provides a few process methods for making the micro-undercuts and the shallow silicon recesses. FIGS. 9-12 include these fabrication methods through partial cross-sectional view schematic illustrations after the key fabrication steps. The methods for making the micro-undercuts and the shallow silicon recesses may be combined differently than described in FIGS. 9-12. In other words, any one of the methods of making the micro-undercuts can be combined with any one of the methods of making the shallow silicon recesses to form a microfabrication process flow variation. And such a microfabrication process flow variation is still part of the disclosed technology.

FIG. 9 shows an example of a microfabrication process corresponding to the flow diagram in FIG. 8. FIGS. 9A-9N are partial cross-sectional view schematic illustrations after the key fabrication process steps. In the fabrication process flow of FIG. 9, the micro-undercuts are formed by taking advantage of the aspect-ratio-dependent etching lag of the deep reactive ion etching (DRIE) process, which is often referred to as the Bosch process (U.S. Pat. No. 5,501,893), with added sidewall protection and silicon etching steps. The shallow silicon recess etching is conducted by anisotropic silicon etching using a double masking layer silicon DRIE process. To illustrate the microfabrication method, a single-pole device to influence a single charged particle beam is used. The illustrated and described methods of fabrication are also applicable to the fabrication processes for making the multi-pole devices and the arrayed devices to influence multiple charged particle beams.

FIG. 9A shows a partial cross-sectional view schematic illustration of a starting wafer 900 of the disclosed technology. The wafer comprises a first silicon layer 901, a second silicon layer 903, and a buried silicon dioxide layer 902 disposed between the first and the second silicon layers. The first silicon layer is also referred to as the top silicon layer and the second silicon layer is referred to as the bottom silicon layer. When a commercially available silicon-on-insulator (SOI) wafer with specified layer thicknesses is used, the first silicon layer is often referred to as the device layer and the second silicon layer is often referred to as the handle layer. Micro-structures including the electrode and ground structures can be formed in either or both silicon layers. The choice of the first silicon layer to be processed depends on the structure complexities. Some processing steps of the second silicon layer may need to be conducted by placing the wafer on a carrier wafer with the structured first silicon layer protected and facing down on the carrier wafer. Therefore, it is often more convenient to choose the silicon layer that has more processing steps and tighter geometry and process control requirements as the first silicon layer. As a result, the number of processing steps that needs to be conducted with the carrier wafer is reduced. One method of forming the starting wafer is referred to as silicon fusion bonding. Two double-side polished single-crystal silicon wafers are thoroughly cleaned before bonding with standard and commonly used wafer pre-oxidation cleaning methods in semiconductor IC fabrication and micro-electro-mechanical system (MEMS) fabrication processes. After growing a silicon dioxide layer with specified thickness on one of the two wafers in a thermal oxidation process, the second double-side polished single-crystal silicon wafer is bonded on the oxide surface on the first wafer. The wafer bonding is initiated at room temperature and then annealed at temperatures between 700° C. to 1100° C. Then wafer lapping and polishing processes are conducted to reduce the first silicon layer and second silicon layer to their specified thicknesses. The thicknesses of the silicon layers may be in the range of 10 μm to 1000 μm, for example ranging from 100 μm to 500 μm. The thickness of the buried silicon dioxide layer may be in the range of 0.1 μm to 10 μm, for example ranging from 0.5 m to 5 μm. The lateral sizes of the electrostatic devices may be in the range of 1 mm×1 mm to 50 mm×50 mm. The wafer shapes and sizes include but are not limited to circular wafers with diameters of 100 mm, 150 mm, and 200 mm.

FIG. 9B shows a partial cross-sectional view schematic illustration of the wafer after patterning of two masking layers on its first silicon layer. This double masking process is one of the methods of making the shallow silicon recesses by preparing the masking layers before the silicon etching steps. With this method, photolithography patterning on etched silicon surfaces with deep trench and cavity features is avoided. The patterned first masking layer 904 is used for shallow recess silicon etching and the patterned second masking layer 905 is used for the trench and cavity silicon etching. The patterns of 905 are aligned to patterns of 904 on the wafer. Because the second masking layer 905 is deposited and patterned on top of the patterned first masking layer 904, and the second masking layer 905 need to be selectively removed after its use without affecting the patterned first masking layer 904, the two masking layers 904 and 905 must be different types of masking materials. Examples of the first masking materials include but are not limited to aluminum and silicon dioxide. Examples of the second masking materials include but are not limited to patterned positive or negative photoresist materials. Patterned thin layers of aluminum, silicon dioxide, and photoresist may be used as the etching mask layers for silicon etching. The center line of the charged particle beam transmission path is shown in FIG. 9B as the dashed line 906. The second masking layer opening for the charged particle beam transmission path 906 is a circular opening with a diameter may be in the range of about m to 1000 μm, for example in the range of about 50 μm to 250 μm. Locations 907, where there is only the second masking layer pattern on the silicon surface, are the electrode shallow recess forming locations. There are partially or fully exposed first masking layer 904 surfaces in the openings of the second masking layer 905, such as in locations 908. The mask openings 908 is used to make silicon micro-trenches and their opening widths may be in the range of 1 μm to 100 μm, for example in the range of 3 μm to 30 μm.

In the next processing step, the exposed first masking layer 904 at second masking layer openings 908 is etched before the silicon etching. The etching for removing the exposed first masking layer in the second masking openings 908 must not etch silicon. For example, if the first masking layer 904 is a thin layer of silicon dioxide, reactive ion etching (RIE) with $CHF_3$ gas with a small portion of oxygen may be used to selectively etch the silicon dioxide layer using the second masking layer as the etching mask. After the selective first masking layer etching, the first masking layer pattern is perfectly aligned to the second masking layer pattern at pattern openings 908. Then as shown in FIG. 9C, the first silicon anisotropic etching is conducted by the silicon DRIE process. And the second masking layer 905 is used for the silicon DRIE process. The silicon DRIE process includes repeated and optimized cycles of silicon etching using $SF_6$ plasma and thin protection film deposition using $C_4F_8$ plasma to form silicon micro-structures with relatively straight sidewalls. One of the characteristics of the silicon DRIE process is that the silicon etching rate of small opening etching is lower than a large opening etching in high-aspect ratio micro-structure etching process. The high-aspect ratio refers to the ratio of the silicon etching depth to the mask opening size ratio. In this case, the silicon etching rates of narrow trenches 909 are lower than the etching rates of the circular openings 910 of the charged particle beam paths. The 909 trench opening widths may be in the range of 1 μm to 100 μm, for example in the range of 3 μm to 30 μm. The diameters of circular openings 910 may be in the range of about 10 μm to 1000 μm, for example in the range of about 50 μm to 250 μm. Taking advantage of this aspect-ratio dependent etching lag, the silicon etching is time-controlled and stopped when silicon etching in the large openings 910 is completed and the buried silicon dioxide surface is exposed. Due to the etching lag in narrow openings, a thin layer of silicon of 2 μm to 20 μm thick is left at the bottoms of the micro-trenches 909.

Methods of forming micro-undercuts and micro-overhanging structures are provided in the disclosed technology. Overhanging micro-structures may be formed when micro-undercuts from two sides of a narrow microstructure meet. FIG. 9D illustrates one of the methods of forming the micro-undercuts. A thin surface protection layer 911 is deposited by plasma deposition or a vapor phase deposition to the exposed surfaces shown in FIG. 9D. Examples of the thin surface protection layer includes PECVD (Plasma Enhanced Chemical Vapor Deposition) silicon dioxide and fluorocarbon film deposited from the $C_4F_8$ plasma. The film thickness may be in the range of 0.1 µm to 1 µm, depending on its silicon etching selectivity ratios. Then RIE etching of the thin protective layer 911 is performed to selectively remove the protective layer from the top surfaces and the bottom surfaces of the micro-trenches 909 and circular cavities 910. As a result, the protective layer 911 is only left on the sidewall surfaces. The silicon surfaces at the bottom of the micro-trenches are exposed. A time-controlled short silicon etching step is then performed to etch away the silicon at the bottom of the micro-trenches and further to create micro-undercuts 912 in silicon at the bottom of the micro-trenches. As an example, the micro-undercut may be 5 µm high and 15 µm deep. The etched micro-undercuts 912 and leftover sidewall protective layer 911 are shown in FIG. 9D. This method of forming micro-undercuts may also be used to form overhanging micro-bridges and other partially overhanging micro-structures. When micro-undercuts are etched from the sides of a narrow and long silicon structure, the etching fronts of the undercutting etching may meet at the narrowest portion first and create an overhanging portion of the silicon structure. The length of the overhanging portion may be determined by the controlled etching time and the structural design. Wider portions of the silicon structure support the overhanging portions as shown in FIG. 7.

After forming micro-undercuts at the bottom of micro-trenches and overhanging micro-structures, the second masking layer 905 and the sidewall protective layer 911 are removed to expose the silicon surface in the areas of 907 and the surfaces of the first masking layer 904. In the next step, a time-controlled DRIE etching is performed to form a recess on the exposed silicon surface 907 with the first masking layer 904. The shallow silicon recess etching is anisotropic. In other words, the exposed sidewall silicon surfaces and edges of the exposed silicon islands are not to be attacked during the recess etch, which requires sufficient sidewall protection layer deposition in the $C_4F_8$ deposition cycles. On the other hand, the amount of $C_4F_8$ deposition may not be too much to avoid generating silicon grass on the etched silicon top surfaces and edges of the silicon islands. The depth of the recess may be in the range of 5 µm to 30 µm. After removing the remaining masking layer 904, the first silicon layer silicon structuring process is completed. As shown in FIG. 9E, the recessed silicon islands 913 form the islands for the electrodes and the first masking layer covered silicon islands 914 are for the islands of the grounds. Micro-trenches 915 with micro-undercuts 912 surround and separate the electrode islands and ground islands. Micro-trenches 916 define the boundary of the devices and they are used for the chip singulation with the corresponding micro-trenches to be made in the second silicon layer. The circular opening 910 forms the charged particle beam path in the first silicon layer. As described in earlier sections, the electrode and ground islands are in elongated shapes. One end of each electrode island is an annular shaped electrode island 913 or an arc-shaped electrode island and they form the charged particle beam path opening 910. The elongated electrode and ground islands 913 and 914 also serve as routing lines and they reach the edges of the devices for making external electrical contacts.

As shown in FIG. 9F, after completing the first silicon layer micro-structuring process, the structured first silicon layer can be protected by applying a temporary protection layer 917. The material of 917 may be an organic material dissolved in a solvent and polymerized after curing by applying heat. The coating process may be spray coating, dispensing, dip coating, low speed spin coating or a combination of these methods. The layer 917 may also be a polymer layer that is deposited from vapor phase. The coated layer 917 provides surface protection of the first silicon layer to prevent it from being affected when the second silicon layer is being processed. The coated layer 917 at least partially fills the deep and narrow micro-trenches and at least partially planarizes the wafer surfaces of the first silicon layer. With the protection layer 917, processing the second silicon layer may share most processing equipment and processing conditions as with the first silicon layer. In this process flow example, the second silicon layer is only made as a ground layer. The silicon recess making process is not included in the second silicon structuring process. If needed, the silicon recess making process described for the first silicon layer structuring may be applied to the second silicon layer structuring. Also shown in FIG. 9F, the processing of the second silicon layer starts from applying and patterning a photoresist masking layer 918. The patterns of 918 are aligned to the alignment features made on the first silicon layer, and the alignment accuracy may be +/−2 µm or better. The pattern opening 919 in photoresist layer 918 is a circular opening for making the charged particle beam path in the second silicon layer. The pattern opening of 920 in the photoresist layer 918 is an enclosed micro-trench opening pattern for defining the boundary of the chip on the wafer. The pattern 921 is a circular micro-fence pattern for forming the circular micro-trench opening 922 in the photoresist layer 918.

As shown in FIG. 9G, the second layer silicon anisotropic etching is also conducted by deep reactive ion etching. Due to the etching depth lag of the micro-trench compared to the larger circular beam path opening, when the silicon etching reaches the buried oxide surface in the large circular opening, the etching is stopped and there is a small amount of silicon left at the bottom surfaces of the micro-trenches 920 and 922.

FIG. 9H illustrates one of the methods of forming the micro-undercuts in the second silicon layer. A thin layer of surface protection layer 923 is deposited by plasma deposition or a vapor phase deposition to the exposed surfaces shown in FIG. 9H. Examples of the thin surface protection layer include PECVD silicon dioxide and fluorocarbon film deposited from the $C_4F_8$ plasma. The film thickness may be in the range of 0.1 µm to 1 µm, depending on their silicon etching selectivity ratios. Then RIE etching of the thin protective layer 923 is performed to selectively remove the protective layer from the top surface and the bottom surfaces of the circular cavity 919 and the micro-trenches 920 and 922. As a result, the protective layer is only left on the sidewall surfaces. The silicon surfaces at the bottom of the micro-trenches are exposed as shown in FIG. 9H. A time-controlled short silicon etching step is then performed to etch away the silicon at the bottom of the micro-trenches and further to create micro-undercuts 924 in silicon at the bottom of the micro-trenches. The silicon undercutting etching may be an etching. As an example, the micro-undercut may be 5 µm high and 15 µm deep. The etched micro-undercuts 924 and leftover sidewall protective layer 923 are shown in FIG. 9I.

After forming the micro-undercuts in the second silicon layer, the buried silicon dioxide layer 902 is exposed at the bottom surfaces of the micro-trenches, micro-undercuts, and the circular cavities. RIE etching with a mixture of $CHF_3$ gas and a small percentage of oxygen is conducted to etch the silicon dioxide layer. Alternatively, time-controlled diluted HF etching, or vapor HF etching can also be used to remove the exposed silicon dioxide layer. Next, the sidewall protective layer 923 and the first side protective layer 917 are fully removed. Isotropic oxygen plasma etching may be used to remove the two protective layers if they are organic materials. With the full removal of the protective layer 917, the chip boundary micro-trenches 916 in the first silicon layer and 920 in the second silicon layer are connected. As a result, the chip 925 is separated from the wafer as shown in FIG. 9J.

Figure 9K:
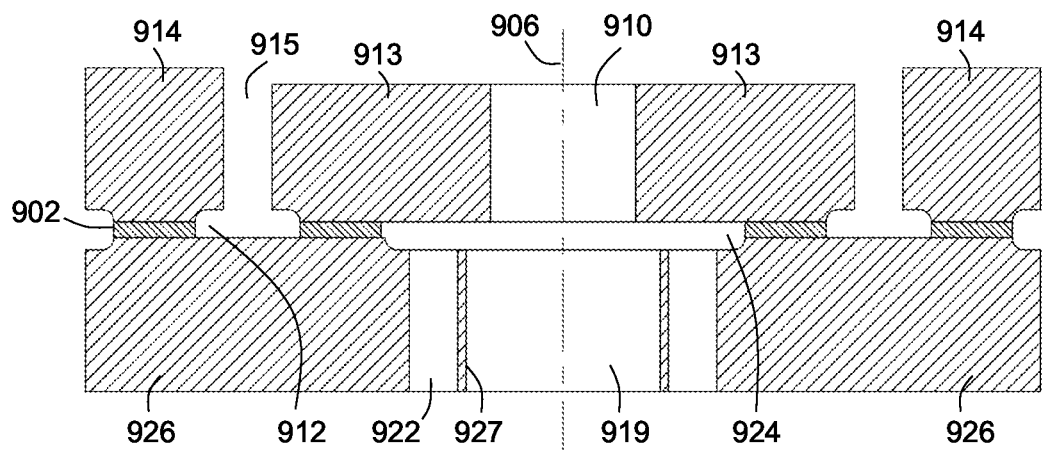
FIGS. 9A-9N are cross-sectional view schematic illustrations of a device microfabrication process after its key microfabrication process steps corresponding to the flow diagram in FIG. 8.

FIGS. 9K-9N illustrate the chip-level fabrication process. FIG. 9K shows the silicon structures of the single-pole chip after its singulation step from the wafer-level process. The charged particle beam path is provided by the circular opening 910 in the first silicon layer and larger circular opening 919 in the second silicon layer. 906 shows the optical axis of the charged particle beam. The circular opening 910 in the first silicon layer is formed by ring-shape recessed silicon island structure 913, which is used to make the annular electrode. In the first silicon layer, silicon island structure 913 is surrounded by ground island structures 914 with micro-trenches 915 between them. Micro-undercuts 912 are at the bottom of the micro-trench 915 surrounding the island structures 913 and 914. The island structures 913 and 914 are supported by the second silicon layer through the buried silicon dioxide layer 902. As shown in FIG. 9K, only ground structure 926 is formed in the second silicon layer. Alternatively, electrode island structures may also be formed in the second silicon layer using the fabrication process described for the first silicon layer. When both electrode and ground island structures are made in both the first silicon layer and second silicon layer, the micro-trenches in the two silicon layers cannot overlap, so that the island structures on both silicon layers can be mutually supported. The ground structures of the second silicon layer include the circular opening 919 for providing the charged particle beam path with optical axis 906. A circular micro-fence 927 is formed concentric to the circular opening 919. In other word, the circular micro-fence 927 forms the circumference of the circular cavity 919. The purpose of forming the overhanging micro-fence 927 is to form the circular micro-trench 922 and the micro-undercut 924 underneath. Overhanging micro-bridges connect the overhanging micro-fence to the rest ground silicon structure. The micro-bridges are not shown in FIG. 9K, but they are shown in FIG. 2C. The combined micro-structures of micro-fence, micro-bridges, micro-trenches, and micro-undercuts form a built-in micro-shadow mask to enable the pre-structured metal deposition process.

Figure 9L:
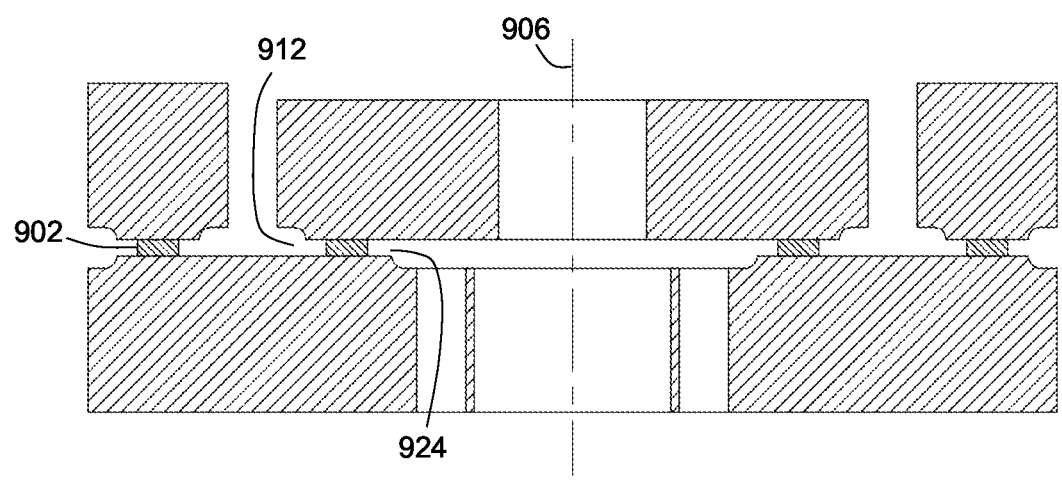

FIG. 9L shows another method of forming the micro-undercuts and overhanging micro-structures at chip-level. The buried silicon dioxide layer 922 is etched in a controlled amount from its exposed sidewall surfaces in the micro-undercuts 912 and 924. The buried silicon dioxide undercutting etching may be conducted using diluted hydrofluoride (HF) solutions or using vapor HF. After the HF etching, the micro-undercuts are made deeper in the lateral direction as shown in FIG. 9L. The next step is to conduct a thermal oxidation process to have a thin layer of silicon dioxide grown on all the exposed silicon surfaces. Silicon thermal oxidation consumes silicon from the original silicon surface and incorporates the consumed silicon in the newly grown silicon dioxide layer. As an example, 1 µm thick silicon dioxide is grown on a chip that has a 2 µm high micro-undercut (gap) between two silicon layers. After the thermal oxidation process, about 46% of the oxide thickness lies inside of the original silicon surface, and 54% lies outside of it. Therefore, after the 1 m thick silicon dioxide growth, the original 2 µm high micro-undercut (gap), formed from the buried silicon dioxide etching, becomes 0.92 µm. If the newly grown 1 µm thick silicon dioxide layer is removed by another time-controlled HF etching, the height of the micro-undercut (gap) is increased to 2.92 µm, and it is also at least 1 µm deeper in the lateral direction. As a result, with a cycle of thermal oxidation and time-controlled HF etching process, the micro-undercuts are made not only deeper in the lateral direction, but also higher in the vertical direction. Therefore, a single cycle or multiple cycles of the oxidation and oxide etching process may be conducted for forming micro-undercuts with specific sizes and shapes at the buried silicon dioxide interfaces. For the simplicity of the drawing, FIG. 9L only illustrates the cross-section of the chip after a single time-controlled HF etching step to show the formation of inner portions of the micro-undercuts by this method. The HF silicon dioxide etching, and thermal oxidation processes also provide another advantage of the devices in the disclosed technology. The etched silicon surfaces are made smoother and have fewer particles after each cycle of thermal oxidation and HF oxide removal process. As a result, many surface protrusions in micro or nano scales may be removed. The smoother and cleaner surfaces provided by this process significantly reduce the chances of electrical discharging and breakdowns in confined micro spaces when strong electric fields are applied to influence the charged particle beams.

Figure 9M:
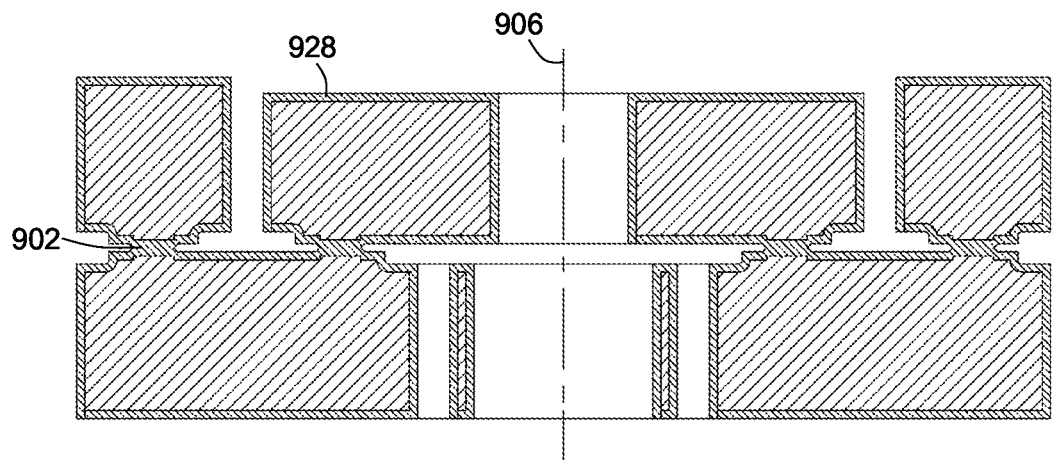

As shown in FIG. 9M, a final thermal oxidation process is conducted to grow a thin layer of silicon dioxide 928 on all the exposed silicon surfaces. The grown oxide thickness may be in the range of 0.1 µm to 10 µm, for example in the range of 0.5 µm to 2 µm. The thermal oxidation may be a commonly used wet oxidation process at temperatures between 800° C. to 1200° C., for example at around 1100° C. After the chip-level thermal oxidation process, all the silicon surfaces, including the inner surfaces of all the micro-undercuts and the sidewall surfaces of chip edges are fully encapsulated by the silicon dioxide layer 928.

Figure 9N:
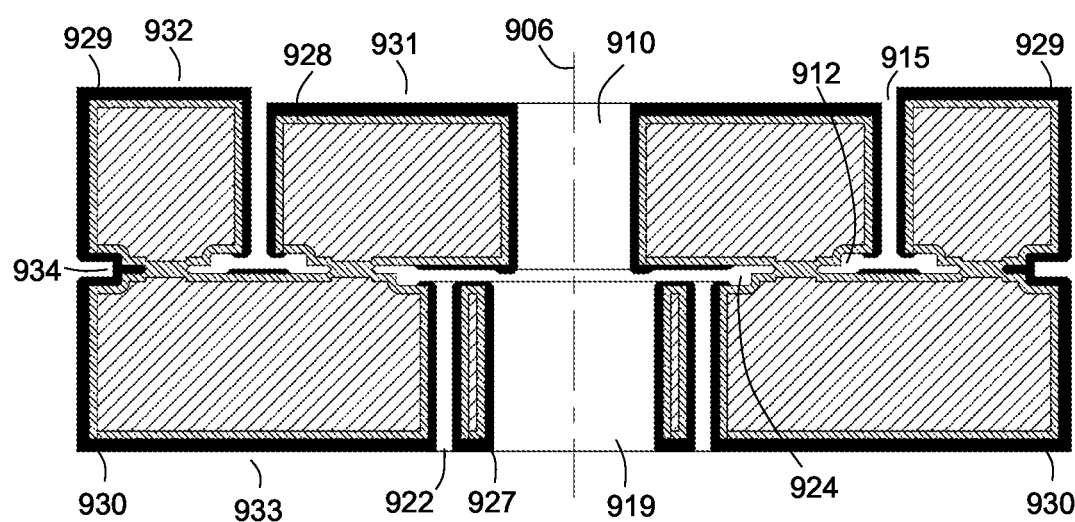

FIG. 9N shows the cross-sectional view schematic illustration of the single-beam single-pole device after its chip-level pre-structured conductive layer deposition processes. Metal deposition methods include but are not limited to physical vapor depositions (PVD), such as sputtering and e-beam evaporation. A sputtering deposition process is normally conducted at higher deposition pressures than evaporation pressures. For example, a sputtering pressure may be in the range of 0.2 pascal to 2 pascal and an evaporation pressure may be in the range of 10 micro-pascal to 100 micro-pascal. In a metal sputtering process, the excess energy of the ions also increases the surface mobility of the ions of the depositing material. As a result, a sputtering metal deposition process provides metal film coverage on all exposed surfaces of the structured chip, except the surfaces shadowed by the built-in micro-shadow-masking structures. On the other hand, a metal evaporation deposition process provides a line-of-sight deposition due to its much lower vacuum deposition pressures.

The chip-level metal deposition process includes at least two steps of metal sputtering processes. One sputtering process is to deposit metal layers 929 from the top, which is the first silicon layer side. Another sputtering process is to deposit metal layers 930 from the bottom, which is from the second silicon layer side. A metal evaporation process may be optionally conducted to deposit a thicker metal film on either the top or the bottom surfaces of the chip by having the top or bottom surfaces placed to face the direction of the line-of-sight relative to the evaporation source. The evaporated thick metal film is used for making external electrical connections such as wire-bonding or direct metal probe or pin contacts. The metal contact pads, and the electrode and ground routings are not shown in FIG. 9N, but they are illustrated and described in FIG. 6A and FIG. 6B. The deposited metal films 929 and 930 may have a single metal layer that may include but is not limited to titanium. The thickness of the single metal film may be in the range of 0.1 μm to 0.5 μm. Alternatively, the thin conductive film may include an inner adhesion layer and an outer conductive layer that are deposited in the same deposition process. The outer conductive layer may be a material that resists surface oxidation and corrosions. Examples of the thin inner adhesion layer materials include but are not limited to titanium, titanium tungsten, and chrome. Examples of the outer conductive layer materials include but are not limited to gold, platinum, and molybdenum. The thickness of the inner adhesion layer may be in the range of 0.01 μm to 0.05 μm. The thickness of outer metal layer may be in the range of 0.1 μm to 0.5 μm.

After conducting the metal deposition process from the top of the chip, as shown in FIG. 9N, the top surfaces and sidewall surfaces of the electrode islands 931 and ground islands 932 are fully covered by the sputtered metal layer 929. The cylindrical sidewall surfaces of circular beam path opening 910 and 919 are also covered by the sputtered metal layers. Because of the built-in shadow-masking effects provided by the micro-trench 915, the metal thickness on the sidewalls of micro-trench 915 is progressively reduced towards the bottom of the micro-trench. The metal layer 929 does not reach the hidden inner surfaces of the micro-undercut 912 due to the built-in shadow-masking effects of the micro-trench 915 and the micro-undercuts 912. As a result, the uncoated dielectric surfaces in the micro-undercuts 912 create discontinuities in the sputtered metal layer 929. Therefore, the metal layers 929 on the electrode islands 931 and ground islands 932 are physically separated and electrically unconnected. After the metal sputtering deposition from the bottom of the chip, the bottom surfaces and sidewall surfaces of the ground structure 933, including the surfaces of micro-fence 927, are fully covered by the sputtered metal layer 930. The cylindrical sidewall surfaces of circular beam path openings 919 and 910 are also covered by the sputtered metal layer 930. The fully metallized cylindrical surfaces of 910 and 919 prevents trapping of charged particles along the beam paths. Because of the built-in shadow-masking effects provided by the micro-fence 927, micro-trench 922, and micro-undercuts 924, the metal thickness on the sidewalls of micro-trench 922 is progressively reduced towards the bottom of the micro-trench, and the metal layer 930 does not reach the hidden inner surfaces of the micro-undercut 924. As a result, the uncoated dielectric surfaces in the micro-undercuts 924 create discontinuities between the sputtered metal layers on the top electrode island 931 and the bottom ground metal layer 930. On the other hand, since the micro-undercuts 934 at chip edges are open without shadowing effects from micro-trenches, the metal layers 929 and 930 on the ground structures 932 and 933 may be physically and electrically connected through the edges of the chip. The top ground island electrical connection to the bottom ground layer allows for a single-side external ground contact and provide additional electrode ground shielding from their bottom. Both the metal sputtering and evaporation processes are pre-structured without the needs of conducting metal patterning and etching after the metal deposition. As a result, particle contaminations associated with metal patterning and etching processes on micro-structures with high-aspect ratios are avoided.

To illustrate another method of forming the micro-undercuts and the shallow silicon recesses, FIG. 10 shows another example of a microfabrication process corresponding to the flow diagram in FIG. 8. FIGS. 10A-10N are partial cross-sectional view schematic illustrations after the key fabrication process steps. In the fabrication process flow of FIG. 10, the micro-undercuts are formed by taking advantage of the notching effects of the silicon DRIE process. The shallow silicon recess etching is conducted by isotropic silicon etching using a patterned dry film photoresist layer with sidewalls of the silicon structures protected. A single-pole device to influence a single charged particle beam is used to illustrate the fabrication process example. The illustrated and described methods of fabrication are also applicable to the fabrication processes for making the multi-pole devices and the arrayed devices to influence multiple charged particle beams.

FIG. 10A shows a partial cross-sectional view schematic illustration of a starting wafer 1000. The wafer comprises a first silicon layer 1001, a second silicon layer 1003, and a buried silicon dioxide layer 1002 disposed between the first and the second silicon layers. The first silicon layer is also referred to as the top silicon layer and the second silicon layer is referred to as the bottom silicon layer. When a commercially available silicon-on-insulator (SOI) wafer with specified layer thicknesses is used, the first silicon layer is often referred to as the device layer and the second silicon layer is often referred to as the handle layer. Micro-structures including the electrode and ground structures can be formed in either or both silicon layers. The choice of the first silicon layer to be processed depends on the structure complexities. Some processing steps of the second silicon layer may need to be conducted by placing the wafer on a carrier wafer with the structured first silicon layer protected and facing down on the carrier wafer. Therefore, it is often more convenient to choose the silicon layer that has more processing steps and tighter geometry and process control requirements as the first silicon layer. As a result, the number of processing steps that needs to be conducted with the carrier wafer is reduced. One method of forming the starting wafer is referred to as silicon fusion bonding. Two double-side polished single-crystal silicon wafers are thoroughly cleaned before bonding with standard and commonly used wafer pre-oxidation cleaning methods in semiconductor IC fabrication and micro-electromechanical system (MEMS) fabrication processes. After growing a silicon dioxide layer with specified thickness on one of the two wafers in a thermal oxidation process, the second double-side polished single-crystal silicon wafer is bonded on the oxide surface on the first wafer. The wafer bonding is initiated at room temperature and then annealed at temperatures between 700° C. to 1100° C. Then wafer lapping and polishing processes are conducted to reduce the first silicon layer and second silicon layer to their specified thicknesses. The thicknesses of the silicon layers may be in the range of 10 μm to 1000 μm, for example ranging from 100 μm to 500 μm. The thickness of the buried silicon dioxide layer may be in the range of 0.1 μm to 10 μm, for example ranging from 0.5 μm to 5 μm. The lateral sizes of the electrostatic devices may be in the range of 1 mm×1 mm to 50 mm×50 mm. The wafer shapes and sizes include but are not limited to circular wafers with diameters of 100 mm, 150 mm, and 200 mm.

FIG. 10B shows a partial cross-sectional view schematic illustration of the wafer after patterning of the masking layer on its first silicon layer. The patterned masking layer 1005 is used for the trench and cavity silicon etching as well as the micro-undercut silicon etching. Examples of the masking materials include but are not limited to patterned photoresist. As shown in FIG. 10B, the center line of the charged particle beam transmission path is shown as the dashed line 1006. The masking layer opening for the charged particle beam transmission path 1006 is a circular opening for the circular-hole straight sidewall silicon etching of the first silicon layer. The diameter of the circular opening may be in the range of 10 µm to 1000 µm, for example in the range of 50 µm to 250 µm. Locations 1007 are the electrode shallow recess forming locations. The mask openings 1008 are used to make silicon micro-trenches and their opening widths may be in the range of 1 µm to 100 µm, for example in the range of 3 µm to 30 µm.

Another characteristic of the silicon DRIE etching process is its notching or footing effects. The method of forming micro-undercuts in the FIG. 10 process flow takes advantage of this notching effect. When a silicon DRIE process etches a narrow silicon micro-trench with a buried silicon dioxide layer, if the etching continues after the buried silicon dioxide surface is reached at the bottom of the micro-trench, the silicon over-etching is then directed laterally along the silicon and silicon dioxide interface. As a result, a lateral notch or footing is formed at the interface. As a characteristic of silicon DRIE etching, the notching or footing created at the interface is often undesirable and methods are developed to reduce or eliminate them. Here the notching effect is purposely used to generate the micro-undercuts. To enhance the effects of this micro-undercut formation, a continuous high radio frequency (13.56 MHz) of bias-power source may be used in the silicon DRIE process. The sizes of the micro-undercuts formed by this method depend on the opening width and the aspect ratios of the micro-trenches. FIG. 10C shows the cross-sectional view schematic illustration after the silicon micro-trench and micro-undercut DRIE etching. For a given time of over-etching, the size of a micro-undercut generated in a small opening is larger than that of a large opening. Since the width of the micro-trench openings 1009 may be in the range of 3 µm to 30 µm, and the diameters of the circular beam path openings 1010 may be in the range of 50 µm to 250 µm or larger, the over-etching may be time-controlled to form large enough micro-undercuts 1012 at trench bottoms with no or minimal undercutting at the bottom of the larger circular openings. As an example, the micro-undercut may be 5 µm high and 15 µm deep in the lateral direction. When a micro-undercut is needed at bottom of a relatively large cavity opening or a wide trench opening, micro-fences may be used to create the micro-undercuts as described in the second silicon layer structuring process. This method of forming micro-undercuts may also be used to form overhanging micro-bridges and other partially overhanging micro-structures. When micro-undercuts are etched from the sides of a narrow and long silicon structure, the etching fronts of the undercutting etching may meet at the narrowest portion first and create an overhanging portion of the silicon structure. The length of the overhanging portion may be determined by the controlled etching time and the structural design. Wider portions of the silicon structure support the overhanging portions as shown in FIG. 7.

After forming micro-undercuts at the bottom of micro-trenches and overhanging micro-structures, the masking layer 1005 is removed to expose the silicon surfaces. Next, a method of patterning and silicon etching to form shallow recesses on ground silicon islands is provided. As shown in FIG. 10D, a surface protection layer 1011 is deposited by plasma deposition or a vapor phase deposition to the exposed surfaces. The purpose of the layer 1011 is to protect exposed silicon sidewall surfaces so that an isotropic silicon etching may be used for the shallow recess silicon etching. Examples of the thin surface protection layer includes PECVD silicon dioxide and polymer deposited from vapor phase. The thickness of layer 1011 may be in the range of 1 µm to 10 µm. The stress in the protection layer 1011 may be low so it remains intact at the edges of the silicon islands during the silicon etching.

Figure 10E:
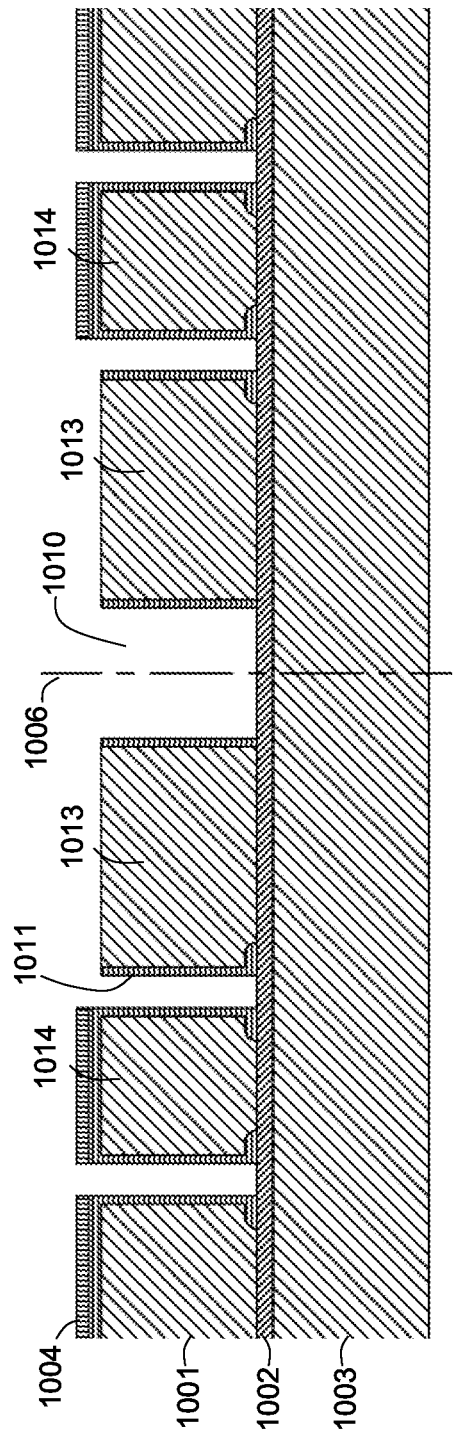
FIGS. 10A-10N are cross-sectional view schematic illustrations of another device microfabrication process after its key microfabrication process steps corresponding to the flow diagram in FIG. 8.
Figure 10F:
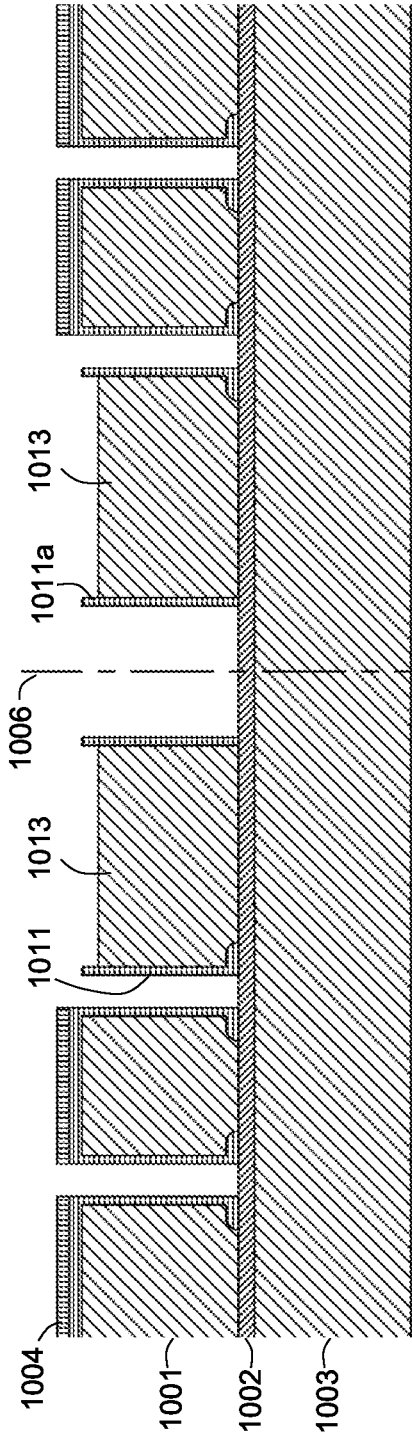

Next, as shown in FIG. 10E, photolithography using the laminated dry film photoresist layer 1004 is used to pattern the top surface areas. The dry-film photoresist layer 1004 is laminated at atmospheric pressure by using a hot-roll laminator or laminated in vacuum by using a heated diaphragm laminator. The laminated dry-film photoresist is then UV exposed using a photomask with alignment. Alternatively, spray coated photoresist may be used instead of the dry film photoresist. After the dry film developing, a directional RIE etching process is conducted to selectively etch the protection layer 1011 using the patterned dry film as the etching masking layer. The RIE process only etches away the protection layer 1011 on the top surfaces of island 1013 and surfaces at bottom of trenches and cavities. After the RIE etching, the top silicon surfaces of silicon islands 1013 are exposed and the sidewall surfaces of the micro-trenches and micro-cavities are still protected by the protection layer 1011. Next, as shown in FIG. 10F, an isotropic silicon etching is used for the shallow recess silicon etching. As a result, the shallow recesses of silicon islands at locations 1013 are formed. During the recess silicon etching, the protruded portions 1101a of protection layer 1011 are used to protect the edges of the silicon islands being etched. The protruded portions 1011a should be robust and withstand the silicon etching process.

After the shallow recess silicon etching, the dry film layer 1004 and surface protection layer 1011 are removed. This completes the silicon structuring of the first silicon layer. As shown in FIG. 10G, the recessed silicon islands 1013 are the electrode islands, and the silicon islands 1014 are the ground islands. Micro-trenches 1015 with micro-undercuts 1012 surround and separate the electrode islands and ground islands. Micro-trenches 1016 define the boundary of the devices and they are used for the chip singulation with the corresponding micro-trenches to be made in the second silicon layer. The circular opening 1010 forms the charged particle beam path in the first silicon layer. As described in earlier sections, the electrode and ground islands are in elongated shapes. One end of each electrode island is an annular shaped electrode island 1013 or an arc-shaped electrode island and they form the charged particle beam path opening 1010. The elongated electrode and ground islands 1013 and 1014 also serve as routing lines and they reach the edges of the devices for making external electrical contacts.

As shown in FIG. 10H, after completing the first silicon layer micro-structuring process, the structured first silicon layer may be protected by applying a temporary protection layer 1017. The material of 1017 may be an organic material dissolved in a solvent and polymerized after curing by applying heat. The coating process may be spray coating, dispensing, dip coating, low speed spin coating or a combination of these methods. The layer 1017 may also be a polymer layer that is deposited from vapor phase. The coated layer 1017 provides surface protection of the first silicon layer to prevent it from being affected when the second silicon layer is being processed. The coated layer 1017 at least partially fills the deep and narrow micro-trenches and at least partially planarizes the wafer surfaces of the first silicon layer. With the protection layer 1017, processing the second silicon layer may share most processing equipment and processing conditions as with the first silicon layer. In this process flow example, the second silicon layer is only made as a ground layer. The silicon recess making process is not included in the second silicon structuring process. However, if needed, the silicon recess making process described for the first silicon layer structuring may be applied to the second silicon layer structuring. Also shown in FIG. 10H, the processing of the second silicon layer starts from applying and patterning a photoresist masking layer 1018. The patterns of 1018 are aligned to the alignment features made on the first silicon layer, and the alignment accuracy may be +/−2 m or better. The pattern opening 1019 in photoresist layer 1018 is a circular opening for making the charged particle beam path in the second silicon layer. The pattern opening of 1020 in the photoresist layer 1018 is an enclosed micro-trench opening pattern for defining the boundary of the chip on the wafer. The pattern 1021 is a circular micro-fence pattern for forming the circular micro-trench opening 1022 in the photoresist layer 1018.

As shown in FIG. 10I, the second layer silicon anisotropic etching is also conducted by a deep reactive ion etching (DRIE) process using the masking layer 1018. After the silicon DRIE etching reaches the buried silicon dioxide layer at the bottom surfaces of the micro-trenches 1020 and 1022, an over-etching is conducted and time-controlled to create the micro-undercuts 1024. Like the first silicon layer, the micro-undercut in the second silicon layer is generated taking advantage of the notching effects of the silicon DRIE etching when a buried silicon dioxide surface is reached in the narrow trench openings. To create micro-undercut 1024 at the bottom of the large circular opening 1019, the micro-fence 1021 is formed at peripheral of the opening 1019. As a result, micro-trench 1022 is purposely formed and the micro-undercut 1024 at bottom of the micro-trench 1022 and micro-fence 1021 is created by the over-etching. The micro-fence 1021 is overhanging after the micro-undercut formation but it is connected to the rest second silicon layer with overhanging micro-bridges that are not shown in FIG. 10I.

After forming the micro-undercuts in the second silicon layer, the buried silicon dioxide layer 1002 is exposed at the bottom surfaces of the micro-trenches and the circular cavities. RIE etching with $CHF_3$ gas and a small percentage of oxygen is conducted to etch away the silicon dioxide layer. Alternatively, time-controlled diluted HF etching, or vapor HF etching may be used to remove the exposed silicon dioxide layer. Next, the first silicon layer protective layer 1017 and remaining masking layer 1018 are fully removed. Isotropic oxygen plasma etching may be used to remove the organic protective layer. With the full removal of the protective layer 1017, the chip boundary micro-trenches 1016 in the first silicon layer and 1020 in the second silicon layer are connected. As a result, the chip 1025 is separated from the wafer as shown in FIG. 10J.

Figure 10K:
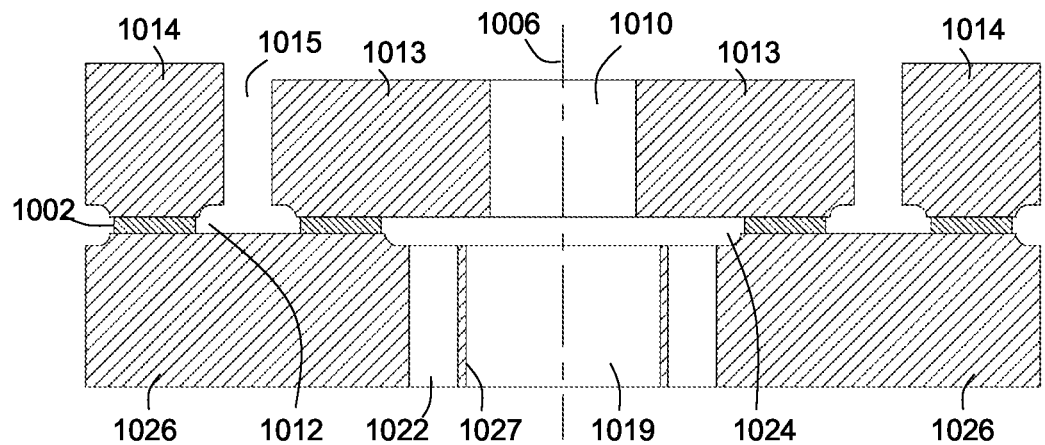

FIGS. 10K-10N illustrate the chip-level fabrication process. FIG. 10K shows the silicon structures of the single-pole chip after its singulation from the wafer-level process. The charged particle beam path is provided by the circular opening 1010 in the first silicon layer and larger circular opening 1019 in the second silicon layer. 1006 shows the optical axis of the charged particle beam. The circular opening 1010 in the first silicon layer is formed by ring-shape recessed silicon island structure 1013, which is used to make the annular electrode. In the first silicon layer, silicon island structure 1013 is surrounded by ground island structures 1014 with micro-trenches 1015 between them. Micro-undercuts 1012 are at the bottom of the micro-trench 1015 surrounding the island structures 1013 and 1014. The island structures 1013 and 1014 are supported by the second silicon layer through the buried silicon dioxide layer 1002. As shown in FIG. 10K, only ground structure 1026 is formed in the second silicon layer. Alternatively, electrode island structures may also be formed in the second silicon layer using the process described for the first silicon layer. When both electrode and ground island structures are made in both the first silicon layer and second silicon layer, the micro-trench patterns on the two silicon layers cannot overlap, so that the island structures on both silicon layers can be mutually supported. The ground structures of the second silicon layer include the circular opening 1019 for providing the charged particle beam path with optical axis 1006. A circular micro-fence 1027 is formed concentric to the circular opening 1019. In other word, the circular micro-fence 1027 forms the circumference of the circular cavity 1019. The purpose of forming the overhanging micro-fence 1027 is to form the circular micro-trench 1022 and the micro-undercut 1024. Overhanging micro-bridges connect the overhanging micro-fence to the rest ground silicon structure. The micro-bridges are not shown in FIG. 10K, but they are shown in FIG. 2C. The combined micro-structures of micro-fence, micro-bridges, micro-trenches, and micro-undercuts form a built-in micro-shadow mask to enable the pre-structured metal deposition process.

Figure 10L:
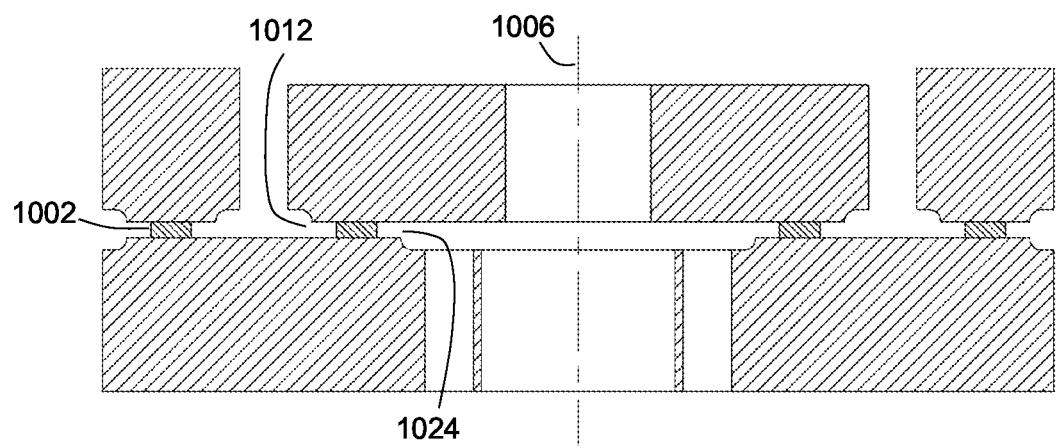

As shown in FIG. 10L, if the sizes of the micro-undercuts must be increased, the buried silicon dioxide layer is first etched in a controlled amount from its exposed sidewall surfaces in the micro-undercuts 1012 and 1024. The buried silicon dioxide undercutting etching may be conducted using diluted hydro-fluoride (HF) solutions or using vapor HF. After the HF etching, the micro-undercuts are made deeper in the lateral direction as shown in FIG. 10L. The next step is to conduct a thermal oxidation process to have a thin layer of silicon dioxide grown on all the exposed silicon surfaces. The grown silicon dioxide layer is then etched away by the same method as the first step. The silicon thermal oxidation consumes silicon from the original silicon surface and incorporates the consumed silicon in the newly grown silicon dioxide layer. After the thermal oxidation and oxide etching process, the micro-undercuts are made not only deeper in the lateral direction, but also higher in the vertical direction. Therefore, a single cycle or multiple cycles of the oxidation and oxide etching process may be conducted for forming micro-undercuts with specific sizes and shapes at the buried silicon dioxide interfaces. For the simplicity of the drawing, FIG. 10L only illustrates the cross-section of the chip after a single time-controlled HF etching step to show the formation of inner portions of the micro-undercuts by this method. The HF silicon dioxide etching, and thermal oxidation processes also provide another advantage of the devices in this technology. The etched silicon surfaces are made smoother and have fewer particles after each cycle of thermal oxidation and HF oxide removal process. As a result, many surface protrusions in micro or nano scales may be removed. The smoother and cleaner surfaces provided by this process significantly reduce the chances of electrical discharging and breakdowns in confined micro spaces when strong electric fields are applied to influence the charged particle beams.

Figure 10M:
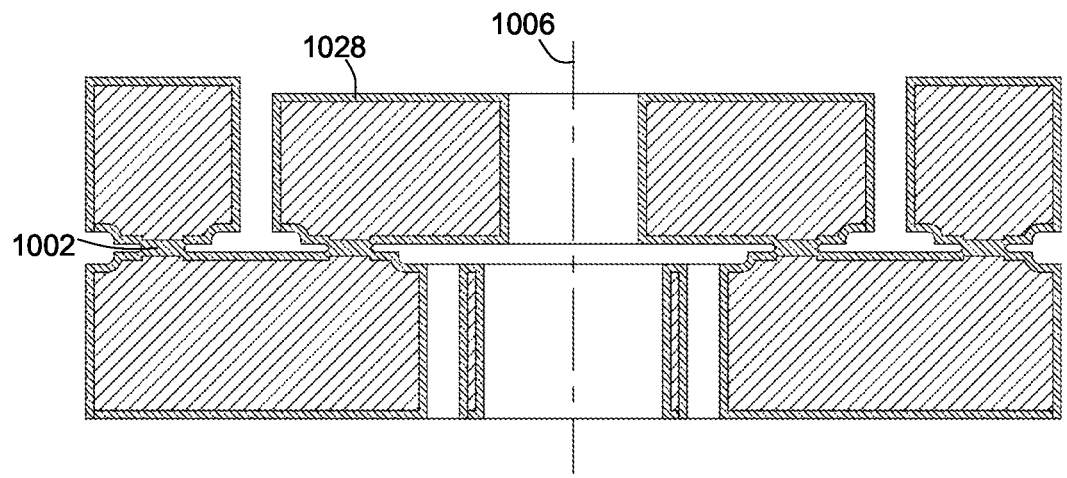

As shown in FIG. 10M, a final silicon thermal oxidation process is conducted to grow a thin layer of silicon dioxide 1028 on all the exposed silicon surfaces. The grown oxide thickness may be in the range of 0.1 µm to 10 µm, for example in the range of 0.1 µm to 2 µm. The silicon thermal oxidation may be a commonly used wet oxidation process at temperatures between 800° C. to 1200° C., for example at around 1100° C. After the chip-level silicon thermal oxidation process, all the silicon surfaces, including the inner surfaces of all the micro-undercuts and the sidewall surfaces of chip edges are fully encapsulated by the silicon dioxide layer 1028.

Figure 10N:
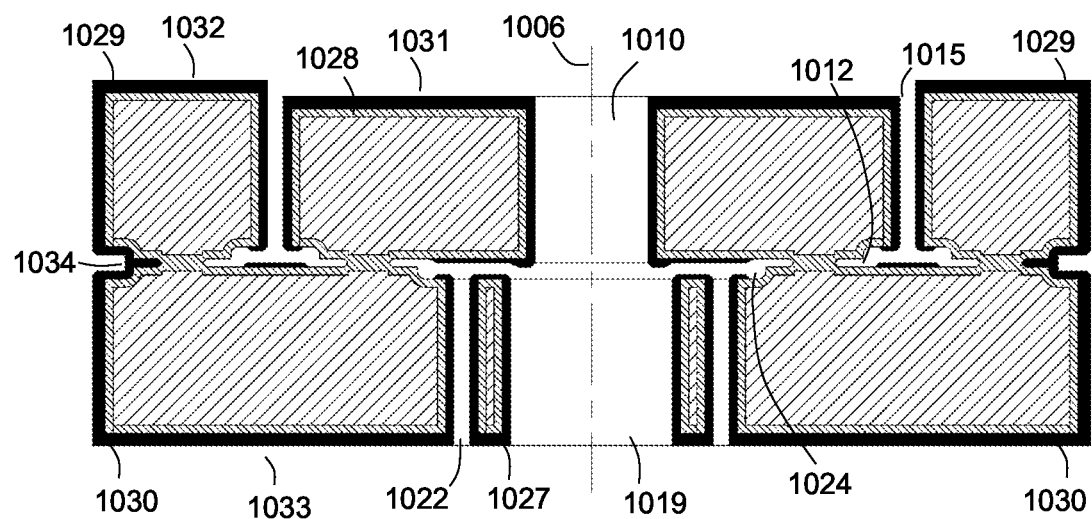

FIG. 10N shows the cross-sectional view schematic illustration of the single-beam single-pole device after its chip-level pre-structured conductive layer deposition processes. Metal deposition methods include but are not limited to physical vapor depositions (PVD), such as sputtering and e-beam evaporation. A sputtering deposition process is normally conducted at higher deposition pressures than evaporation pressures. For example, a sputtering pressure may be in the range of 0.2 pascal to 2 pascal and an evaporation pressure may be in the range of 10 micro-pascal to 100 micro-pascal. In a metal sputtering process, the excess energy of the ions also increases the surface mobility of the ions of the depositing material. As a result, a sputtering metal deposition process provides metal film coverage on all the exposed surfaces of the structured chip, except the surfaces shadowed by the built-in micro-shadow-masking structures. On the other hand, a metal evaporation deposition process provides a line-of-sight deposition due to its much lower vacuum deposition pressures.

The chip-level metal deposition process includes at least two steps of metal sputtering processes. One sputtering process is to deposit metal layers 1029 from the top, which is the first silicon layer side. Another sputtering process is to deposit metal layers 1030 from the bottom, which is from the second silicon layer side. A metal evaporation process may be optionally conducted to deposit a thicker metal film on either the top or the bottom surfaces of the chip by having the top or bottom surfaces placed to face the direction of the line-of-sight relative to the evaporation source. The evaporated thick metal film is used for making external electrical connections such as wire-bonding or direct metal probe or pin contacts. The metal contact pads and the electrode and ground routings are not shown in FIG. 10N, but they are illustrated and described in FIG. 6A and FIG. 6B. The deposited metal films 1029 and 1030 may have a single metal layer that may include but is not limited to titanium. The thickness of the single metal film may be in the range of 0.1 µm to 0.5 µm. Alternatively, the thin conductive film may include an inner adhesion layer and an outer conductive layer that are deposited in the same deposition process. The outer conductive layer may be a material that resists surface oxidation and corrosions. Examples of the thin inner adhesion layer materials include but are not limited to titanium, titanium tungsten, and chrome. Examples of the outer conductive layer materials include but are not limited to gold, platinum, and molybdenum. The thickness of the inner adhesion layer may be in the range of 0.01 µm to 0.05 µm. The thickness of outer metal layer may be in the range of 0.1 µm to 0.5 µm.

After conducting a metal sputtering deposition from the top of the chip, as shown in FIG. 10N, the top surfaces and sidewall surfaces of the electrode islands 1031 and ground islands 1032 are fully covered by the sputtered metal layer 1029. The cylindrical sidewall surfaces of circular beam path opening 1010 and 1019 are also covered by the sputtered metal layers. Because of the built-in shadow-masking effects provided by the micro-trench 1015, the metal thickness on the sidewalls of micro-trench 1015 is progressively reduced towards the bottom of the micro-trench. The metal layer 1029 does not reach the hidden inner surfaces of the micro-undercut 1012 due to the built-in shadow-masking effects of the micro-trench 1015 and the micro-undercuts 1012. As a result, the uncoated dielectric surfaces in the micro-undercuts 1012 create discontinuities in the sputtered metal layer 1029. Therefore, the metal layers 1029 on the electrode islands 1031 and ground islands 1032 are physically separated and electrically unconnected. After the metal sputtering deposition from the bottom of the chip, the bottom surfaces and sidewall surfaces of the ground structure 1033, including the surfaces of micro-fence 1027, are fully covered by the sputtered metal layer 1030. The cylindrical sidewall surfaces of circular beam path openings 1019 and 1010 are also covered by the sputtered metal layer 1030. The fully metallized cylindrical surfaces of 1010 and 1019 prevents trapping of charged particles along the beam paths. Because of the built-in shadow-masking effects provided by the micro-fence 1027, micro-trench 1022, and micro-undercuts 1024, the metal thickness on the sidewalls of micro-trench 1022 is progressively reduced towards the bottom of the micro-trench, and the metal layer 1030 does not reach the hidden inner surfaces of the micro-undercut 1024. As a result, the uncoated dielectric surfaces in the micro-undercuts 1024 create discontinuities between the sputtered metal layers on the top electrode island 1031 and the bottom ground metal layer 1030. On the other hand, since the micro-undercuts 1034 at chip edges are open without shadowing effects from micro-trenches, the metal layers 1029 and 1030 on the ground structures 1032 and 1033 may be physically and electrically connected through the edges of the chip. The top ground island electrical connection to the bottom ground layer allows for a single-side external ground contact and provides additional electrode ground shielding from their bottom. Both the metal sputtering and evaporation processes are pre-structured without the needs of conducting metal patterning and etching after the metal deposition. As a result, particle contaminations associated with metal patterning and etching processes on micro-structures with high-aspect ratios are avoided.

To illustrate another method of forming the micro-undercuts and the shallow silicon recesses, FIG. 11 shows another example of a microfabrication process corresponding to the flow diagram in FIG. 8. FIGS. 11A-11N are partial cross-sectional view schematic illustrations after the key fabrication process steps. In the fabrication process flow of FIG. 11, the micro-undercuts for the first layer silicon islands are isotropically etched in the second silicon layer. Vice versa, the micro-undercuts for the second layer silicon islands are isotropically etched in the first silicon layer. In addition, the shallow silicon recess etching is conducted simultaneously in the same isotropic silicon etching step of the micro-undercuts. A single-pole device to influence a single charged particle beam is used to illustrate the example of fabrication process. The illustrated and described methods of fabrication are also applicable to the fabrication processes for making the multi-pole devices and the arrayed devices to influence multiple charged particle beams.

FIG. 11A shows a partial cross-sectional view schematic illustration of a starting wafer 1100. The wafer comprises a first silicon layer 1101, a second silicon layer 1103, and a buried silicon dioxide layer 1102 disposed between the first and the second silicon layers. The first silicon layer is also referred to as the top silicon layer and the second silicon layer is referred to as the bottom silicon layer. When a commercially available silicon-on-insulator (SOI) wafer with specified layer thicknesses is used, the first silicon layer is often referred to as the device layer and the second silicon layer is often referred to as the handle layer. Micro-structures including the electrode and ground structures may be formed in either or both silicon layers. The choice of the first silicon layer to be processed depends on the structure complexities. Some processing steps of the second silicon layer may need to be conducted by placing the wafer on a carrier wafer with the structured first silicon layer protected and facing down on the carrier wafer. Therefore, it is often more convenient to choose the silicon layer that has more processing steps and tighter geometry and process control requirements as the first silicon layer. As a result, the number of processing steps that needs to be conducted with the carrier wafer is reduced. One method of forming the starting wafer is referred to as silicon fusion bonding. Two double-side polished single-crystal silicon wafers are thoroughly cleaned before bonding with standard and commonly used wafer pre-oxidation cleaning methods in semiconductor IC fabrication and micro-electromechanical system (MEMS) fabrication processes. After growing a silicon dioxide layer with specified thickness on one of the two wafers in a thermal oxidation process, the second double-side polished single-crystal silicon wafer is bonded on the oxide surface on the first wafer. The wafer bonding is initiated at room temperature and then annealed at temperatures between 700° C. to 1100° C. Then wafer lapping and polishing processes are conducted to reduce the first silicon layer and second silicon layer to their specified thicknesses.

FIG. 11B shows a partial cross-sectional view schematic illustration of the wafer after patterning of the masking layer on its first silicon layer. The patterned masking layer 1105 is used for the trench and cavity silicon etching as well as the micro-undercut silicon etching. Examples of the masking materials include but are not limited to patterned photoresist. As shown in FIG. 11B, the center line of the charged particle beam transmission path is shown as the dashed line 1106. The masking layer opening for the charged particle beam transmission path 1106 is a circular opening. The diameter of the circular opening may be in the range of 10 µm to 1000 µm, for example in the range of 50 m to 250 µm. Locations 1107 are the electrode shallow recess forming locations. The mask openings 1108 are used to make silicon micro-trenches and their opening widths may be in the range of 1 µm to 100 µm, for example in the range of 3 µm to 30 µm.

As shown in FIG. 11C, silicon DRIE etching is first conducted to form micro-trenches 1109 and circular cavities 1110 with the patterned masking layer 1105. The silicon DRIE etching is stopped when the buried silicon dioxide surfaces are reached on the bottom of all the openings. Then reactive ion etching (RIE) with $CHF_3$ gas with a small portion of oxygen may be used to selectively etch the silicon dioxide layer at bottom surfaces of the etched silicon openings. Alternatively, the silicon dioxide layer may be etched by time-controlled HF solution etching or HF vapor etching.

As shown in FIG. 11D, after the silicon dioxide etching, the masking layer 1105 is removed to expose the silicon surfaces. To form the micro-undercuts and the shallow silicon recesses in the first silicon layer, a surface protection layer 1111 is deposited by plasma deposition or a vapor phase deposition to cover the exposed surfaces. The purpose of the layer 1111 is to protect exposed silicon sidewall surfaces so that an isotropic silicon etching may be used for micro-undercut and the shallow recess silicon etching. Examples of the thin surface protection layer include PECVD silicon dioxide and polymer deposited from vapor phase. The thickness of layer 1111 may be in the range of 1 µm to 10 µm. The stress in the protection layer 1111 may be low so that it can be intact at the edges of the silicon islands during the silicon etching.

Next, as shown in FIG. 11E, photolithography using the laminated dry film photoresist layer 1104 is used to pattern the top surface areas of the first silicon layer. The dry-film photoresist layer 1104 is laminated at atmospheric pressure by using a hot-roll laminator or laminated in vacuum by using a heated diaphragm laminator. The laminated dry-film photoresist is then UV exposed using a photomask with alignment. Alternatively, spray coated photoresist may be used instead of the dry film photoresist. After the dry film developing, a directional RIE etching process is conducted to selectively etch the protection layer 1111 using the patterned dry film as the etching masking layer. The RIE process only etches away the protection layer 1111 on the top surfaces of island 1113 and surface at bottom of trenches 1109 and cavities 1110. After the RIE etching, the silicon surfaces on top of silicon islands 1113 and at bottom of trenches 1109 and cavities 1110 are exposed. The protection layer 1111 is left on the sidewall surfaces of the silicon openings and on dry film protected top surfaces of silicon islands 1114.

Next, as shown in FIG. 11F, an isotropic silicon etching is used for the micro-undercut silicon etching and shallow recess silicon etching in the same etching process step. The micro-undercuts 1112 of the silicon islands in the first silicon layer are formed by etching the second silicon layer at the bottom surfaces of 1109 and cavities 1110. The etched micro-undercut may be 5 µm high and 15 µm deep in the lateral direction. This method of forming micro-undercuts may also be used to form overhanging micro-bridges and other partially overhanging micro-structures. When micro-undercuts are etched from the sides of a narrow and long silicon structure, the etching fronts of the undercutting etching may meet at the narrowest portion first and create an overhanging portion of the silicon structure. The length of the overhanging portion may be determined by the controlled etching time and the structural design. Wider portions of the silicon structure support the overhanging portions as shown in FIG. 7. In the same micro-undercut silicon etching process, the shallow silicon recesses are also formed at locations 1113. During the recess silicon etching, the protruded portions 1111a of protection layer 1111 is used to protect the edges of the silicon islands being etched.

After removing the remaining dry film masking layer 1104 and sidewall protection layers 1111, the first silicon layer micro-structuring process is completed. Next, the structured first silicon layer may be protected by applying a temporary protection layer 1117 as shown in FIG. 11G. The formed micro-structures in the first silicon layer include the recessed silicon islands 1113 for the electrode islands and the silicon islands 1114 for the ground islands. Micro-trenches 1115 with micro-undercuts 1112 surround and separate the electrode islands and ground islands. Micro-trenches 1116 define the boundary of the devices and they are used for the chip singulation with the corresponding micro-trenches to be made in the second silicon layer. The circular opening 1110 forms the charged particle beam path in the first silicon layer. As described in earlier sections, the electrode and ground islands are in elongated shapes. One end of each electrode island is an annular shaped electrode island 1113 or an arc-shaped electrode island and they form the charged particle beam path opening 1110. The elongated electrode and ground islands 1113 and 1114 also serve as routing lines and they reach the edges of the devices for making external electrical contacts. The material of the coated protection layer 1117 may be an organic material dissolved in a solvent and solidified by applying heat. The coating process may be spray coating, dispensing, dip coating, low speed spin coating or a combination of these methods. The layer 1117 may also be a polymer layer that is deposited from vapor phase. The coated layer 1117 provides surface protection of the first silicon layer to prevent it from being affected when the second silicon layer is being processed. The coated layer 1117 at least partially fills the deep and narrow micro-trenches and at least partially planarizes the wafer surfaces of the first silicon layer. With the protection layer 1117, processing the second silicon layer can share most processing equipment and processing conditions as with the first silicon layer. In this process flow example, the second silicon layer is only made as a ground layer. The silicon recess making process is not included in the second silicon structuring process. However, if needed, the silicon recess making process described for the first silicon layer structuring can be applied to the second silicon layer structuring.

Also shown in FIG. 11G, the processing of the second silicon layer starts from applying and patterning a photoresist masking layer 1118. The patterns of 1118 are aligned to the alignment features made on the first silicon layer, and the alignment accuracy may be +/−2 μm or better. The pattern opening 1119 in photoresist layer 1118 is a circular opening for making the charged particle beam path in the second silicon layer. The pattern opening of 1120 in the photoresist layer 1118 is an enclosed micro-trench opening pattern for defining the boundary of the chip on the wafer. The pattern 1121 is a circular micro-fence pattern for forming the circular micro-trench opening 1122 in the photoresist layer 1118.

As shown in FIG. 11H, the second layer silicon anisotropic etching is also conducted by deep reactive ion etching (DRIE) process using the masking layer 1118. The DRIE silicon etching process is stopped after the silicon DRIE etching reaches the buried silicon dioxide layer and the protection layer 1117 at the bottom surfaces of the micro-trenches 1120 and 1122, and circular cavity 1119. Then a reactive ion etching (RIE) with $CHF_3$ gas with a small portion of oxygen may be used to selectively etch the silicon dioxide layer at bottom surfaces of the etched silicon openings. Alternatively, the silicon dioxide layer may be etched by time-controlled HF solution etching or HF vapor etching.

As shown in FIG. 11I, after the silicon dioxide etching and before removing the masking layer 1118, a thin layer of surface protection layer 1123 is deposited by plasma deposition or a vapor phase deposition to the exposed surfaces. Examples of the thin surface protection layer include PECVD silicon dioxide and fluorocarbon film deposited from the $C_4F_8$ plasma. The film thickness may be in the range of 0.1 μm to 1 μm, depending on their silicon etching selectivity ratios. Then RIE etching of the thin protective layer 1123 is performed to selectively remove the protective layer from the bottom surfaces of the circular cavity 1119 and the micro-trenches 1120 and 1122. At the same time, the protection layer 1123 on top of the masking layer 1118 is also etched away including a small portion of layer 1118. After the RIE process, the protective layer 1123 is only left on the sidewall surfaces. There is remaining masking layer 1118 left on the bottom surface to protect the silicon surfaces. Next, as shown in FIG. 11I, an isotropic silicon etching is used for the micro-undercut silicon etching. The micro-undercuts 1124 of the silicon islands in the second silicon layer are formed by etching the first silicon layer at the bottom surfaces of 1122 and cavities 1119. The etched micro-undercut may be 5 μm high and 15 μm deep in the lateral direction. This method of forming micro-undercuts is used to form overhanging micro-bridges and other partially overhanging micro-structures. When micro-undercuts are etched from the sides of a narrow and long silicon structure, the etching fronts of the undercutting etching may meet at the narrowest portion first and create an overhanging portion of the silicon structure. The length of the overhanging portion may be determined by the controlled etching time and the structural design. Wider portions of the silicon structure support the overhanging portions as shown in FIG. 7.

Next, the first silicon layer protective layer 1117, the sidewall protection layer 1123, and second silicon layer masking layer 1118 are fully removed. Isotropic oxygen plasma etching may be used to remove the organic protective layer. With the full removal of the protective layer 1117, the chip boundary micro-trenches 1116 in the first silicon layer and 1120 in the second silicon layer are connected. As a result, the chip 1125 is separated from the wafer as shown in FIG. 11J.

Figure 11K:
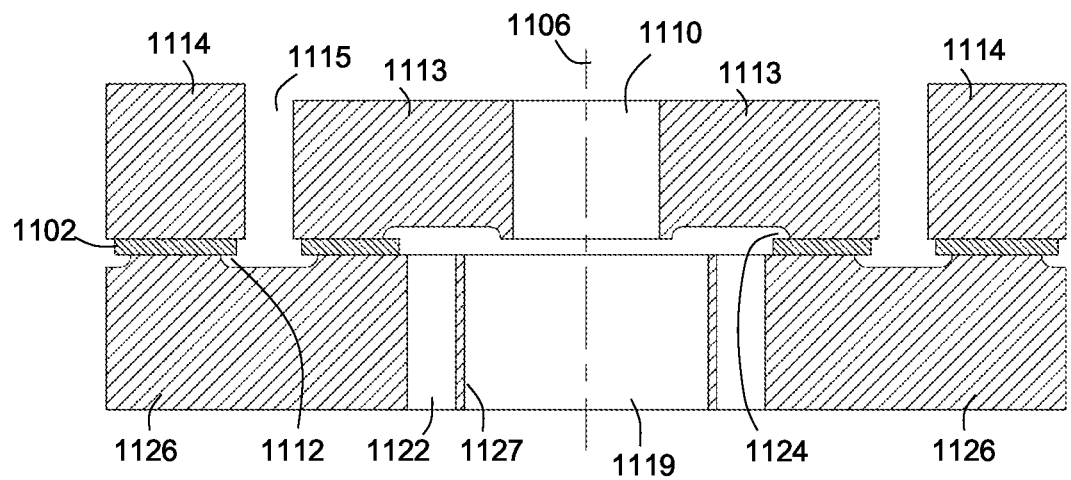
FIGS. 11A-11N are cross-sectional view schematic illustrations of another device microfabrication process after its key microfabrication process steps corresponding to the flow diagram in FIG. 8.

FIGS. 11K-11N illustrate the chip-level fabrication process. FIG. 11K shows the silicon structures of the single-pole chip after its singulation from the wafer-level process. The charged particle beam path is provided by the circular opening 1110 in the first silicon layer and larger circular opening 1119 in the second silicon layer. 1106 shows the optical axis of the charged particle beam. The circular opening 1110 in the first silicon layer is formed by ring-shape recessed silicon island structure 1113, which is used to make the annular electrode. In the first silicon layer, silicon island structure 1113 is surrounded by ground island structures 1114 with micro-trenches 1115 between them. Micro-undercuts 1112 are at the bottom of the micro-trench 1115 surrounding the island structures 1113 and 1114. The island structures 1113 and 1114 are supported by the second silicon layer through the buried silicon dioxide layer 1102. As shown in FIG. 11K, only ground structure 1126 is formed in the second silicon layer. Alternatively, electrode island structures may also be formed in the second silicon layer using the process described for the first silicon layer. When both electrode and ground island structures are made in both the first silicon layer and second silicon layer, the micro-trench patterns on the two silicon layers cannot overlap, so that the island structures on both silicon layers can be mutually supported. The ground structures of the second silicon layer include the circular opening 1119 for providing the charged particle beam path with optical axis 1106. A circular micro-fence 1127 is formed concentric to the circular opening 1119. In other word, the circular micro-fence 1127 forms the circumference of the circular cavity 1119. The purpose of forming the overhanging micro-fence 1127 is to form the circular micro-trench 1122 and the micro-undercut 1124. Overhanging micro-bridges connect the overhanging micro-fence to the rest ground silicon structure. The micro-bridges are not shown in FIG. 11K, but they are shown in FIG. 2C. The combined micro-structures of micro-fence, micro-bridges, micro-trenches, and micro-undercuts form a built-in micro-shadow mask to enable the pre-structured metal deposition process.

Figure 11L:
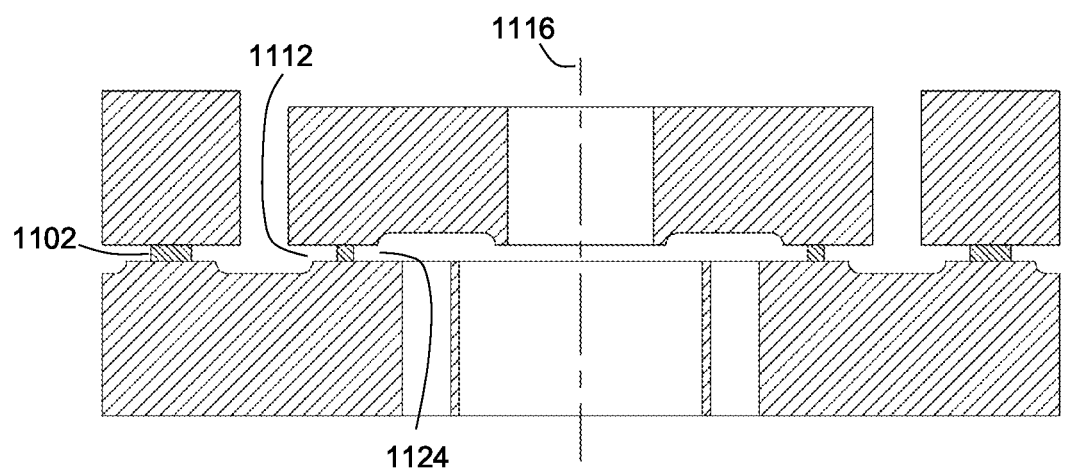

As shown in FIG. 11L, if the sizes of the micro-undercuts must be increased, the buried silicon dioxide layer is first etched in a controlled amount from its exposed sidewall surfaces in the micro-undercuts 1112 and 1124. The buried silicon dioxide undercutting etching may be conducted using diluted hydro-fluoride (HF) solutions or using vapor HF. After the HF etching, the micro-undercuts are made deeper in the lateral direction as shown in FIG. 11L. The next step is to conduct a silicon thermal oxidation process to have a thin layer of silicon dioxide grown on all the exposed silicon surfaces. The grown silicon dioxide layer is then etched away by the same method of the first step. Since silicon thermal oxidation consumes silicon from the original silicon surface and incorporates the consumed silicon in the newly grown silicon dioxide layer, after the thermal oxidation and oxide etching process, the micro-undercuts are made not only deeper in the lateral direction, but also higher in the vertical direction. Therefore, a single cycle or multiple cycles of the oxidation and oxide etching process may be conducted for forming micro-undercuts with specific sizes and shapes at the buried silicon dioxide interfaces. For the simplicity of the drawing, FIG. 11L only illustrates the cross-section of the chip after a single time-controlled HF etching step to show the formation of inner portions of the micro-undercuts by this method. The HF silicon dioxide etching and silicon thermal oxidation processes also provide another advantage of the devices in this technology. The etched silicon surfaces are made smoother and have fewer particles after each cycle of thermal oxidation and HF oxide removal process. As a result, many surface protrusions in micro or nano scales may be removed. The smoother and cleaner surfaces provided by this process significantly reduce the chances of electrical discharging and breakdowns in confined micro spaces when strong electric fields are applied to influence the charged particle beams.

Figure 11M:
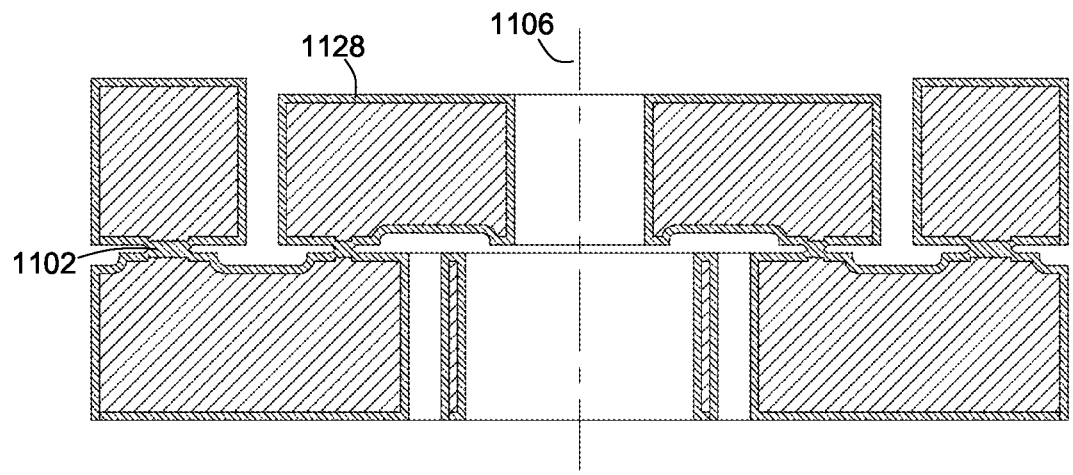

As shown in FIG. 11M, a final silicon thermal oxidation process is conducted to grow a thin layer of silicon dioxide 1128 on all the exposed silicon surfaces. The grown oxide thickness may be in the range of 0.1 μm to 10 μm, for example in the range of 0.2 μm to 2 μm. The thermal oxidation may be a commonly used wet oxidation process at temperatures between 800° C. to 1200° C., for example at around 1100° C. After the chip-level thermal oxidation process, all the silicon surfaces, including the inner surfaces of all the micro-undercuts and the sidewall surfaces of chip edges are fully encapsulated by the silicon dioxide layer 1128.

Figure 11N:
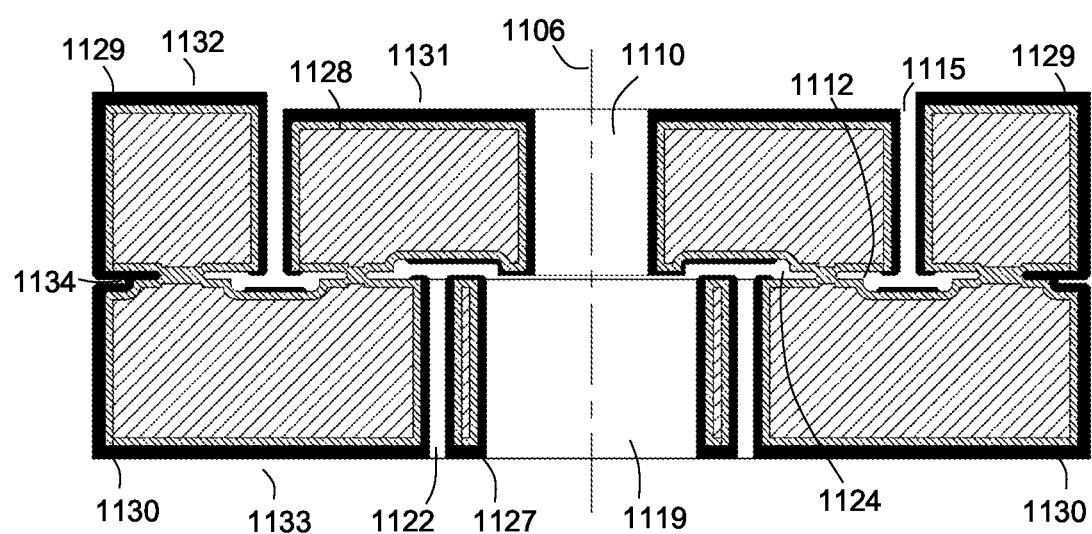

FIG. 11N shows the cross-sectional view schematic illustration of the single-beam single-pole device after its chip-level pre-structured conductive layer deposition processes. Metal deposition methods include but are not limited to physical vapor depositions (PVD), such as sputtering and e-beam evaporation. A sputtering deposition process is normally conducted at higher deposition pressures than evaporation pressures. For example, a sputtering pressure may be in the range of 0.2 pascal to 2 pascal and an evaporation pressure may be in the range of 10 micro-pascal to 100 micro-pascal. In a metal sputtering process, the excess energy of the ions also increases the surface mobility of the ions of the depositing material. As a result, a sputtering metal deposition process provides metal film coverage on all the exposed surfaces of the structured chip, except the surfaces shadowed by the built-in micro-shadow-masking structures. On the other hand, a metal evaporation deposition process provides a line-of-sight deposition due to its much lower vacuum deposition pressures.

The chip-level metal deposition process includes at least two steps of metal sputtering processes. One sputtering process is to deposit metal layers 1129 from the top, which is the first silicon layer side. Another sputtering process is to deposit metal layers 1130 from the bottom, which is from the second silicon layer side. A metal evaporation process may be optionally conducted to deposit a thicker metal film on either the top or the bottom surfaces of the chip by having the top or bottom surfaces placed to face the direction of the line-of-sight relative to the evaporation source. The evaporated thick metal film is used for making external electrical connections such as wire-bonding or direct metal probe or pin contacts. The metal contact pads, and the electrode and ground routings are not shown in FIG. 11N, but they are illustrated and described in FIG. 6A and FIG. 6B. The deposited metal films 1129 and 1130 may have a single metal layer that includes but not limited to titanium. The thickness of the single metal film may be in the range of 0.1 μm to 0.5 μm. Alternatively, the thin conductive film may include an inner adhesion layer and an outer conductive layer that are deposited in the same deposition process. The outer conductive layer may be a material that resists surface oxidation and corrosions. Examples of the thin inner adhesion layer materials include but are not limited to titanium, titanium tungsten, and chrome. Examples of the outer conductive layer materials include but are not limited to gold, platinum, and molybdenum. The thickness of the inner adhesion layer may be in the range of 0.01 μm to 0.05 μm. The thickness of outer metal layer may be in the range of 0.1 μm to 0.5 μm.

After conducting a metal sputtering deposition from the top of the chip, as shown in FIG. 11N, the top surfaces and sidewall surfaces of the electrode islands 1131 and ground islands 1132 are fully covered by the sputtered metal layer 1129. The cylindrical sidewall surfaces of circular beam path opening 1110 and 1119 are also covered by the sputtered metal layers. Because of the built-in shadow-masking effects provided by the micro-trench 1115, the metal thickness on the sidewalls of micro-trench 1115 is progressively reduced towards the bottom of the micro-trench. The metal layer 1129 does not reach the hidden inner surfaces of the micro-undercut 1112 due to the built-in shadow-masking effects of the micro-trench 1115 and the micro-undercuts 1112. As a result, the uncoated dielectric surfaces in the micro-undercuts 1112 create discontinuities in the sputtered metal layer 1129. Therefore, the metal layers 1129 on the electrode islands 1131 and ground islands 1132 are physically separated and electrically unconnected. After the metal sputtering deposition from the bottom side of the chip, the bottom surfaces and sidewall surfaces of the ground structure 1133, including the surfaces of micro-fence 1127, are fully covered by the sputtered metal layer 1130. The cylindrical sidewall surfaces of circular beam path openings 1119 and 1110 are also covered by the sputtered metal layer 1130. The fully metallized cylindrical surfaces of 1110 and 1119 prevent trapping of charged particles along the beam paths. Because of the built-in shadow-masking effects provided by the micro-fence 1127, micro-trench 1122, and micro-undercuts 1124, the metal thickness on the sidewalls of micro-trench 1122 is progressively reduced towards the bottom of the micro-trench, and the metal layer 1130 does not reach the hidden inner surfaces of the micro-undercut 1124. As a result, the uncoated dielectric surfaces in the micro-undercuts 1124 create discontinuities between the sputtered metal layers on the top electrode island 1131 and the bottom ground metal layer 1130. On the other hand, since the micro-undercuts 1134 at chip edges are open without shadowing effects from micro-trenches, the metal layers 1129 and 1130 on the ground structures 1132 and 1133 may be physically and electrically connected through the edges of the chip. The top ground island electrical connection to the bottom ground layer allows for a single-side external ground contact and provide additional electrode ground shielding from their bottom. Both the metal sputtering and evaporation processes are pre-structured without the needs of conducting metal patterning and etching after the metal deposition. As a result, particle contaminations associated with metal patterning and etching processes on micro-structures with high-aspect ratios are avoided.

To illustrate another method of forming the micro-undercuts and the shallow silicon recesses, FIG. 12 shows another example of a microfabrication process corresponding to the flow diagram in FIG. 8. FIGS. 12A-12N are partial cross-sectional view schematic illustrations after the key fabrication process steps. In the fabrication process flow of FIG. 12, the micro-undercuts for the first layer silicon islands and the second silicon layer are made by time-controlled buried silicon dioxide etching and enlarged by repeated cycles of silicon thermal oxidation and silicon dioxide removal. The shallow silicon recess etching is conducted by anisotropic silicon etching using a patterned dry film photoresist layer. A single-pole device to influence a single charged particle beam is used to illustrate the example of fabrication process. The illustrated and described methods of fabrication are also applicable to the fabrication processes for making the multi-pole devices and the arrayed devices to influence multiple charged particle beams.

Figure 12A:
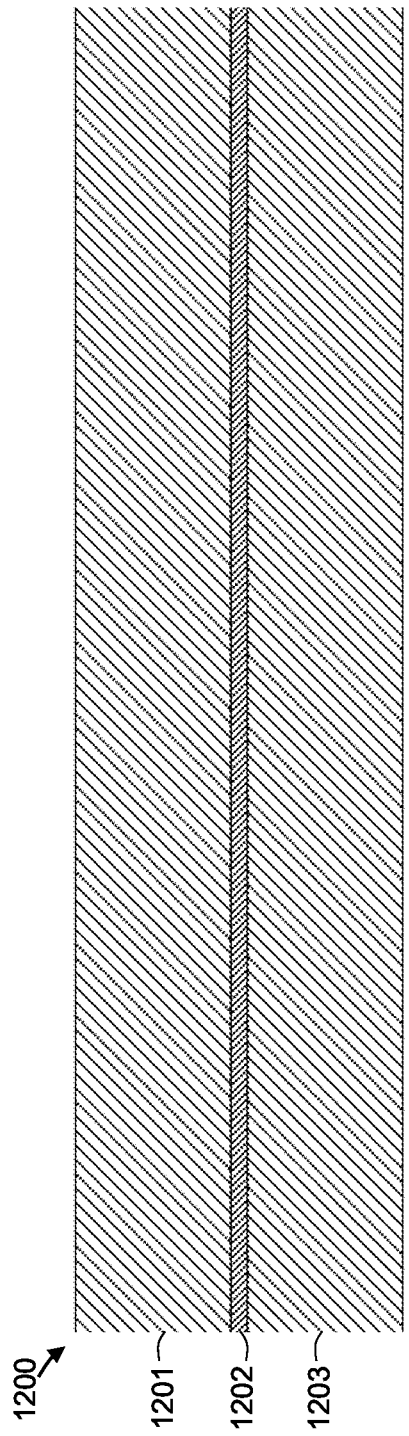
FIGS. 12A-12N are cross-sectional view schematic illustrations of another device microfabrication process after its key microfabrication process steps corresponding to the flow diagram in FIG. 8.

FIG. 12A shows a partial cross-sectional view schematic illustration of a starting wafer 1200. The wafer comprises a first silicon layer 1201, a second silicon layer 1203, and a buried silicon dioxide layer 1202 disposed between the first and the second silicon layers. The first silicon layer is also referred to as the top silicon layer and the second silicon layer is referred to as the bottom silicon layer. When a commercially available silicon-on-insulator (SOI) wafer with specified layer thicknesses is used, the first silicon layer is often referred to as the device layer and the second silicon layer is often referred to as the handle layer. Micro-structures including the electrode and ground structures may be formed in either or both silicon layers. The choice of the first silicon layer to be processed depends on the structure complexities. Some processing steps of the second silicon layer may need to be conducted by placing the wafer on a carrier wafer with the structured first silicon layer protected and facing down on the carrier wafer. Therefore, it is often more convenient to choose the silicon layer that has more processing steps and tighter geometry and process control requirements as the first silicon layer. As a result, the number of processing steps that needs to be conducted with the carrier wafer is reduced. One method of forming the starting wafer is referred to as silicon fusion bonding. Two double-side polished single-crystal silicon wafers are thoroughly cleaned before bonding with standard and commonly used wafer pre-oxidation cleaning methods in semiconductor IC fabrication and micro-electromechanical system (MEMS) fabrication processes. After growing a silicon dioxide layer with specified thickness on one of the two wafers in a silicon thermal oxidation process, the second double-side polished single-crystal silicon wafer is bonded on the oxide surface on the first wafer. The wafer bonding is initiated at room temperature and then annealed at temperatures between 700° C. to 1100° C. Then wafer lapping and polishing processes are conducted to reduce the first silicon layer and second silicon layer to their specified thicknesses. The thicknesses of the silicon layers may be in the range of 10 μm to 1000 μm, for example ranging from 100 μm to 500 μm. The thickness of the buried silicon dioxide layer may be in the range of 0.1 μm to 10 μm, for example ranging from 0.5 μm to 5 μm. The lateral sizes of the electrostatic devices may be in the range of 1 mm×1 mm to 50 mm×50 mm. The wafer shapes and sizes include but are not limited to circular wafers with diameters of 100 mm, 150 mm, and 200 mm.

Figure 12B:
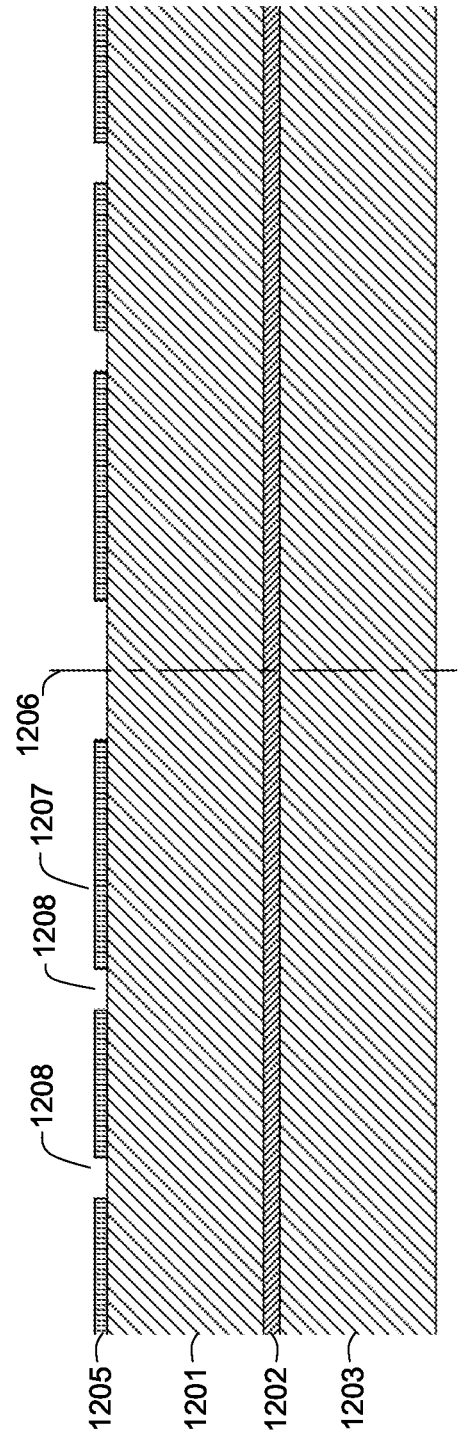

FIG. 12B shows a partial cross-sectional view schematic illustration of the wafer after patterning of the masking layer on its first silicon layer. The patterned masking layer 1205 is used for the trench and cavity silicon etching as well as the micro-undercut silicon etching. Examples of the masking materials include but are not limited to patterned photoresist. As shown in FIG. 12B, the center line of the charged particle beam transmission path is shown as the dashed line 1206. The masking layer opening for the charged particle beam transmission path 1206 is a circular opening. The diameter of the circular opening may be in the range of 10 μm to 1000 μm, for example in the range of 50 m to 250 μm. Locations 1207 are the electrode shallow recess forming locations. The mask openings 1208 are used to make silicon micro-trenches and their opening widths may be in the range of 1 μm to 100 μm, for example in the range of 3 μm to 30 μm.

Figure 12C:
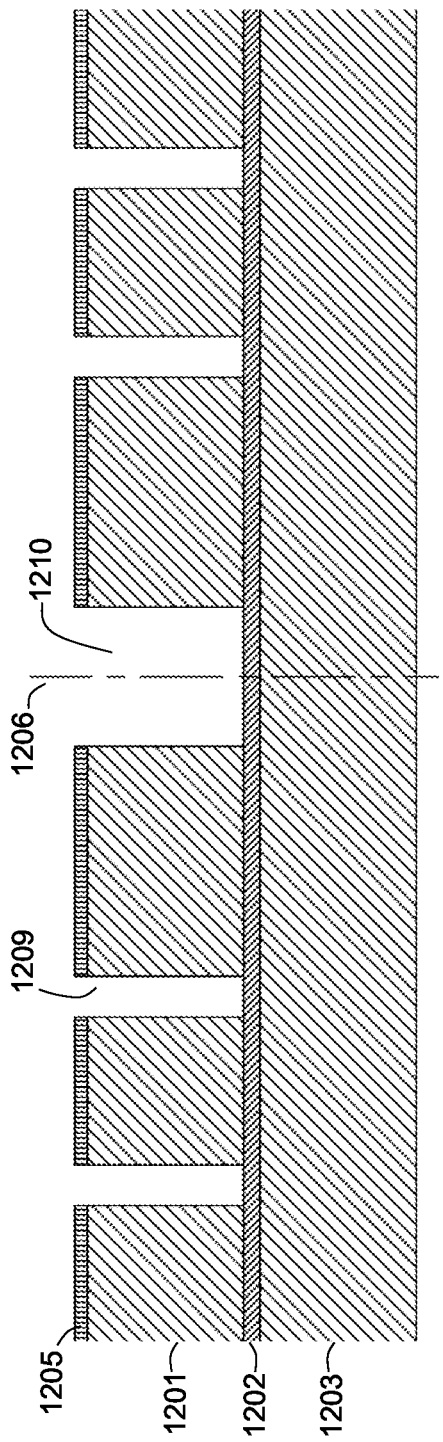

As shown in FIG. 12C, silicon DRIE etching is first conducted to form micro-trenches 1209 and circular cavities 1210 with the patterned masking layer 1205. The silicon DRIE etching is stopped when the buried silicon dioxide surfaces are reached on the bottom of all the openings. After the silicon DRIE etching, the silicon islands are formed.

Figure 12D:
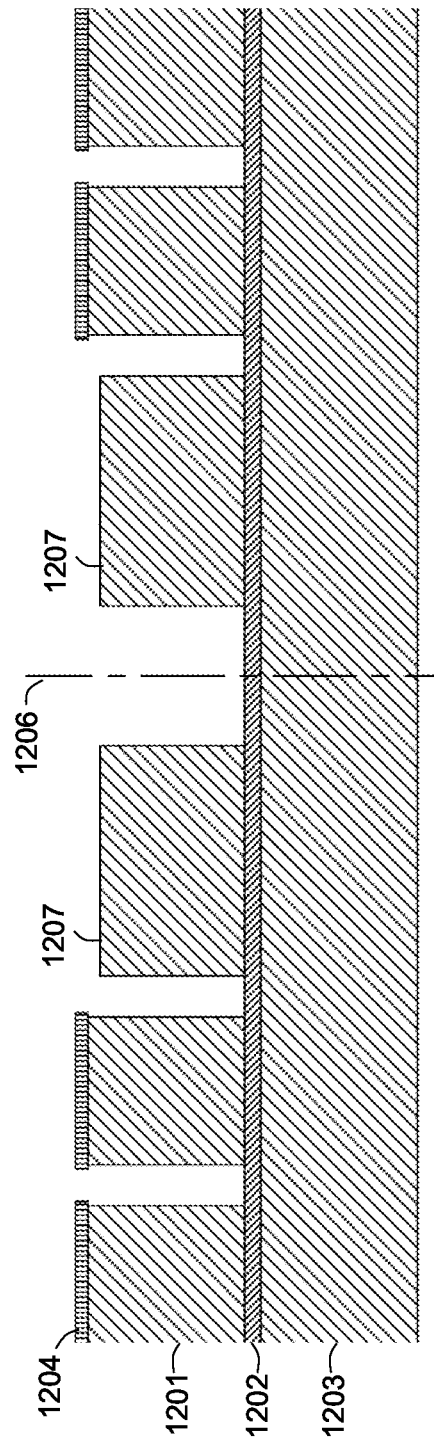

After forming the micro-trenches in the first silicon layer, the remaining masking layer 1205 is removed and the silicon surfaces of the structured first silicon layer are exposed. As shown in FIG. 12D, a photolithography step using dry film photoresist is conducted. The dry-film photoresist layer 1204 is laminated at atmospheric pressure by using a hot-roll laminator or laminated in vacuum by using a heated diaphragm laminator. The laminated dry-film photoresist is then UV exposed using a photomask with alignment to the silicon structures. In the next step, a time controlled DRIE etching is performed to form a recess on the exposed silicon surface 1207 with the masking layer 1204. The shallow silicon recess etching is anisotropic. In other words, the exposed sidewall silicon surfaces and edges of the exposed silicon islands are not to be attacked during the recess etch, which requires sufficient sidewall wall protection layer deposition in the $C_4F_8$ deposition cycles. On the other hand, the amount of $C_4F_8$ deposition may not be too much to avoid generating silicon grass on the etched silicon top surfaces and edges of the silicon islands. The depth of the recess may be in the range of 5 μm to 30 μm.

After forming the shallow silicon recesses, the remaining dry film photoresist is removed. Then the buried silicon dioxide layer is first etched in a controlled amount from its exposed sidewall surfaces to form the initial micro-undercuts 1212 by using diluted hydro-fluoride (HF) solutions or using vapor HF, as shown in FIG. 12E. To increase the size of the initial micro-undercuts 1212, a wafer-level silicon thermal oxidation process is conducted, and a thin layer of silicon dioxide 1211 is thermally grown on all the exposed silicon surfaces as shown in FIG. 12F. The thickness of the grown oxide may be in the range of 0.1 μm to m, for example in the range of 0.5 μm to 2 μm. The silicon thermal oxidation may be a commonly used wet oxidation process at temperatures between 800° C. to 1200° C., for example at around 1100° C., and the thermal oxidation process incorporates silicon into the grown silicon dioxide layer. Then, silicon dioxide 1211 is removed by HF solutions or HF vapor in a time-controlled etching process. After that, another cycle of thermal oxidation and oxide removal process can be optionally repeated.

As shown in FIG. 12G, after cycles of silicon thermal oxidation and oxide removal processes, the micro-undercuts 1212 are made deeper and taller as the silicon oxidation process consumes silicon. This method of forming micro-undercuts may be used to form overhanging micro-bridges and other partially overhanging micro-structures. When micro-undercuts are etched from the sides of a narrow and long silicon structure, the etching fronts of the undercutting etching may meet at the narrowest portion first and create an overhanging portion of the silicon structure. The length of the overhanging portion may be determined by the controlled etching time and the structural design. Wider portions of the silicon structure support the overhanging portions as shown in FIG. 7. As shown in FIG. 12G, the recessed silicon islands 1213 are for making the electrodes and the silicon islands 1214 are for making the grounds. Micro-trenches 1215 with micro-undercuts 1212 surround and separate the electrode islands and ground islands. Micro-trenches 1216 define the boundary of the devices and they are used for the chip singulation with the corresponding micro-trenches to be made in the second silicon layer. The circular opening 1210 forms the charged particle beam path in the first silicon layer. As described in earlier sections, the electrode and ground islands are in elongated shapes. One end of each electrode island is an annular shaped electrode island 1213 or an arc-shaped electrode island and they form the charged particle beam path opening 1210. The elongated electrode and ground islands 1213 and 1214 also serve as routing lines and they reach the edges of the devices for making external electrical contacts.

After completing the first silicon layer micro-structuring process, the structured first silicon layer may be protected by applying a temporary protection layer 1217 as shown in FIG. 12H. The material of the coated protection layer 1217 may be an organic material dissolved in a solvent and solidified by applying heat. The coating process may be spray coating, dispensing, dip coating, low speed spin coating or a combination of these methods. The layer 1217 may also be a polymer layer that is deposited from vapor phase. The coated layer 1217 provides surface protection of the first silicon layer to prevent it from being affected when the second silicon layer is being processed. The coated layer 1217 at least partially fills the deep and narrow micro-trenches and at least partially planarizes the wafer surfaces of the first silicon layer. With the protection layer 1217, processing the second silicon layer can share most processing equipment and processing conditions as with the first silicon layer. In this example of process flow, the second silicon layer is only made as a ground layer. The silicon recess making process is not included in the second silicon structuring process. However, if needed, the silicon recess making process described for the first silicon layer structuring can be applied to the second silicon layer structuring.

Also shown in FIG. 12H, the processing of the second silicon layer starts from applying and patterning a photoresist masking layer 1218. The patterns of 1218 are aligned to the alignment features made on the first silicon layer, and the alignment accuracy may be +/−2 μm or better. The pattern opening 1219 in photoresist layer 1218 is a circular opening for making the charged particle beam path in the second silicon layer. The pattern opening of 1220 in the photoresist layer 1218 is an enclosed micro-trench opening pattern for defining the boundary of the chip on the wafer. The pattern 1221 is a circular micro-fence pattern for forming the circular micro-trench opening 1222 in the photoresist layer 1218.

As shown in FIG. 12I, the second layer silicon anisotropic etching is also conducted by deep reactive ion etching (DRIE) process using the masking layer 1218. After the silicon DRIE etching reaches the buried silicon dioxide layer and the protection layer 1217 at the bottom surfaces of the micro-trenches 1220 and 1222, and circular cavity 1219, the DRIE silicon etching process is stopped. Then a reactive ion etching (RIE) with $CHF_3$ gas with a small portion of oxygen may be used to selectively etch the silicon dioxide layer at bottom surfaces of the etched silicon openings. Alternatively, the silicon dioxide layer may be etched by time-controlled HF solution etching or HF vapor etching. Micro-undercuts 1224 can be initially made by the buried oxide etching process. In the following chip-level process step, the micro-undercuts 1224 may be made deeper and larger.

Next, the first silicon layer protective layer 1217 and second silicon layer masking layer 1218 are fully removed. Isotropic oxygen plasma etching may be used to remove the organic protective layer. With the full removal of the protective layer 1217, the chip boundary micro-trenches 1216 in the first silicon layer and 1220 in the second silicon layer are connected. As a result, the chip 1225 is separated from the wafer as shown in FIG. 12J.

Figure 12K:
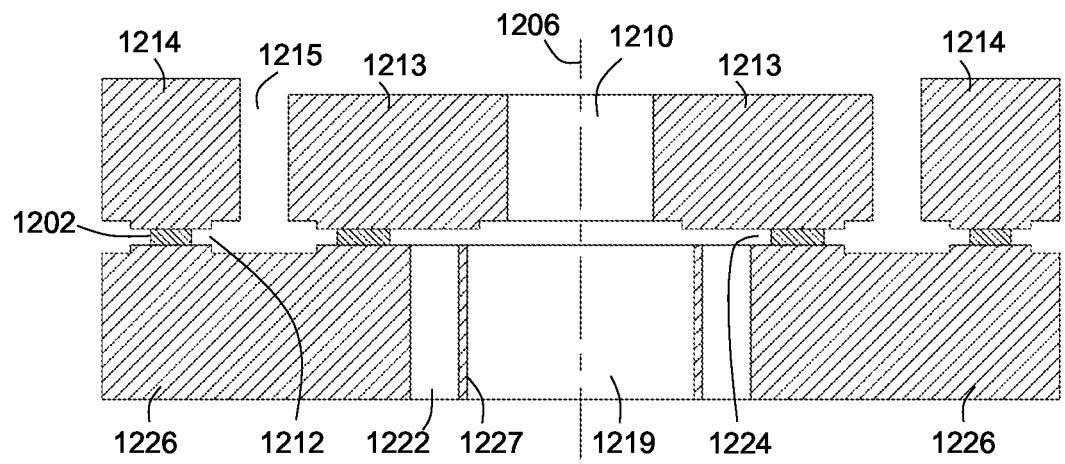

FIGS. 12K-12N illustrate the chip-level fabrication process. After the singulation step from the wafer-level process, the micro-undercuts 1212 and 1224 are made deeper by a time-controlled buried oxide etching with HF solution or HF vapor. FIG. 12K shows the silicon structures of the single-pole chip after the HF oxide etching. The charged particle beam path is provided by the circular opening 1210 in the first silicon layer and larger circular opening 1219 in the second silicon layer. 1206 shows the optical axis of the charged particle beam. The circular opening 1210 in the first silicon layer is formed by ring-shape recessed silicon island structure 1213, which is used to make the annular electrode. In the first silicon layer, silicon island structure 1213 is surrounded by ground island structures 1214 with micro-trenches 1215 between them. Micro-undercuts 1212 are at the bottom of the micro-trench 1215 surrounding the island structures 1213 and 1214. The island structures 1213 and 1214 are supported by the second silicon layer through the buried silicon dioxide layer 1202. As shown in FIG. 12K, only ground structure 1226 is formed in the second silicon layer. Alternatively, electrode island structures may also be formed in the second silicon layer using the process described for the first silicon layer. When both electrode and ground island structures are made in both the first silicon layer and second silicon layer, the micro-trench patterns on the two silicon layers cannot overlap, so that the island structures on both silicon layers can be mutually supported. The ground structures of the second silicon layer include the circular opening 1219 for providing the charged particle beam path with optical axis 1206. A circular micro-fence 1227 is formed concentric to the circular opening 1219. In other word, the circular micro-fence 1227 forms the circumference of the circular cavity 1219. The purpose of forming the overhanging micro-fence 1227 is to form the circular micro-trench 1222 and the micro-undercut 1224. Overhanging micro-bridges connect the overhanging micro-fence to the rest ground silicon structure. The micro-bridges are not shown in FIG. 12K, but they are shown in FIG. 2C. The combined micro-structures of micro-fence, micro-bridges, micro-trenches, and micro-undercuts form a built-in micro-shadow mask to enable the pre-structured metal deposition process.

Figure 12L:
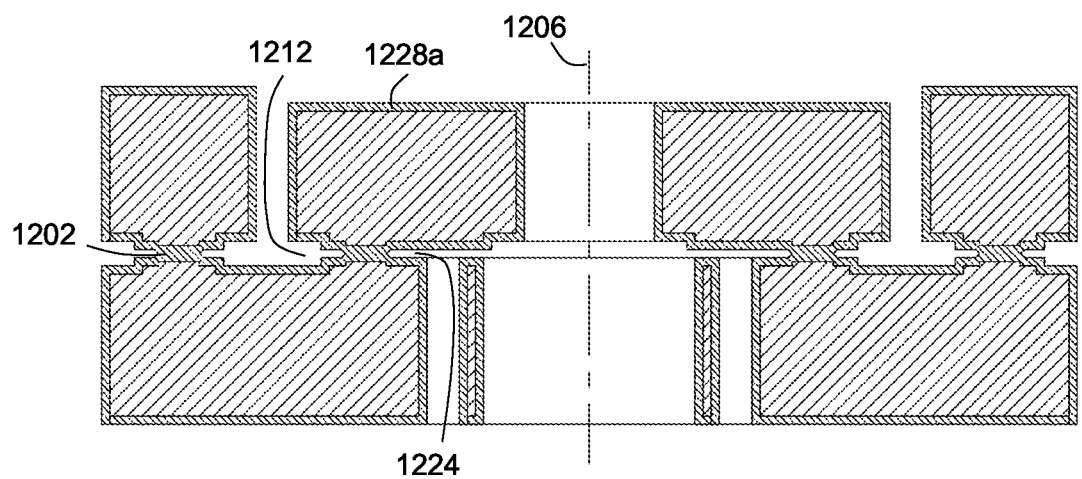

The micro-undercuts 1212 and 1224 may be further enlarged by repeated cycles of silicon thermal oxidation and HF oxide etching. As shown in FIG. 12L, a chip-level silicon thermal oxidation process is conducted, and a thin layer of silicon dioxide 1228*a* is thermally grown on all the exposed silicon surfaces. The grown oxide thickness may be in the range of 0.1 µm to 10 µm, for example in the range of 0.2 µm to 2 µm. The silicon thermal oxidation may be a commonly used wet oxidation process at temperatures between 800° C. to 1200° C., for example at around 1100° C. The silicon thermal oxidation process consumes silicon from the original silicon surface and incorporates the consumed silicon in the newly grown silicon dioxide layer. Then silicon dioxide 1228*a* is removed by HF solutions or HF vapor in a time-controlled etching process. Another cycle of silicon thermal oxidation and oxide removal process may be optionally repeated to further enlarge the micro-undercuts 1212 and 1224. For the simplicity of the drawing, FIG. 12L only illustrates the cross-section of the chip after a single time-controlled HF etching step to show the formation of inner portions of the micro-undercuts by this method. The HF silicon dioxide etching, and silicon thermal oxidation processes also provide another advantage of the devices in this technology. The etched silicon surfaces are made smoother and have fewer particles after each cycle of thermal oxidation and HF oxide removal process. As a result, many surface protrusions in micro or nano scales may be removed. The smoother and cleaner surfaces provided by this process significantly reduce the chances of electrical discharging and breakdowns in confined micro spaces when strong electric fields are applied to influence the charged particle beams.

Figure 12M:
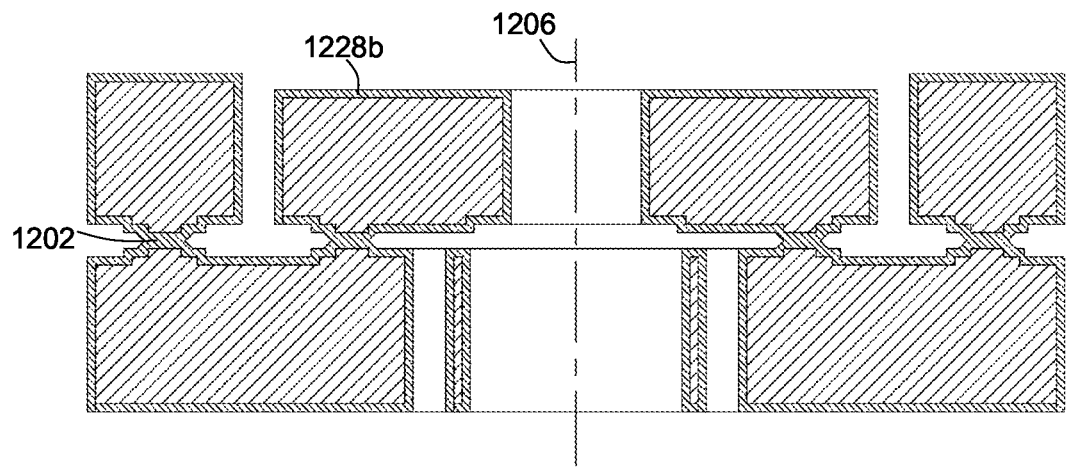

As shown in FIG. 12M, a final silicon thermal oxidation process is conducted to grow a thin layer of silicon dioxide 1228*b* on all the exposed silicon surfaces. The grown oxide thickness may be in the range of 0.1 µm to 10 µm, for example in the range of 0.2 µm to 2 µm. The silicon thermal oxidation may be a commonly used wet oxidation process at temperatures between 800° C. to 1150° C., for example at around 1100° C. After the chip-level silicon thermal oxidation process, all the silicon surfaces, including the inner surfaces of all the micro-undercuts and the sidewall surfaces of chip edges are fully encapsulated by the silicon dioxide layer 1228*b*.

Figure 12N:
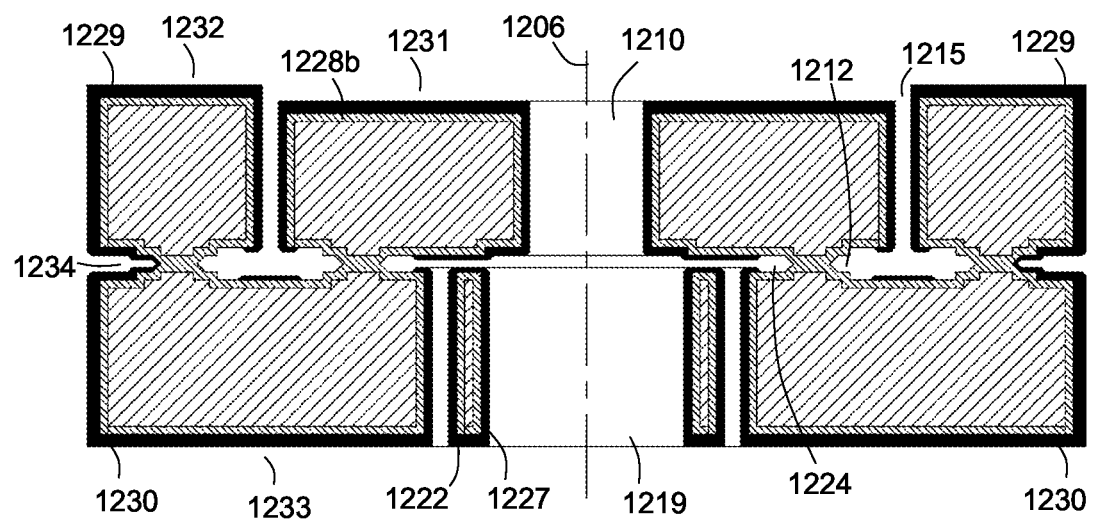

FIG. 12N shows the cross-sectional view schematic illustration of the single-beam single-pole device of the disclosed technology after its chip-level pre-structured conductive layer deposition processes. Metal deposition methods include but are not limited to physical vapor depositions (PVD), such as sputtering and e-beam evaporation. A sputtering deposition process is normally conducted at higher deposition pressures than evaporation pressures. For example, a sputtering pressure may be in the range of 0.2 pascal to 2 pascal and an evaporation pressure may be in the range of 10 micro-pascal to 100 micro-pascal. In a metal sputtering process, the excess energy of the ions also increases the surface mobility of the ions of the depositing material. As a result, a sputtering metal deposition process provides metal film coverage on all the exposed surfaces of the structured chip, except the surfaces shadowed by the built-in micro-shadow-masking structures of the disclosed technology. On the other hand, a metal evaporation deposition process provides a line-of-sight deposition due to its much lower vacuum deposition pressures.

The chip-level metal deposition process includes at least two steps of metal sputtering processes. One sputtering process is to deposit metal layers 1229 from the top, which is the first silicon layer side. Another sputtering process is to deposit metal layers 1230 from the bottom, which is from the second silicon layer side. A metal evaporation process may be optionally conducted to deposit a thicker metal film on either the top or the bottom surfaces of the chip by having the top or bottom surfaces placed to face the direction of the line-of-sight relative to the evaporation source. The evaporated thick metal film is used for making external electrical connections such as wire-bonding or direct metal probe or pin contacts. The metal contact pads, and the electrode and ground routings are not shown in FIG. 12N, but they are illustrated and described in FIG. 6A and FIG. 6B. The deposited metal films 1229 and 1230 may have a single metal layer that may include but is not limited to titanium. The thickness of the single metal film may be in the range of 0.1 µm to 0.5 µm. Alternatively, the thin conductive film may include an inner adhesion layer and an outer conductive layer that are deposited in the same deposition process. The outer conductive layer may be a material that resists surface oxidation and corrosions. Examples of the thin inner adhesion layer materials include but are not limited to titanium, titanium tungsten, and chrome. Examples of the outer conductive layer materials include but are not limited to gold, platinum, and molybdenum. The thickness of the inner adhesion layer may be in the range of 0.01 µm to 0.05 µm. The thickness of outer metal layer may be in the range of 0.1 µm to 0.5 µm.

After conducting a metal sputtering deposition from the top of the chip, as shown in FIG. 12N, the top surfaces and sidewall surfaces of the electrode islands 1231 and ground islands 1232 are fully covered by the sputtered metal layer 1229. The cylindrical sidewall surfaces of circular beam path opening 1210 and 1219 are also covered by the sputtered metal layers. Because of the built-in shadow-masking effects provided by the micro-trench 1215, the metal thickness on the sidewalls of micro-trench 1215 is progressively reduced towards the bottom of the micro-trench. The metal layer 1229 does not reach the hidden inner surfaces of the micro-undercut 1212 due to the built-in shadow-masking effects of the micro-trench 1215 and the micro-undercuts 1212. As a result, the uncoated dielectric surfaces in the micro-undercuts 1212 create discontinuities in the sputtered metal layer 1229. Therefore, the metal layers 1229 on the electrode islands 1231 and ground islands 1232 are physically separated and electrically unconnected. After the metal sputtering deposition from the bottom of the chip, the bottom surfaces and sidewall surfaces of the ground structure 1233, including the surfaces of micro-fence 1227, are fully covered by the sputtered metal layer 1230. The cylindrical sidewall surfaces of circular beam path openings 1219 and 1210 are also covered by the sputtered metal layer 1230. The fully metallized cylindrical surfaces of 1210 and 1219 prevents trapping of charged particles along the beam paths. Because of the built-in shadow-masking effects provided by the micro-fence 1227, micro-trench 1222, and micro-undercuts 1224, the metal thickness on the sidewalls of micro-trench 1222 is progressively reduced towards the bottom of the micro-trench, and the metal layer 1230 does not reach the hidden inner surfaces of the micro-undercut 1224. As a result, the uncoated dielectric surfaces in the micro-undercuts 1224 create discontinuities between the sputtered metal layers on the top electrode island 1231 and the bottom ground metal layer 1230. On the other hand, since the micro-undercuts 1234 at chip edges are open without shadowing effects from micro-trenches, the metal layers 1229 and 1230 on the ground structures 1232 and 1233 may be physically and electrically connected through the edges of the chip. The top ground island electrical connection to the bottom ground layer allows for a single-side external ground contact and provide additional electrode ground shielding from their bottom. Both the metal sputtering and evaporation processes are pre-structured without the needs of conducting metal patterning and etching after the metal deposition. As a result, particle contaminations associated with metal patterning and etching processes on micro-structures with high-aspect ratios are avoided.

Figure 13:
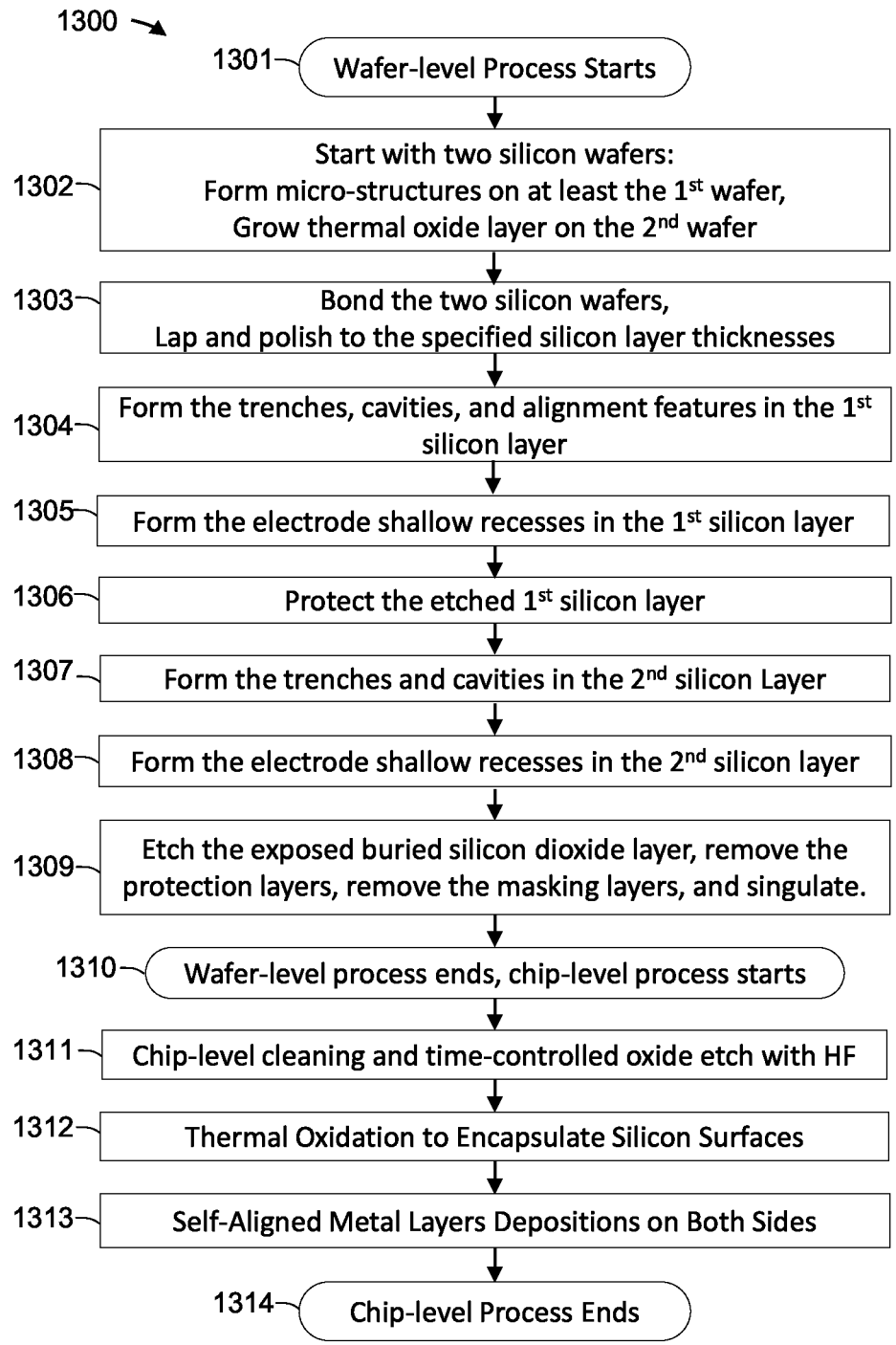
FIG. 13 is another example of a flow diagram illustrating major fabrication process steps.

FIG. 13 is another example of a flow diagram illustrating major fabrication process steps. The corresponding cross-sectional view schematic illustrations are described in more details in FIG. 14. In this fabrication process, instead of using a planar SOI wafer as the starting wafer shown in FIG. 8, two planar single-crystal silicon wafers are used as starting wafers. In FIG. 13, the process flow 1300 includes two process modules: first, a wafer-level fabrication process module and second, a chip-level fabrication process module. The fabrication process starts with wafer-level process step 1301. The starting wafers are single-crystal silicon wafers, and they may have different thickness: the first silicon wafer may be either thicker or thinner than the second silicon wafer. In step 1302, shallow silicon structures are first etched into at least one of the two wafers using patterned photoresist as the masking layer. The silicon etching is done by a DRIE process. The etched silicon microstructures may be for making the micro-undercuts. A silicon thermal oxidation process is then conducted on at least one of the two silicon wafers, for example the non-structured silicon wafer. After cleaning the wafer surfaces, the two wafers are bonded together in step 1303 with the etched microstructures and the silicon dioxide layer buried between the two silicon wafers. After the bonding, the first silicon wafer is also referred to as the first silicon layer and the second silicon wafer is also referred to as the second silicon layer of the bonded wafer. Then wafer lapping and polishing processes are conducted to reduce the first silicon layer and second silicon layer to their specified thicknesses. In step 1304, straight-sidewall silicon DRIE etching forms circular cavities, micro-trenches, and other micro-structures. The silicon DRIE process may use a patterned photoresist layer as the etching masking layer and the pattern is aligned to the buried micro-undercut structures at the bonded interface. Then, optional silicon etching step 1305 forms shallow recesses on the electrode structures in the first silicon layer. This silicon recess etching step is optional and it may be needed when the electrode side of the chip is bonded to a surface of another chip to form a multi-functional chip-stack. In such a case, the etched silicon recesses of the electrodes form gaps between the top surfaces of the electrodes on one chip to the bonded surface of another chip. The gaps formed by the etched recesses reduce the possibility of electrical shorting and discharging. The technology provides multiple masking methods for etching the shallow silicon recesses. Details of the masking methods for the shallow silicon recess etching are provided in the description for FIGS. 9-12 and FIG. 14. As shown in FIG. 13, step 1306 protects the micro-structures etched from the side of the first silicon layer. The fabrication process for structuring the second silicon layer is same as or similar to the structuring of the first silicon layer. Step 1307 forms micro-trenches, circular cavities, and other micro-structures in the second silicon layer by straight-sidewall silicon DRIE etching with a patterned masking layer. Step 1308 is optional when shallow silicon recesses are needed in the second silicon layer. Step 1309 etches the exposed silicon dioxide layer between the two silicon layers and removes the masking and protective layer on both sides. The chip boundaries on a wafer are defined by the aligned and overlapped micro-trenches etched in the first and second silicon layers. After the removal of the middle silicon dioxide layer at bottom surfaces of the micro-trenches and the protective layers, the chips are singulated simultaneously. Chip singulation methods such as mechanical saw dicing are therefore avoided to prevent dicing debris from being introduced and trapped in micro-trenches and micro-undercuts.

As shown in FIG. 13, the chip-level process 1310 starts from step 1311. After further cleaning the chips, hydrofluoric acid (HF) vapor or diluted HF solutions is used for the time-controlled buried silicon dioxide etching. As a result, the depths of the micro-undercuts are increased. Then a silicon thermal oxidation step 1312 is performed at the chip-level to encapsulate all the exposed silicon surfaces, including the edges of the chips, with a thermally grown silicon dioxide layer. The thermally grown silicon dioxide layer may be optionally etched by vapor HF or HF solution with controlled etching time as in step 1311. The repetition of step 1311 and step 1312 may be used to create and enlarge the micro-undercuts. Because the silicon thermal oxidation process incorporates silicon into the grown silicon dioxide layer, the repetition of steps 1311 and 1312 provide the following benefits. First, it increases the sizes of the micro-undercuts after removing the silicon dioxide layer in each repetition cycle. Second, the silicon thermal oxidation process at elevated temperatures burns off surface contaminants and particles. As a result, the possibility of electrical discharges from particles and surface contaminants is reduced. Third, the surface with regrown silicon dioxide reduces the surface roughness and micro-protrusion defects, further reducing the possibility of electrical discharges and breakdowns at the silicon dioxide surfaces inside the micro-undercuts. After forming the micro-undercuts, in the last step of 1312, the thermally grown silicon dioxide layer fully encapsulates all the silicon surfaces of the chips. In step 1313, thin conductive films are deposited from the top and from the bottom of the chips. The chip-level conductive film deposition process can be a sputtering metal deposition process or a combined sputtering and evaporation metal deposition process. A sputtering metal deposition process provides metal film coverage on all the exposed surfaces of the structured chip, except the surfaces shadowed by the built-in micro-shadow-masking structures. An evaporation process may deposit a metal film only on the surfaces facing the line-of-sight direction from the metal evaporation source. The conductive thin film may have a single metal layer that may include but is not limited to titanium. Alternatively, the thin conductive film may include an inner adhesion layer and an outer conductive layer that are deposited in the same deposition process. The outer conductive layer may be a metal that resists surface oxidation and corrosions. Examples of the thin inner adhesion layer materials include but are not limited to titanium, titanium tungsten, and chrome. Examples of the outer conductive layer materials include but are not limited to gold, platinum, and molybdenum. The built-in micro-shadow-masking structures include the micro-trenches, micro-undercuts, micro-fences, and micro-bridges. Due to the built-in micro shadowing effects provided by these micro-structures, the metal deposition process is pre-structured and metal layers for the electrode and ground structures are physically separated and electrically isolated as deposited. No additional metal layer patterning and etching processes are required. As a result, the chip surfaces are kept clean from particle contaminations, reducing the possibility of electrical shorting, discharging and breakdowns when high magnitude of electric fields are applied. This concludes the fabrication process flow in step 1314 in FIG. 13.

To illustrate another method of forming the micro-undercuts and the shallow silicon recesses, FIG. 14 shows an example of a microfabrication process corresponding to the flow diagram in FIG. 13. FIGS. 14A-14L are partial cross-sectional schematic illustrations after the key fabrication process steps. In this fabrication process, the structures for the micro-undercuts for the first layer silicon islands and the second silicon layer are made in the first process step and then they are buried between the two silicon layers through a wafer bonding process. The shallow silicon recess etching is conducted by anisotropic silicon etching using a patterned dry film photoresist layer. A single-pole device to influence a single charged particle beam is used to illustrate the example of fabrication process. The illustrated and described methods of fabrication are also applicable to the fabrication processes for making the multi-pole devices and the arrayed devices to influence multiple charged particle beams.

FIG. 14A shows a partial cross-sectional view schematic illustration of the starting wafers 1400. The two wafers are surface-polished single-crystal silicon wafers. The thicknesses of the silicon wafers may be in the range of 100 µm to 1000 µm, for example ranging from 300 µm to 500 µm. On one polished side of wafer 1401, a photolithography step is conducted followed by a silicon DRIE process using the patterned photoresist layer as the silicon etching mask. The silicon etching depth may be in range of 1 µm to 20 µm. After that the remaining photoresist layer is removed. The etched silicon recesses 1412 and 1424 are for making the micro-undercut and overhanging structures. In other words, the micro-undercut structures are formed before making the micro-trenches and the silicon islands. Also shown in FIG. 14A, a silicon thermal oxidation process is conducted on the second silicon wafer 1403. The silicon thermal oxidation process may be a standard wet oxidation with temperatures between 800° C. to 1200° C., for example at around 1100° C. The thickness of the thermally grown silicon dioxide layer 1402 may be in the range of 0.1 µm to 10 µm, for example ranging from 0.5 µm to 5 µm. The silicon dioxide layer 1402 is used as the buried silicon dioxide layer after wafer bonding. In an alternative process flow, different silicon micro-structures can be etched on surfaces of both wafers and the thermal oxidation can be done on either or both silicon wafers before wafer bonding.

In the next step, the structured wafer is thoroughly cleaned by standard and commonly used wafer pre-oxidation cleaning methods. Examples of the cleaning methods include Piranha clean with a mixture of sulfuric acid, hydrogen peroxide, and deionized water; Standard Clean 1 (SC1) with a mixture of ammonia hydroxide, hydrogen peroxide, and deionized water (APM); Standard Clean 2 (SC2) with a mixture of hydrochloric acid, hydrogen peroxide, and deionized water (HPM). As shown in FIG. 14B, the two cleaned wafers are then bonded with alignment. The wafer bonding is initiated in a vacuum wafer-bonding apparatus with feature alignment capability. The room-temperature bonded wafers then go through an annealing process at elevated temperatures, such as 700° C. to 1100° C. This wafer bonding process is often referred to as fusion bonding. After the fusion bonding, the first silicon wafer is also referred to as the first silicon layer 1401 and the second silicon wafer is also referred to as the second silicon layer 1403. Then wafer lapping and polishing processes are conducted to reduce the first silicon layer and second silicon layer to their specified thicknesses. After the bonding, the etched silicon recesses 1412 and 1424 are buried with the silicon dioxide layer 1402. The shapes, sizes, and locations of 1412 and 1424 are predetermined according to the requirements of corresponding micro-trenches and silicon islands. As shown in FIG. 14B, a patterned masking layer 1405 is made on the first silicon layer. The patterned masking layer 1405 is used for the trench and cavity silicon etching. The patterns of the masking layer 1405 are aligned to the buried micro-undercut structures 1412 and 1424. The alignment during patterning may be done by using UV exposure machines with infrared (IR) alignment capability. Examples of the masking materials include but are not limited to patterned photoresist. As shown in FIG. 14B, the center line of the charged particle beam transmission path is shown as the dashed line 1406. The masking layer opening for the charged particle beam transmission path 1406 is a circular opening. The diameter of the circular opening may be in the range of 10 µm to 1000 µm, for example in the range of 50 µm to 250 µm. Locations 1407 of the masking layer 1405 are the locations for forming the electrode shallow recesses. The mask openings 1408 are used to make silicon micro-trenches and their opening widths may be in the range of 1 µm to 100 µm, for example in the range of 3 µm to 30 µm.

As shown in FIG. 14C, silicon DRIE etching is first conducted to form micro-trenches 1409 and circular cavities 1410 with the patterned masking layer 1405. The silicon DRIE etching is stopped when the buried silicon dioxide surfaces are reached on the bottom of all the openings. After the silicon DRIE etching, the silicon micro-trenches 1409 and charged beam path circular cavity 1410 are formed and they are aligned to micro-undercuts 1412 and 1424. As a result, silicon islands are formed with surrounding micro-trenches and micro-undercuts in the first silicon layer.

After forming the micro-trenches in the first silicon layer, the remaining masking layer 1405 is removed and the silicon surfaces of the structured first silicon layer are exposed. As shown in FIG. 14D, a photolithography step using a dry film photoresist is conducted. The dry-film photoresist layer 1404 is laminated at atmospheric pressure by using a hot-roll laminator or laminated in vacuum by using a heated diaphragm laminator. The laminated dry-film photoresist is then UV exposed using a photomask with alignment to the silicon structures. In the next step, a time controlled DRIE etching is performed to form a recess on each exposed silicon surface 1407 with the masking layer 1404. The shallow silicon recess etching is anisotropic. In other words, the exposed sidewall silicon surfaces and edges of the exposed silicon islands are not attacked during the recess etch, which requires sufficient sidewall wall protection layer deposition in the $C_4F_8$ deposition cycles. On the other hand, the amount of $C_4F_8$ deposition may not be too much to avoid generating silicon grass on the etched silicon top surfaces and edges of the silicon islands. The depth of the recess may be in the range of 5 µm to 30 µm. The technology provides multiple methods of forming the shallow silicon recesses. Other shallow silicon recess methods described in FIGS. 9-12 may also be used in the flow diagram of FIG. 13 and process flow of FIG. 14, and such process flow variations are parts of the disclosed technology.

After forming the shallow silicon recesses, the remaining dry film photoresist is removed. As shown in FIG. 14E, the recessed silicon islands 1413 are for making the electrodes and the silicon islands 1414 are for making the grounds. Micro-trenches 1415 with micro-undercuts 1412 surround and separate the electrode islands and ground islands. Micro-trenches 1416 define the boundary of the devices and they are used for the chip singulation with the corresponding micro-trenches to be made in the second silicon layer. The circular opening 1410 forms the charged particle beam path in the first silicon layer. As described in earlier sections, the electrode and ground islands are in elongated shapes. One end of each electrode island is an annular shaped electrode island 1413 or an arc-shaped electrode island and they form the charged particle beam path opening 1410. The elongated electrode and ground islands 1413 and 1414 also serve as routing lines and they reach the edges of the devices for making external electrical contacts.

After completing the first silicon layer micro-structuring process, the structured first silicon layer may be protected by applying a temporary protection layer 1417 as shown in FIG. 14F. The material of the protection layer 1417 may be an organic material dissolved in a solvent and solidified by applying heat after coating. The coating process may be spray coating, dispensing, dip coating, low speed spin coating or a combination of these methods. The layer 1417 may also be a polymer layer that is deposited from vapor phase. The coated layer 1417 provides surface protection of the first silicon layer to prevent it from being affected when the second silicon layer is being processed. The coated layer 1417 at least partially fills the deep and narrow micro-trenches and at least partially planarizes the wafer surfaces of the structured first silicon layer. With the protection layer 1417, processing the second silicon layer can share most processing equipment and processing conditions as with the first silicon layer. In this example of process flow, the second silicon layer is only made as a ground layer. The silicon recess making process is not included in the second silicon structuring process. However, if needed, the silicon recess making process described for the first silicon layer structuring can be applied to the second silicon layer structuring.

Also as shown in FIG. 14F, the processing of the second silicon layer starts from applying and patterning a photoresist masking layer 1418. The patterns of 1418 are aligned to the alignment features made on the first silicon layer or the micro-undercut structures, and the alignment accuracy may be +/−2 μm or better. The pattern opening 1419 in photoresist layer 1418 is a circular opening for making the charged particle beam path in the second silicon layer. The pattern opening of 1420 in the photoresist layer 1418 is an enclosed micro-trench opening pattern for defining the boundary of the chip on the wafer. The pattern 1421 is a circular micro-fence pattern for forming the circular micro-trench opening 1422 in the photoresist layer 1418.

As shown in FIG. 14G, the second layer silicon anisotropic etching is also conducted by deep reactive ion etching (DRIE) process using the masking layer 1418. After the silicon DRIE etching reaches the buried silicon dioxide layer and the protection layer 1417 at the bottom surfaces of the etched structures, the DRIE silicon etching process is stopped. Then reactive ion etching (RIE) with $CHF_3$ gas with a small portion of oxygen may be used to selectively etch the silicon dioxide layer at bottom surfaces of the etched silicon structures. Alternatively, the silicon dioxide layer may be etched by time-controlled HF solution etching or HF vapor etching. In the process flow, the micro-undercuts 1424 may be made deeper and larger in the chip-level process steps.

Next, the first silicon layer protective layer 1417 and second silicon layer masking layer 1418 are fully removed. Isotropic oxygen plasma etching may be used to remove the organic protective layers. With the full removal of the protective layer 1417, the chip boundary micro-trenches 1416 in the first silicon layer and micro-trenches 1420 in the second silicon layer are connected. As a result, the chip 1425 is separated from the wafer as shown in FIG. 14H.

Figure 14I:
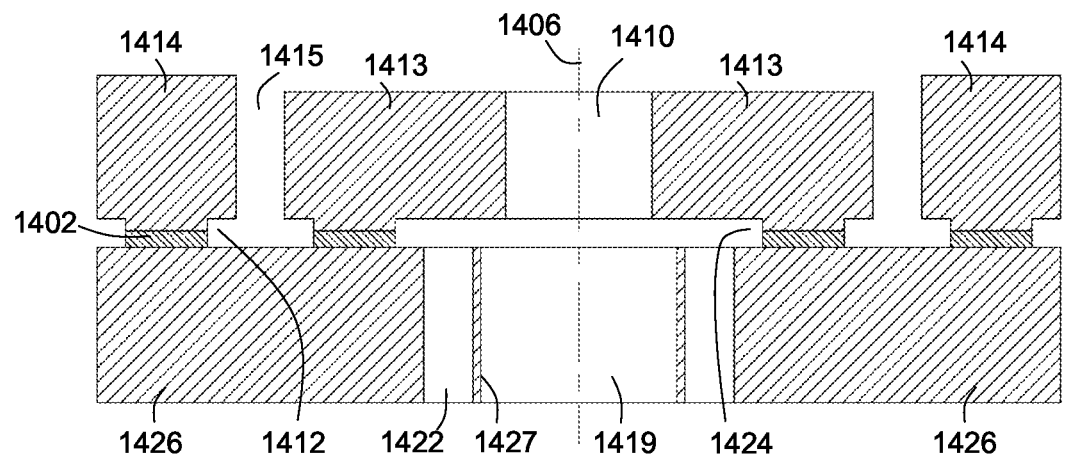

FIGS. 14I-14L illustrate the chip-level fabrication process. FIG. 14I shows the silicon structures of the single-pole chip after its singulation step from the wafer-level process. The charged particle beam path is provided by the circular opening 1410 in the first silicon layer and larger circular opening 1419 in the second silicon layer. 1406 shows the optical axis of the charged particle beam. The circular opening 1410 in the first silicon layer is formed by ring-shape recessed silicon island structure 1413, which is used to make the annular electrode. In the first silicon layer, silicon island structure 1413 is surrounded by ground island structures 1414 with micro-trenches 1415 between them. Micro-undercuts 1412 are at the bottom of the micro-trench 1415 surrounding the island structures 1413 and 1414. The island structures 1413 and 1414 are supported by the second silicon layer through the buried silicon dioxide layer 1402. As shown in FIG. 14I, only ground structure 1426 is formed in the second silicon layer. Alternatively, electrode island structures may also be formed in the second silicon layer using the process described for the first silicon layer. When both electrode and ground island structures are made in both the first silicon layer and second silicon layer, the micro-trench patterns on the two silicon layers cannot overlap, so that the island structures on both silicon layers can be mutually supported. The ground structures of the second silicon layer include the circular opening 1419 for providing the charged particle beam path with optical axis 1406. A circular micro-fence 1427 is formed concentric to the circular opening 1419. In other word, the circular micro-fence 1427 forms the circumference of the circular cavity 1419. The purpose of forming the overhanging micro-fence 1427 is to form the circular micro-trench 1422 and the micro-undercut 1424. Overhanging micro-bridges connect the overhanging micro-fence to the rest ground silicon structure. The micro-bridges are not shown in FIG. 14I, but they are shown in FIG. 2C. The combined micro-structures of micro-fence, micro-bridges, micro-trenches, and micro-undercuts form a built-in micro-shadow mask to enable the pre-structured metal deposition process.

Figure 14J:
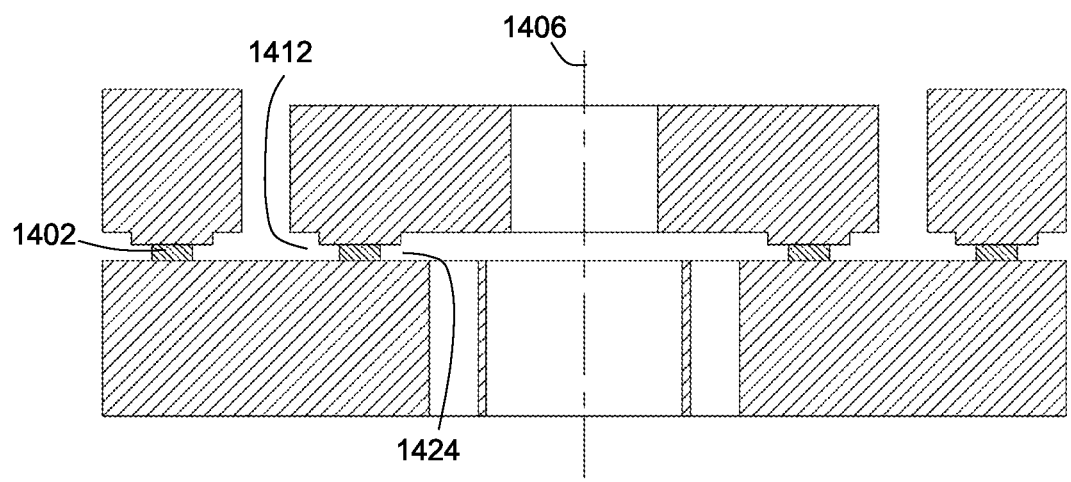

As shown in FIG. 14J, if the sizes of the micro-undercuts must be increased, the buried silicon dioxide layer is first etched in a controlled amount from its exposed sidewall surfaces in the micro-undercuts 1412 and 1424. The buried silicon dioxide undercutting etching may be conducted using diluted hydro-fluoride (HF) solutions or using vapor HF. After the HF etching, the micro-undercuts are made deeper in the lateral direction as shown in FIG. 14J. The next step is to conduct a silicon thermal oxidation process to have a thin layer of silicon dioxide grown on all the exposed silicon surfaces. The grown silicon dioxide layer is then etched away by the described oxide etching methods. Since silicon thermal oxidation consumes silicon from the original silicon surface and incorporates the consumed silicon in the newly grown silicon dioxide layer, after the thermally grown silicon dioxide is removed, the micro-undercuts are made not only deeper in the lateral direction, but also higher in the vertical direction. Therefore, a single cycle or multiple cycles of the oxidation and oxide etching process may be conducted for forming micro-undercuts with specific sizes and shapes at the buried silicon dioxide interfaces. For the simplicity of the drawing, FIG. 14J only illustrates the cross-section of the chip after a single time-controlled HF etching step to show the formation of inner portions of the micro-undercuts by this method. The HF silicon dioxide etching, and thermal oxidation processes also provide another advantage of the devices in this technology. The etched silicon surfaces are made smoother and have fewer particles after each cycle of thermal oxidation and HF oxide removal process. As a result, many surface protrusions in micro or nano scales may be removed. The smoother and cleaner surfaces provided by this process significantly reduce the chances of electrical discharging and breakdowns in confined micro spaces when strong electric fields are applied to influence the charged particle beams.

Figure 14K:
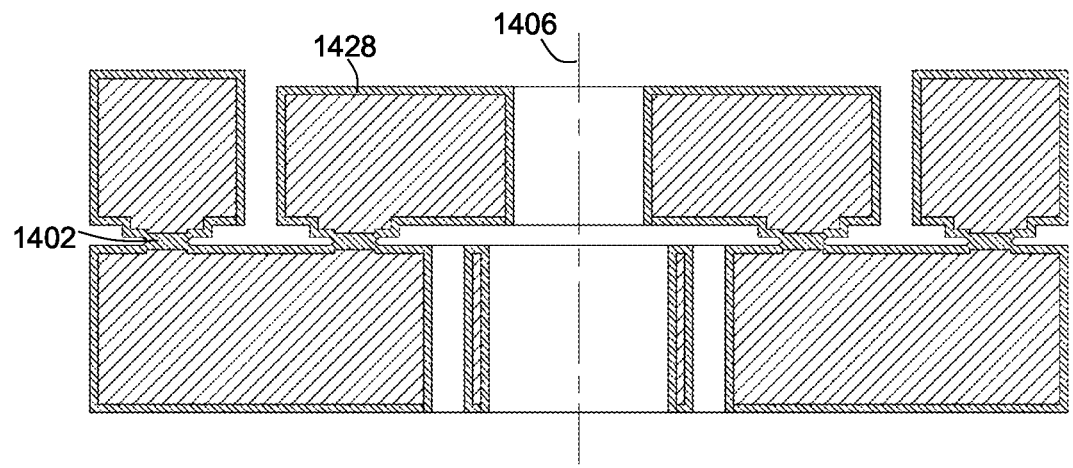

As shown in FIG. 14K, a final silicon thermal oxidation process is conducted to grow a thin layer of silicon dioxide 1428 on all the exposed silicon surfaces. The grown oxide thickness may be in the range of 0.1 μm to 10 μm, for example in the range of 0.2 m to 2 μm. The silicon thermal oxidation may be a commonly used wet oxidation process at temperatures between 800° C. to 1200° C., for example at around 1100° C. After the chip-level silicon thermal oxidation process, all the silicon surfaces, including the inner surfaces of all the micro-undercuts and the sidewall surfaces of chip edges are fully encapsulated by the silicon dioxide layer 1428.

Figure 14L:
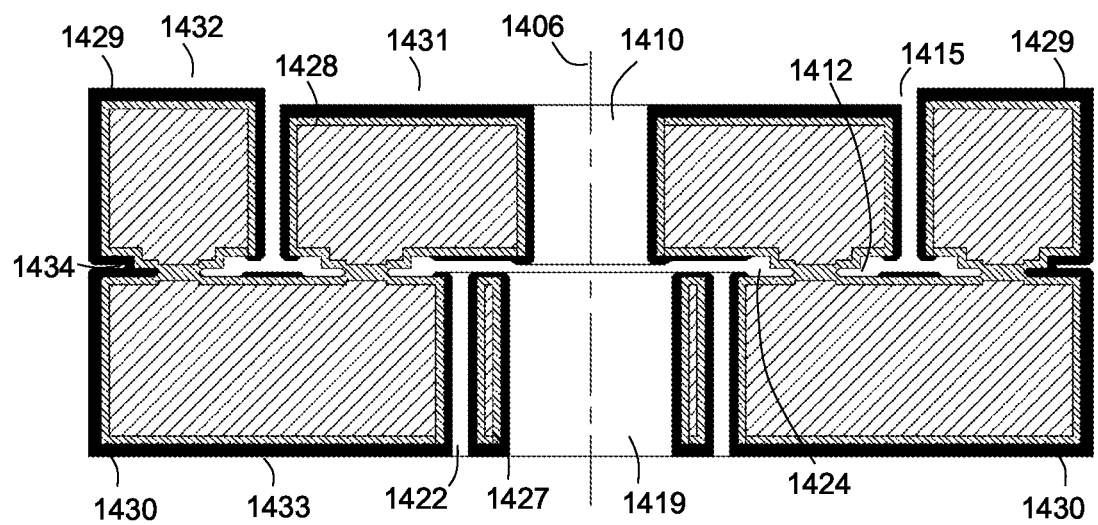

FIG. 14L shows the cross-sectional view schematic illustration of the single-beam single-pole device after its chip-level pre-structured conductive layer deposition processes. Metal deposition methods include but are not limited to physical vapor depositions (PVD), such as sputtering and e-beam evaporation. A sputtering deposition process is normally conducted at higher deposition pressures than evaporation pressures. For example, a sputtering pressure may be in the range of 0.2 pascal to 2 pascal and an evaporation pressure may be in the range of 10 micro-pascal to 100 micro-pascal. In a metal sputtering process, the excess energy of the ions also increases the surface mobility of the ions of the depositing material. As a result, a sputtering metal deposition process provides metal film coverage on all the exposed surfaces of the structured chip, except the surfaces shadowed by the built-in micro-shadow-masking structures. On the other hand, a metal evaporation deposition process provides a line-of-sight deposition due to its much lower vacuum deposition pressures.

The chip-level metal deposition process includes at least two steps of metal sputtering processes. One sputtering process is to deposit metal layers 1429 from the top, which is the first silicon layer side. Another sputtering process is to deposit metal layers 1430 from the bottom, which is from the second silicon layer side. Metal evaporation processes may be optionally conducted to deposit thicker metal films on either or both the top or the bottom surfaces of the chip by having the top or bottom surfaces placed to face the direction of the line-of-sight relative to the evaporation source. The evaporated thick metal films are used for making external electrical connections such as wire-bonding or direct metal probe or pin contacts. The metal contact pads, and the electrode and ground routings are not shown in FIG. 14L, but they are illustrated and described in FIG. 6A and FIG. 6B. The deposited metal films 1429 and 1430 may have a single metal layer that may include but is not limited to titanium. The thickness of the single metal film may be in the range of 0.1 μm to 0.5 μm. Alternatively, the thin conductive film may include an inner adhesion layer and an outer conductive layer that are deposited in the same deposition process. The outer conductive layer may be a material that resists surface oxidation and corrosions. Examples of the thin inner adhesion layer materials include but are not limited to titanium, titanium tungsten, and chrome. Examples of the outer conductive layer materials include but are not limited to gold, platinum, and molybdenum. The thickness of the inner adhesion layer may be in the range of 0.01 μm to 0.05 μm. The thickness of outer metal layer may be in the range of 0.1 μm to 0.5 μm.

After conducting a metal sputtering deposition from the top side of the chip, as shown in FIG. 14L, the top surfaces and sidewall surfaces of the electrode islands 1431 and ground islands 1432 are fully covered by the sputtered metal layer 1429. The cylindrical sidewall surfaces of circular beam path opening 1410 and 1419 are also covered by the sputtered metal layers. Because of the built-in shadow-masking effects provided by the micro-trench 1415, the metal thickness on the sidewalls of micro-trench 1415 is progressively reduced towards the bottom of the micro-trench. The metal layer 1429 does not reach the hidden inner surfaces of the micro-undercut 1412 due to the built-in shadow-masking effects of the micro-trench 1415 and the micro-undercuts 1412. As a result, the uncoated dielectric surfaces in the micro-undercuts 1412 create discontinuities in the sputtered metal layer 1429. Therefore, the metal layers 1429 on the electrode islands 1431 and ground islands 1432 are physically separated and electrically unconnected. After the metal sputtering deposition from the bottom of the chip, the bottom surfaces and sidewall surfaces of the ground structure 1433, including the surfaces of micro-fence 1427, are fully covered by the sputtered metal layer 1430. The cylindrical sidewall surfaces of circular beam path openings 1419 and 1410 are also covered by the sputtered metal layer 1430. The fully metallized cylindrical surfaces of 1410 and 1419 prevents trapping of charged particles along the beam paths. Because of the built-in shadow-masking effects provided by the micro-fence 1427, micro-trench 1422, and micro-undercuts 1424, the metal thickness on the sidewalls of micro-trench 1422 is progressively reduced towards the bottom of the micro-trench, and the metal layer 1430 does not reach the hidden inner surfaces of the micro-undercut 1424. As a result, the uncoated dielectric surfaces in the micro-undercuts 1424 create discontinuities between the sputtered metal layers on the top electrode island 1431 and the bottom ground metal layer 1430. On the other hand, since the micro-undercuts 1434 at chip edges are open without shadowing effects from micro-trenches, the metal layers 1429 and 1430 on the ground structures 1432 and 1433 may be physically and electrically connected through the edges of the chip. The top ground island electrical connection to the bottom ground layer allows for a single-side external ground contact and provide additional electrode ground shielding from their bottom side. Both the metal sputtering and evaporation processes are pre-structured without the needs of conducting metal patterning and etching after the metal deposition. As a result, particle contaminations associated with metal patterning and etching processes on micro-structures with high-aspect ratios are avoided.

The chip-level oxidation and metallization processes provide surface-conductive electrode and ground micro-structures. Overall, the surface-conductive structure designs and their fabrication methods of this technology significantly reduce the electrical shorting, discharging, and breakdowns of the electrostatic devices compared to the volume-conductive electrode structures. As a result, the technology provides high yield, high performance, and high-reliability electrostatic devices, especially for large arrays of multipole electrode devices for influencing multiple charged particle beams.

Considerations

Although the description has been described with respect to particular implementations thereof, these particular implementations are merely illustrative, and not restrictive. The description may reference specific structural implementations and methods, and does not intend to limit the technology to the specifically disclosed implementations and methods. The technology may be practiced using other features, elements, methods and implementations. Implementations are described to illustrate the present technology, not to limit its scope, which is defined by the claims. Those of ordinary skill in the art recognize a variety of equivalent variations on the description above.

All features disclosed in the specification, including the claims, abstract, and drawings, and all steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although the description has been described with respect to particular implementations thereof, these particular implementations are merely illustrative, and not restrictive. Implementations may be as a single chip, or as a multi-chip module (MCM) packaging multiple semiconductor dies in a single package. All such variations and modifications are to be considered within the ambit of the disclosed technology the nature of which is to be determined from the foregoing description.

Any suitable technology for manufacturing electronic devices can be used to implement the circuits of particular implementations. Different semiconductor materials can be employed, such as silicon, germanium, SiGe, GaAs, InP, GaN, SiC, graphene, etc. Although the physical processing of signals may be presented in a specific order, this order may be changed in different particular implementations. In some particular implementations, multiple elements, devices, or circuits shown as sequential in this specification can be operating in parallel.

Particular implementations may be implemented by using other components and mechanisms. In general, the functions of particular implementations can be achieved by any means as is known in the art.

It will also be appreciated that one or more of the elements depicted in the drawings/figures can also be implemented in a more separated or integrated manner, or even removed or rendered as inoperable in certain cases, as is useful in accordance with a particular application.

Thus, while particular implementations have been described herein, latitudes of modification, various changes, and substitutions are intended in the foregoing disclosures, and it will be appreciated that in some instances some features of particular implementations will be employed without a corresponding use of other features without departing from the scope and spirit as set forth. Therefore, many modifications may be made to adapt a particular situation or material to the essential scope and spirit.

What is claimed is:

1. An electrostatic device, comprising:
a top silicon layer;
a bottom silicon layer;
a buried layer, including silicon dioxide, and disposed between the top silicon layer and the bottom silicon layer;
a top beam opening through the top silicon layer;
a bottom beam opening through the bottom silicon layer;
an insulating layer at least partially encapsulating the top silicon layer and the bottom silicon layer;
a first electrode, including a first top conductive layer outside a first part of the insulating layer that at least partially encapsulates a first part of the top silicon layer; and
a ground structure, including a second top conductive layer outside a second part of the insulating layer that at least partially encapsulates a second part of the top silicon layer;
wherein:
the top beam opening and the bottom beam opening are concentrically aligned;
the first electrode is physically separated from the ground structure by a top micro-trench in the top silicon layer and electrically separated from the ground structure by a first micro-undercut; and
the first electrode is peripheral to at least a part of the top beam opening.

2. The electrostatic device of claim 1, further comprising:
a bottom conductive layer outside a third part of the insulating layer that at least partially encapsulates a third part of the bottom silicon layer.

3. The electrostatic device of claim 2, wherein:
the bottom conductive layer is separated from the first electrode by a second micro-undercut.

4. The electrostatic device of claim 2, wherein:
the first electrode is recessed from the ground structure.

5. The electrostatic device of claim 1, further comprising:
one or more additional electrodes, wherein one of the one or more additional electrodes:
includes a third top conductive layer outside a fourth part of the insulating layer that at least partially encapsulates a fourth part of the top silicon layer, that:
is peripheral to at least a part of the top beam opening; and
is physically separated from the ground structure by a top micro-trench in the top silicon layer and electrically separated from the ground structure by a micro-undercut.

6. The electrostatic device of claim 1, wherein:
the first electrode has a shape of an elongated island with the top beam opening on one end and an electrical contact pad on another end near an edge of the electrostatic device.

7. The electrostatic device of claim 6, further comprising:
an overhanging portion suspended between supporting anchors, wherein the overhanging portion is included in the elongated island.

8. The electrostatic device of claim 1, wherein:
a diameter of the top beam opening is smaller than a diameter of the bottom beam opening, and the first electrode overhangs the bottom beam opening.

9. The electrostatic device of claim 1, further comprising:
a bottom micro-fence and a bottom micro-trench both surrounding the bottom beam opening, wherein the bottom micro-fence is located under an overhanging part of the top silicon layer and physically and electrically separated from the top silicon layer by a micro-undercut.

10. The electrostatic device of claim 9, further comprising:

overhanging micro-bridges connected to the bottom silicon layer and supporting the bottom micro-fence.

11. The electrostatic device of claim 1, wherein:
the insulating layer fully encapsulates the top silicon layer and the bottom silicon layer.

12. The electrostatic device of claim 1, further comprising:
an exposed silicon dioxide surface at the bottom of the top micro-trench at least partially covered by a conductive layer.

13. The electrostatic device of claim 1, wherein:
surfaces of sidewalls of the top beam opening and the bottom beam opening are electrically conductive to prevent charge trapping.

14. A method of manufacturing an electrostatic device, comprising:
starting with a wafer including a top silicon layer, a bottom silicon layer, and a buried insulating layer disposed between the top silicon layer and the bottom silicon layer;
forming a top beam opening and one or more micro-trenches and/or micro-undercuts in the top silicon layer;
forming a bottom beam opening and one or more micro-trenches, micro-fences, micro-bridges, and/or micro-undercuts in the bottom silicon layer;
encapsulating surfaces with an insulating layer; and
depositing conductive layers on exposed surfaces.

15. The method of claim 14, wherein:
the buried insulating layer includes thermally grown silicon dioxide.

16. The method of claim 14, wherein:
forming a micro-trench includes etching with deep reactive ion etching (DRIE) process using a patterned masking layer including at least one of photoresist, silicon dioxide, aluminum, or deposited polymer.

17. The method of claim 14, wherein:
forming a micro-undercut includes time-controlled silicon etching and/or time-controlled silicon dioxide etching.

18. The method of claim 14, wherein:
encapsulating surfaces with the insulating layer includes thermally growing a silicon dioxide layer.

19. The method of claim 14, wherein:
encapsulating surfaces with the insulating layer includes depositing by atomic layer deposition (ALD).

20. The method of claim 14, wherein:
depositing conductive layers on exposed surfaces includes using a shadow masking effect provided by a micro-trench and a micro-undercut.

21. The method of claim 14, wherein:
depositing conductive layers on exposed surfaces includes using a sputtering process.

22. The method of claim 14, further comprising:
using etching to separate a chip.

23. A method of manufacturing an electrostatic device, comprising:
forming a silicon recess in a first silicon wafer;
thermally growing silicon dioxide on a second silicon wafer;
bonding the first silicon wafer onto the second silicon wafer to form a top silicon layer, a bottom silicon layer, and a buried layer disposed between the top silicon layer and the bottom silicon layer;
forming a top beam opening and a first micro-trench in the top silicon layer;
forming a bottom beam opening and a second micro-trench in the bottom silicon layer;
singulating the top silicon layer and the bottom silicon layer to obtain a chip;
thermally oxidating the chip to encapsulate silicon surfaces with an insulating layer; and
depositing conductive layers on exposed surfaces.

24. The method of manufacturing an electrostatic device of claim 23, wherein singulating comprises:
using etching to separate a chip.

* * * * *